(12) United States Patent
Matsuzaki et al.

(10) Patent No.: US 7,285,867 B2
(45) Date of Patent: Oct. 23, 2007

(54) WIRING STRUCTURE ON SEMICONDUCTOR SUBSTRATE AND METHOD OF FABRICATING THE SAME

(75) Inventors: Tomio Matsuzaki, Ome (JP); Kazuyoshi Arai, Hachioji (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 10/700,136

(22) Filed: Nov. 3, 2003

(65) Prior Publication Data

US 2004/0094841 A1  May 20, 2004

(30) Foreign Application Priority Data

| Nov. 8, 2002 | (JP) | 2002-324973 |
| May 26, 2003 | (JP) | 2003-147447 |
| Sep. 17, 2003 | (JP) | 2003-324204 |

(51) Int. Cl.
*H01L 23/28* (2006.01)
*H01L 23/52* (2006.01)
*H01L 29/40* (2006.01)

(52) U.S. Cl. ............ 257/787; 257/774; 257/792; 257/737; 257/E23.123

(58) Field of Classification Search .......... 257/100, 257/787, 788, 792, 737, 738, 774, 773, 777
See application file for complete search history.

(56) References Cited

U.S. PATENT DOCUMENTS

| 6,600,234 B2 | 7/2003 | Kuwabara et al. |
| 6,690,090 B2* | 2/2004 | Kimura ............ 257/738 |
| 6,765,299 B2* | 7/2004 | Takahashi et al. .......... 257/777 |
| 2002/0027298 A1* | 3/2002 | Sakamoto et al. .......... 257/787 |

FOREIGN PATENT DOCUMENTS

| CN | 1264178 A | 8/2000 |
| JP | 7-135385 A | 5/1995 |
| JP | 2000-183089 A | 6/2000 |
| JP | 2000-228423 A | 8/2000 |
| JP | 2000-261141 A | 9/2000 |
| JP | 2001-135747 A | 5/2001 |
| JP | 2001-144213 A | 5/2001 |
| JP | 2001-237341 A | 8/2001 |
| JP | 2001-257310 A | 9/2001 |
| JP | 2002-093945 A | 3/2002 |
| KR | 2002-0063120 A | 8/2002 |

* cited by examiner

*Primary Examiner*—Nitin Parekh
(74) *Attorney, Agent, or Firm*—Frishauf, Holtz, Goodman & Chick, P.C.

(57) ABSTRACT

A semiconductor device includes a semiconductor substrate having a plurality of connecting pads on one surface, an insulating film formed on one surface of the semiconductor substrate. The insulating film has holes each corresponding to one of the connecting pads, and a recess having a bottom surface depressed from the upper surface in the direction of thickness. Interconnections are formed on an upper surface of the insulating film or on the bottom surface of the recess, and connected to the connecting pads through the holes in the insulating film.

27 Claims, 56 Drawing Sheets

US 7,285,867 B2

WIRING STRUCTURE ON SEMICONDUCTOR SUBSTRATE AND METHOD OF FABRICATING THE SAME

CROSS-REFERENCE TO RELATED APPLICATIONS

This application is based upon and claims the benefit of priority from the prior Japanese Patent Applications No. 2002-324973, filed Nov. 8, 2002; No. 2003-147447, filed May 26, 2003; No. 2003-324204, filed Sep. 17, 2003, the entire contents of all of which are incorporated herein by reference.

BACKGROUND OF THE INVENTION

1. Field of the Invention

The present invention relates to a wiring structure on a semiconductor substrate and, more particularly, to a wiring structure capable of preventing ion migration between interconnections formed at fine pitches, and a method of fabricating the same.

2. Description of the Related Art

A conventional semiconductor device called a CSP (chip size package) is as follows. On a semiconductor substrate having connecting pads on its upper surface, copper distribution wires are connected to the connecting pads via an insulating film interposed therebetween. A copper bump electrode is formed on a connecting pad portion of each distribution wire. An encapsulating film is formed on the insulating film and the distribution wires such that the upper surface of the encapsulating film is leveled with the upper surfaces of the bump electrodes (e.g., U.S. Pat. No. 6,600, 234B2).

In the above conventional semiconductor device, as shown in FIG. 7 of U.S. Pat. No. 6,600,234B2, a wiring substrate metal layer is formed on a substantially flat upper surface of an insulating film. Therefore, if water in the use environment penetrates into the encapsulating film, copper ions flowing out from the wiring substrate metal layer or bum electrodes 57 to which a positive voltage is applied move in the interface between the insulating film and encapsulating film, and precipitate in the wiring substrate metal layer 56 or bump electrodes to which a negative voltage is applied, thereby causing a short circuit by so-called ion migration.

It is, therefore, an object of the present invention to provide a semiconductor device capable of preventing easy occurrence of a short circuit caused by so-called ion migration, and a method of fabricating the same.

BRIEF SUMMARY OF THE INVENTION

According to an aspect of the present invention, there is provided a semiconductor device comprising a semiconductor substrate having a plurality of connecting pads on one surface, an insulating film formed on one surface of the semiconductor substrate. The insulating film has holes each corresponding to one of the connecting pads, an upper surface, and a recess having a bottom surface depressed from the upper surface in a direction of thickness. Interconnections are formed on the upper surface of the insulating film or on the bottom surface of the recess, and connected to the connecting pads through the holes in the insulating film.

According to another aspect of the present invention, there is provided a semiconductor device fabrication method comprising preparing a semiconductor substrate having a plurality of connecting pads on one surface, forming, on one surface of the semiconductor substrate, an insulating film having holes each corresponding to one of the connecting pads, an upper surface, and a recess having a bottom surface depressed from the upper surface in a direction of thickness, and forming, on the upper surface of the insulating film or on the bottom surface of the recess, interconnections connected to the connecting pads through the holes in the insulating film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

FIRST EMBODIMENT

Figure 1:
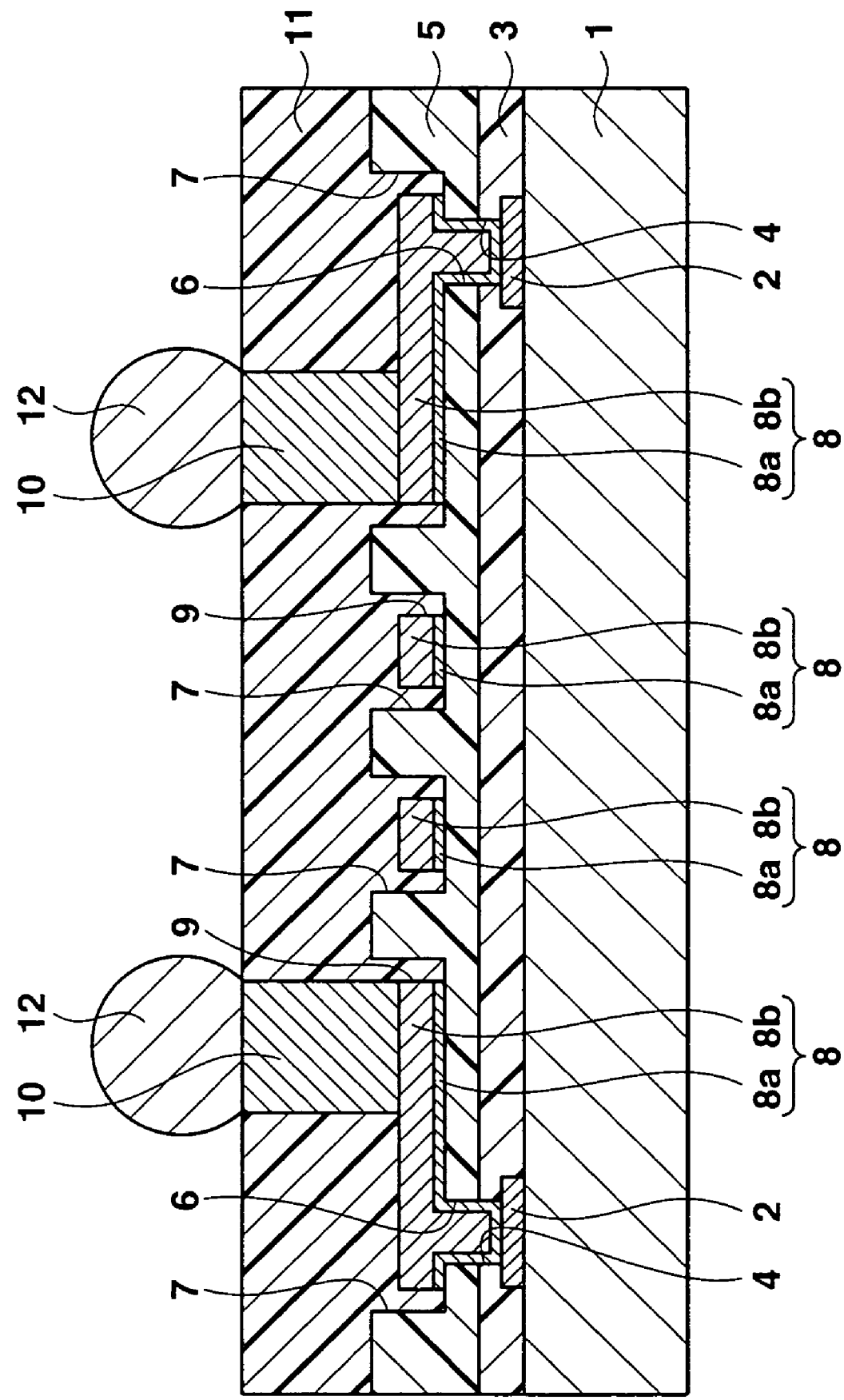
FIG. 1 is an enlarged sectional view of a semiconductor device according to the first embodiment of the present invention.

FIG. 1 is a sectional view of a semiconductor device according to the first embodiment of the present invention. The semiconductor device includes a silicon substrate (semiconductor substrate) 1. An integrated circuit or circuits (not shown) are formed in a central portion of the upper surface of the silicon substrate 1. A plurality of connecting pads 2 made of an aluminum-based metal are formed in a peripheral portion of the upper surface so as to be electrically connected to the integrated circuit. An insulating film 3 made of silicon oxide is formed on the upper surfaces of the silicon substrate 1 and connecting pads 2 except for central portions of the connecting pads 2. The central portions of the connecting pads 2 are exposed through holes 4 formed in the insulating film 3.

A protective film (insulating film) 5 made of an organic resin such as polyimide is formed on the upper surface of the insulating film 3. Holes 6 are formed in those portions of the protective film 5, which correspond to the holes 4 in the insulating film 3. Recesses 7 are formed in distribution wire formation regions of the upper surface of the protective film 5. The recesses 7 communicate with the holes 6.

A distribution wire 8 is formed from the upper surface of each connecting pad 2 exposed through the holes 4 and 6 to a predetermined portion of the upper surface of the protective film 5 in the recess 7. The distribution wire 8 is made up of a lower metal layer 8a and an upper metal layer 8b formed on the lower metal layer 8a. Although details are not shown, the lower metal layer 8a has a two-layered structure in which a titanium layer and copper layer are stacked in this order from below. Also, the depth of the recess 7 is larger than the thickness of the distribution wire 8. In addition, slight spaces 9 are formed between the distribution wire 8 and the inner wall surfaces of the recess 7.

A copper bump electrode 10 is formed on the upper surface of a connecting pad portion of each distribution wire 8. On the upper surface of the protective film 5 and the distribution wires 8, an encapsulating film 11 made of an organic resin such as an epoxy-based resin is formed such that the upper surface of the encapsulating film 11 is leveled with the upper surfaces of the bump electrodes 10. Accordingly, the upper surfaces of the bump electrodes 10 are exposed. A solder ball 12 is formed on the upper surface of each bump electrode 10.

Figure 2:
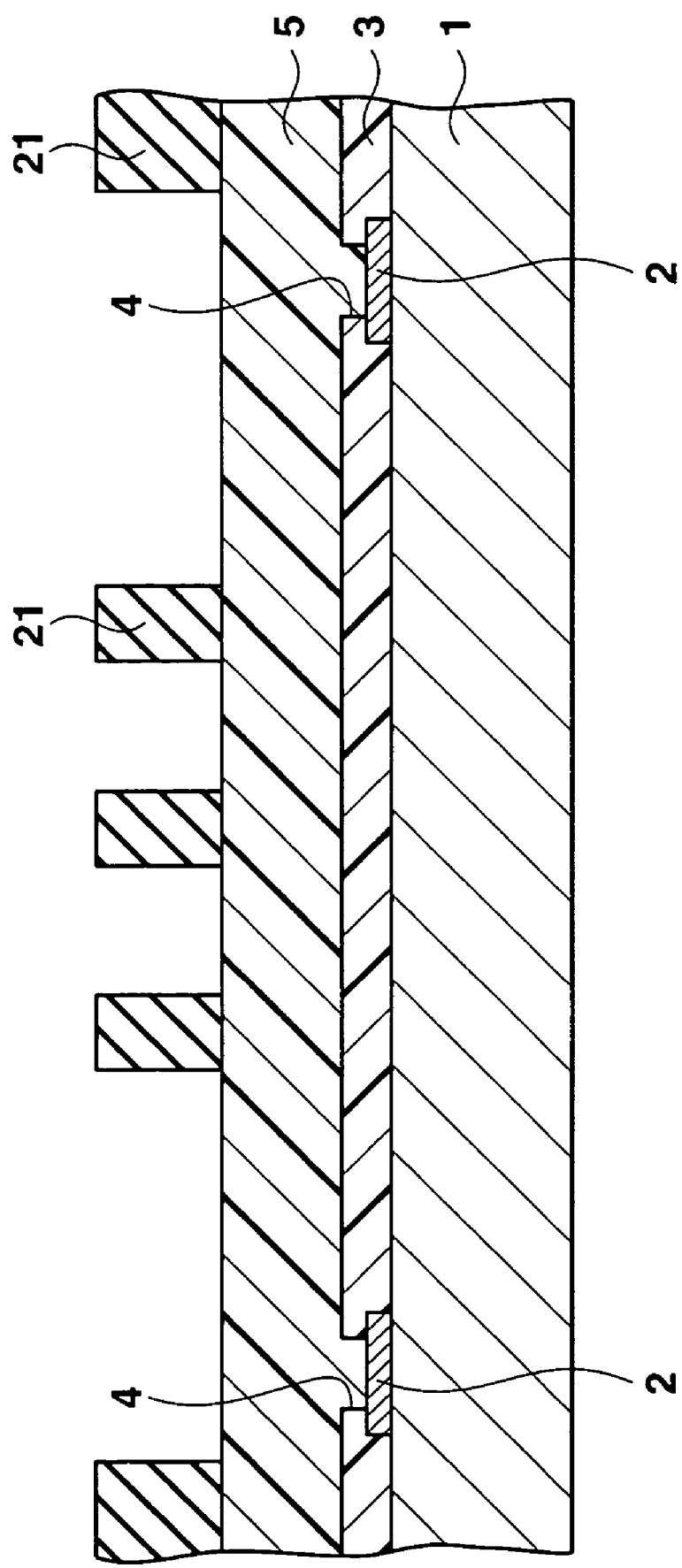
FIG. 2 is an enlarged sectional view of an initial fabrication step in the fabrication of the semiconductor device shown in FIG. 1.

An example of a method of fabricating this semiconductor device will be explained below. First, as shown in FIG. 2, a structure is prepared in which connecting pads 2 made of an aluminum-based metal are formed on the upper surface of a silicon substrate 1 in the form of a wafer, an insulating film 3 made of an inorganic insulating material such as silicon oxide or silicon nitride is formed on the upper surfaces of the silicon substrate 1 and the connecting pads 2 except for central portions of the connecting pads 2, and these central portions of the connecting pads 2 are exposed through holes 4 formed in the insulating film 3.

Figure 3:
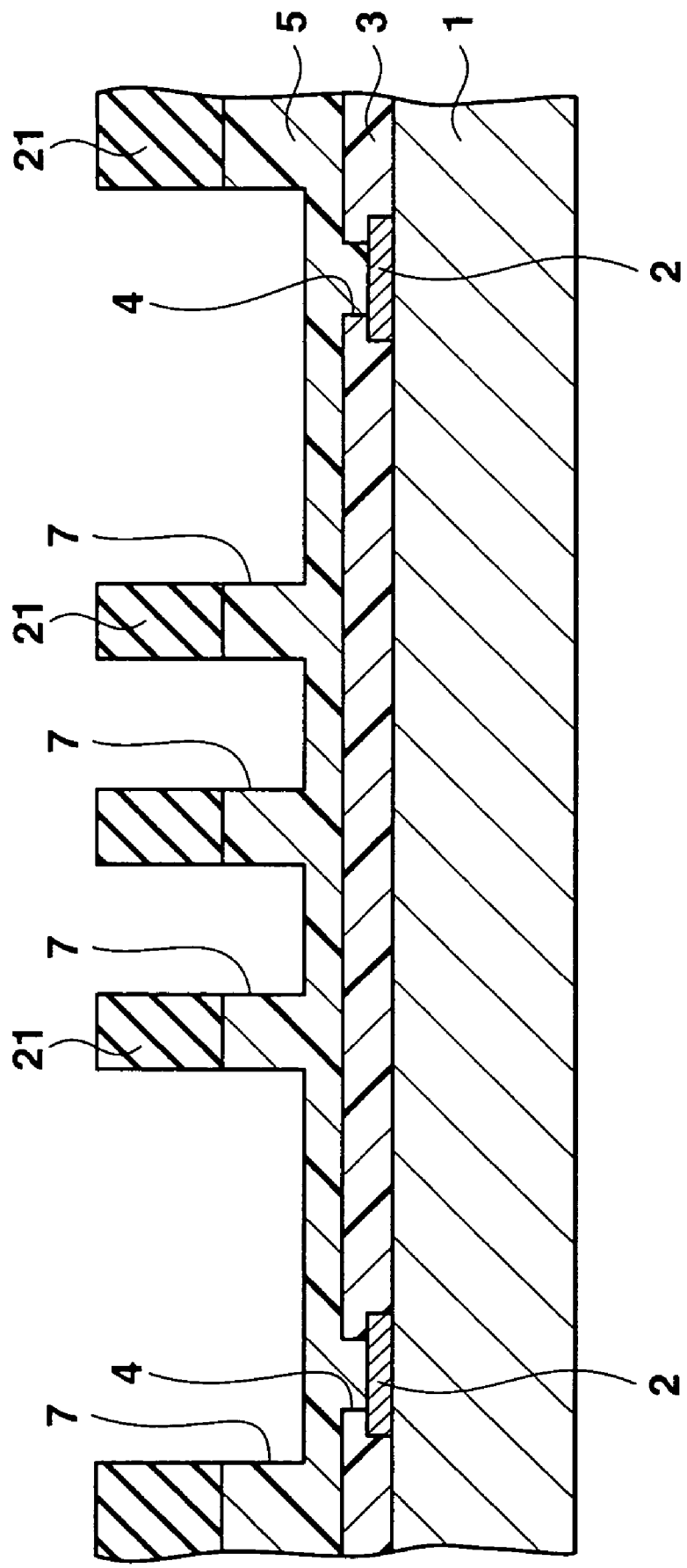
FIG. 3 is an enlarged sectional view of a fabrication step following FIG. 2.

A protective film 5 made of an organic resin such as a polyimide resin is formed by a coating method on the entire upper surface of the insulating film 3 including the upper surface portions of the connecting pads 2 exposed through the holes 4. A resist film 21 is then formed on the upper surface of the protective film 5 except for prospective formation regions of recesses 7 (i.e., distribution wires 8). As shown in FIG. 3, the resist film 21 is used as a mask to half-etch the protective film 5, thereby forming recesses 7 in the upper surface of the protective film 5 except for regions below the resist film 21. Note that when etched by an etching solution, each recess 7 is actually inclined in the direction of thickness such that the width of the bottom surface of the recess 7 is smaller than that of the upper surface. However, each recess 7 is shown as a vertical recess in the figures for the sake of simplicity. In this case, dry etching such as plasma etching is applicable as the half-etching of the protective film 5. Anisotropic etching is particularly preferable because the inclined surface is made as vertical as possible. The resist film 21 is then peeled.

Figure 4:
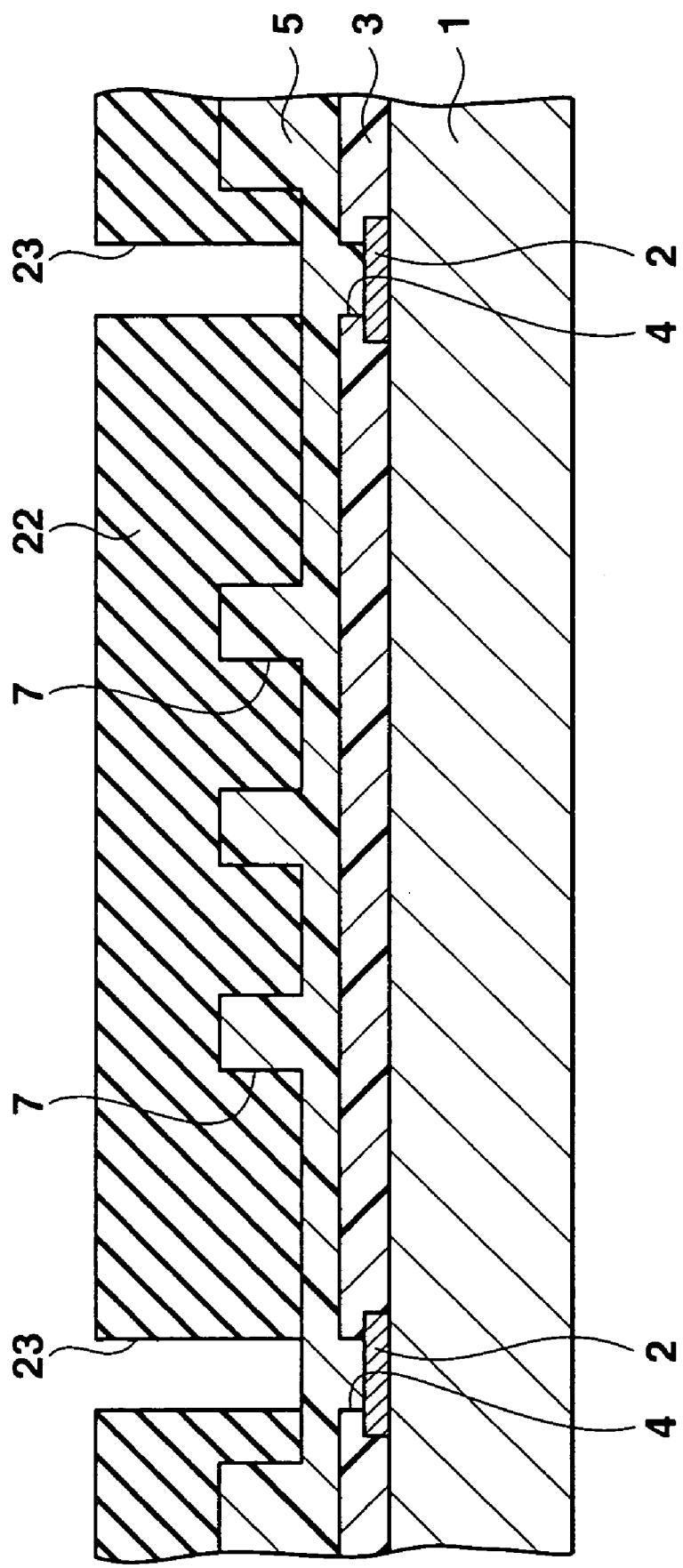
FIG. 4 is an enlarged sectional view of a fabrication step following FIG. 3.
Figure 5:
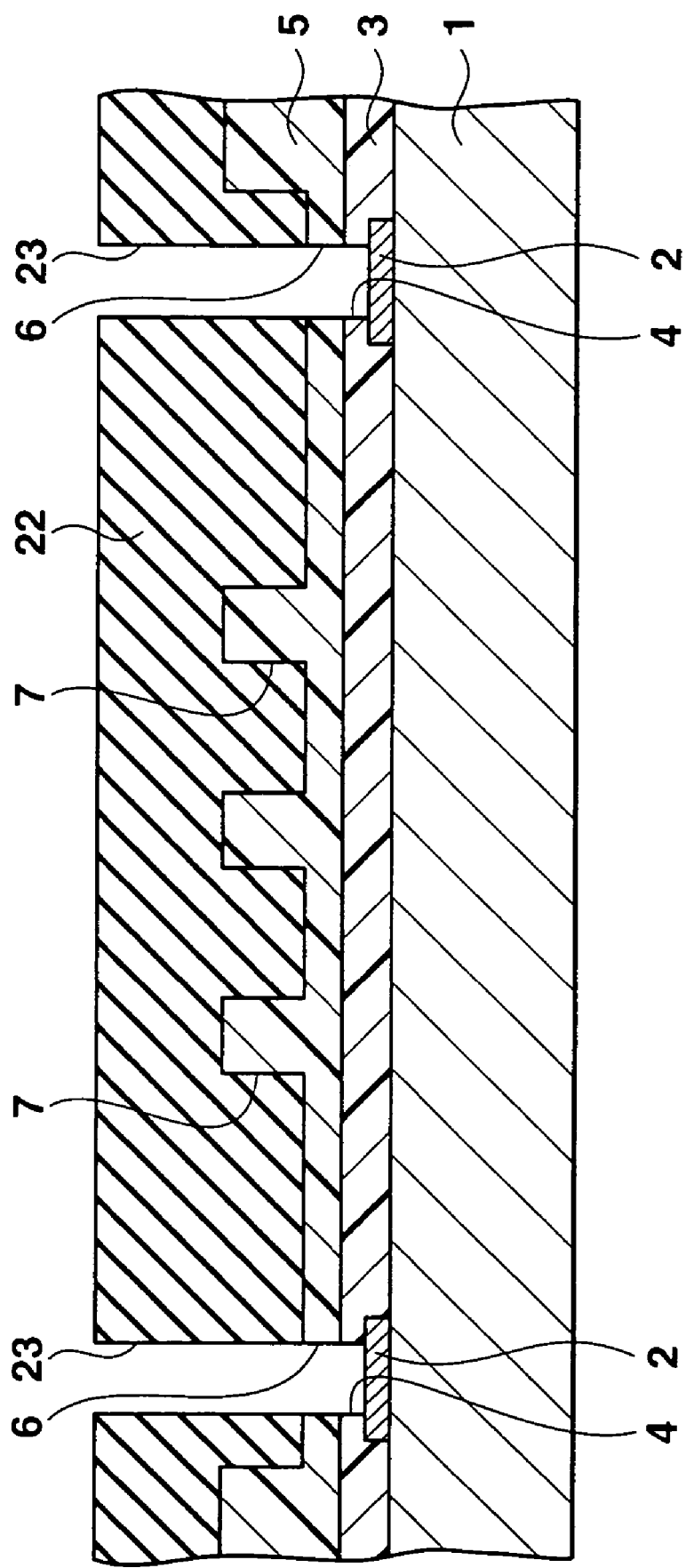
FIG. 5 is an enlarged sectional view of a fabrication step following FIG. 4.

As shown in FIG. 4, a resist film 22 is formed by depositing and then patterning, on the upper surface of the protective film 5. In this state, holes 23 are formed in those portions of the resist film 22, which correspond to the holes 4 in the insulating film 3. Subsequently, as shown in FIG. 5, the resist film 22 is used as a mask to selectively etch the protective film 5, thereby forming holes 6 in those portions of the protective film 5, which correspond to the holes 23 in the resist film 22, i.e., the holes 4 in the insulating film 3. After that, the resist film 22 is peeled.

Figure 6:
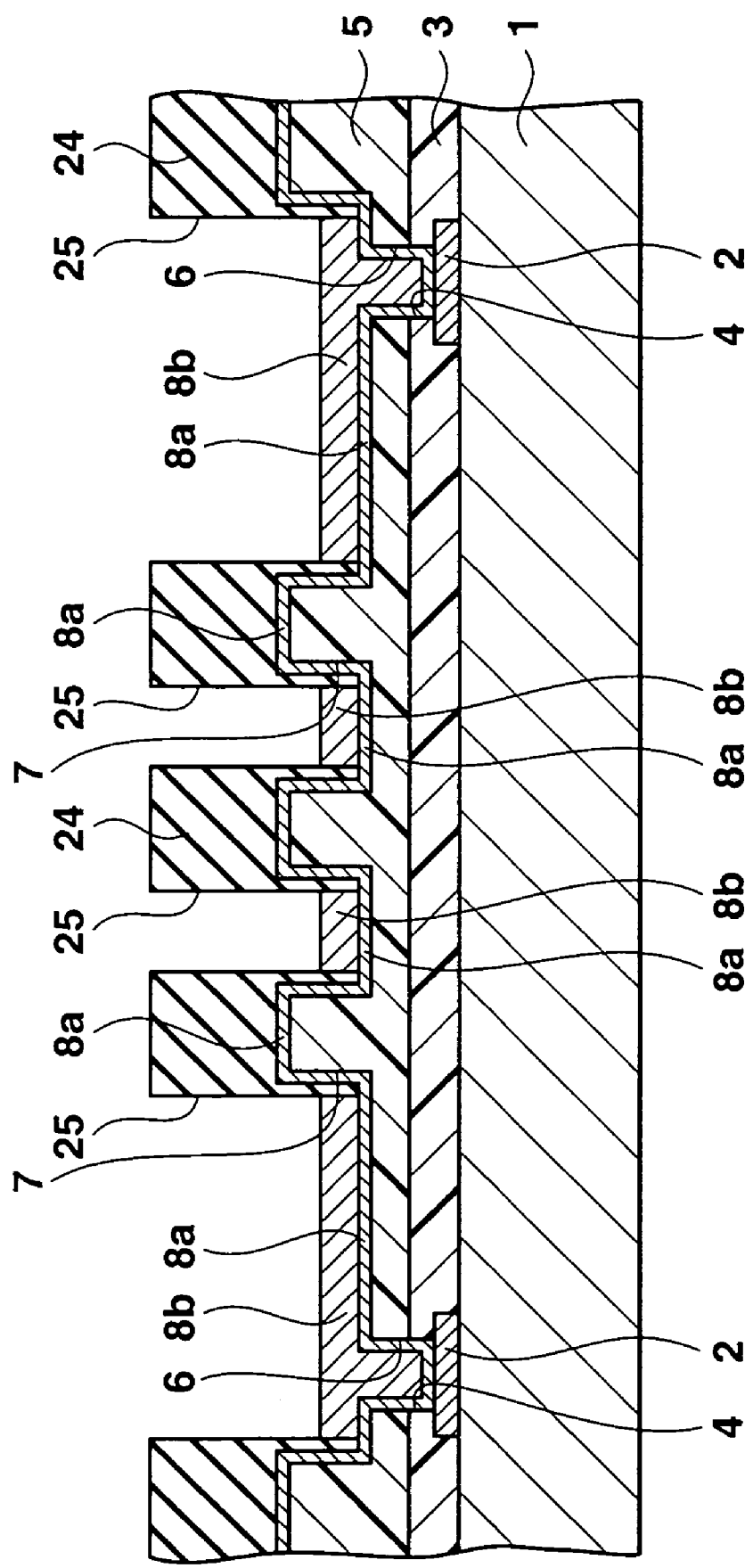
FIG. 6 is an enlarged sectional view of a fabrication step following FIG. 5.

As shown in FIG. 6, a lower metal layer or a base layer 8a is formed on the entire upper surface of the protective film 5 and the upper surface portions of the connecting pads 2 exposed through the holes 4 and 6. Although details are not shown, the lower metal layer 8a is obtained by forming a copper layer by sputtering on a titanium layer which is also formed by sputtering. The lower metal layer 8a may also have another structure and/or another material. For example, the lower metal layer 8a may also be a single copper layer formed by electroless plating.

Subsequently, a plating resist film 24 is formed by depositing and then patterning, on the upper surface of the lower metal layer 8a. In this state, holes 25 are formed in those portions of the plating resist film 24, which correspond to prospective formation regions of distribution wires 8. Also, the lower metal layer 8a formed on the inner wall surfaces of each recess 7 in the protective film 5 is covered with the plating resist film 24. The lower metal layer 8a is then used as a plating current path to perform electroplating of copper, thereby forming an upper metal layer 8b on the upper surface of the lower metal layer 8a in each hole 25 of the plating resist film 24. After that, the plating resist film 24 is peeled.

Figure 7:
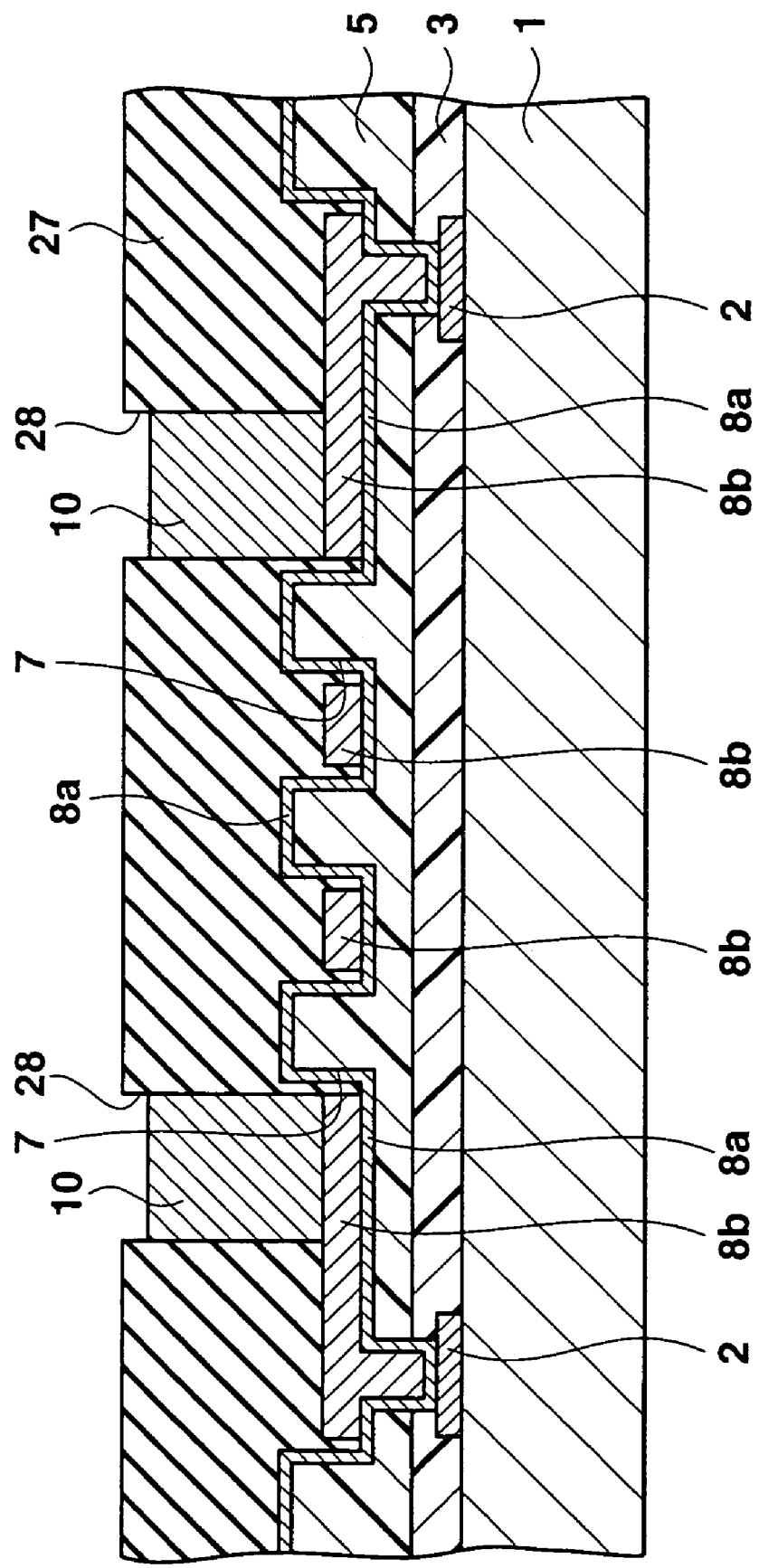
FIG. 7 is an enlarged sectional view of a fabrication step following FIG. 6.

As shown in FIG. 7, a plating resist film 27 is formed by depositing and then patterning, on the upper surface of the lower metal layer 8a including the upper metal layer 8b. In this state, holes 28 are formed in those portions of the plating resist film 27, which correspond to connecting pad portions of the upper metal layer 8b. Also, around the upper metal layer 8b, the lower metal layer 8a formed on the inner wall surfaces of each recess 7 in the protective film 5 is covered with the part of the plating resist film 27. The lower metal layer 8a is then used as a plating current path to perform electroplating of copper, thereby forming bump electrodes 10 on the upper surfaces of the connecting pad portions of the upper metal layer 8b in the holes 28 of the plating resist film 27.

Figure 8:
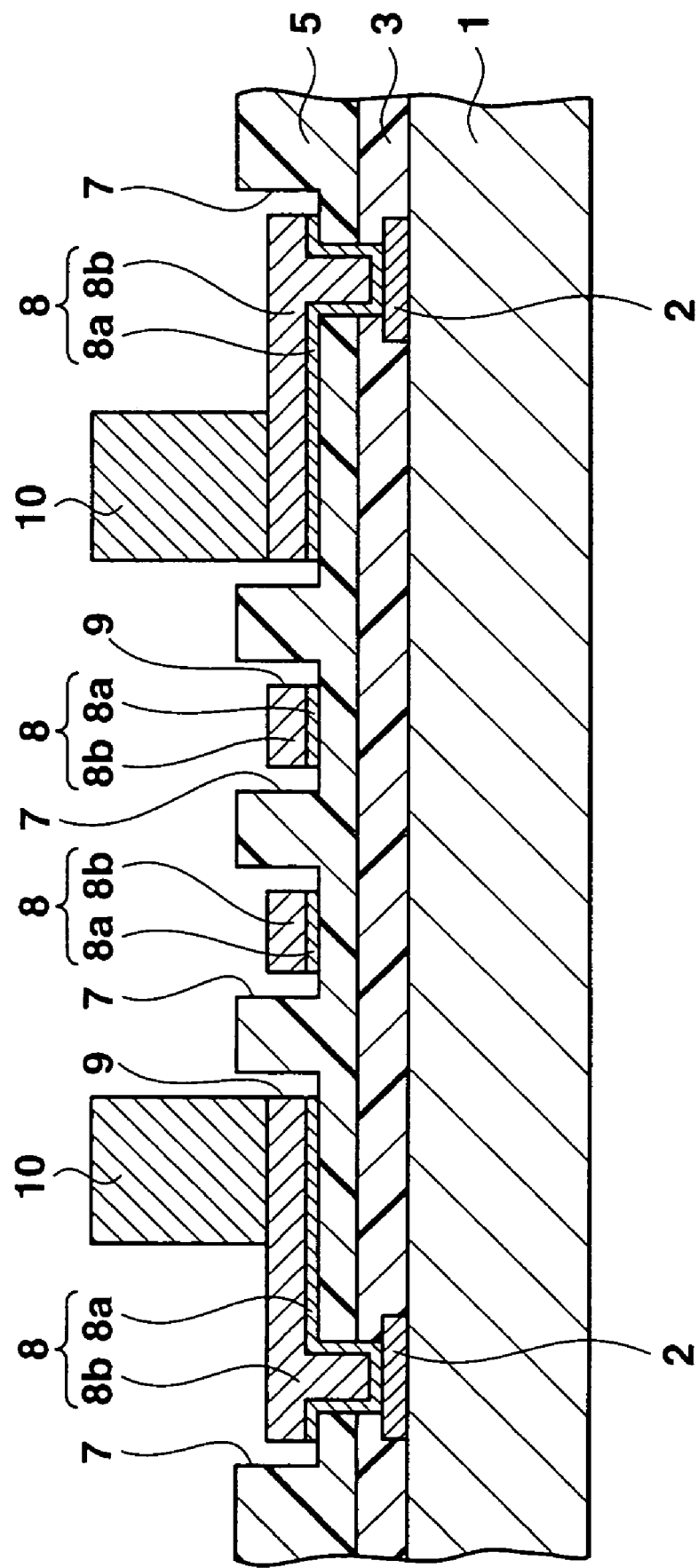
FIG. 8 is an enlarged sectional view of a fabrication step following FIG. 7.

The plating resist film 27 is peeled, and then the bump electrodes 10 and upper metal layer 8b are used as masks to etch away unnecessary portions of the lower metal layer 8a. Consequently, as shown in FIG. 8, the lower metal layer 8a remains only below the upper metal layer 8b in the recesses 7, so that a distribution wire 8 is formed by the residual lower metal layer 8a and the upper metal layer 8b formed on the entire upper surface of the lower metal layer 8a. At the same time, a slight space 9 is formed between each distribution wire 8 and the inner wall surfaces of the recess 7. The space is a positional deviation amount when the plating resist film 28 is printed, and is usually a few µm or less. As will be described later, the lower metal layer 8a is much thinner than the upper metal layer 8b. Therefore, when an etching solution is sprayed against the entire surface for short time periods, only those portions of the lower metal layer 8a, which extend outside the bump electrodes 10 and upper metal layer 8b are removed.

Figure 9:
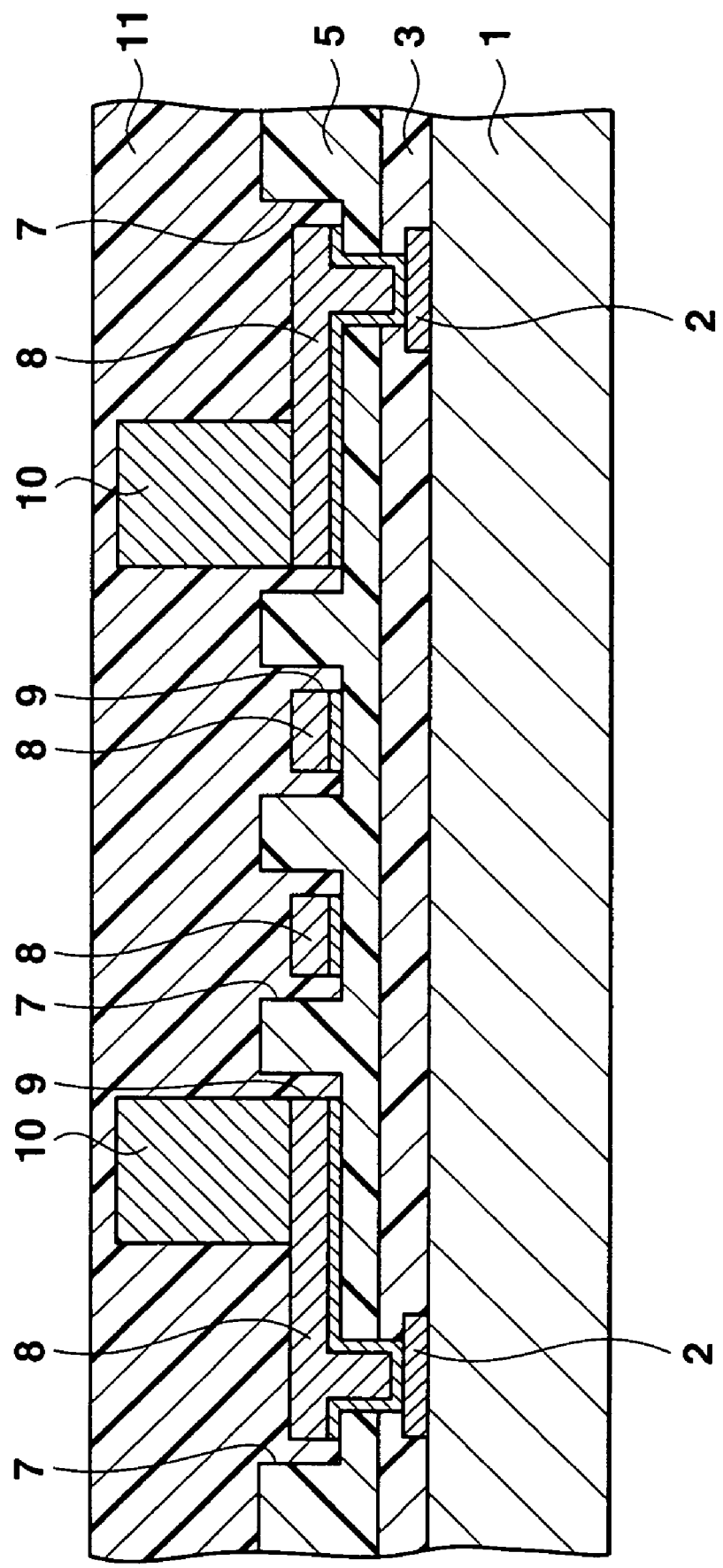
FIG. 9 is an enlarged sectional view of a fabrication step following FIG. 8.

As shown in FIG. 9, an encapsulating film 11 made of an organic resin such as an epoxy resin is formed on the upper surfaces of the protective film 5, the bump electrodes 10 and distribution wires 8, such that the thickness of the encapsulating film 11 is slightly larger than the height of the bump electrodes 10. In this state, the encapsulating film 11 is also formed in the recesses 7 including the spaces 9. Also, the upper surfaces of the bump electrodes 10 are covered with the encapsulating film 11.

Figure 10:
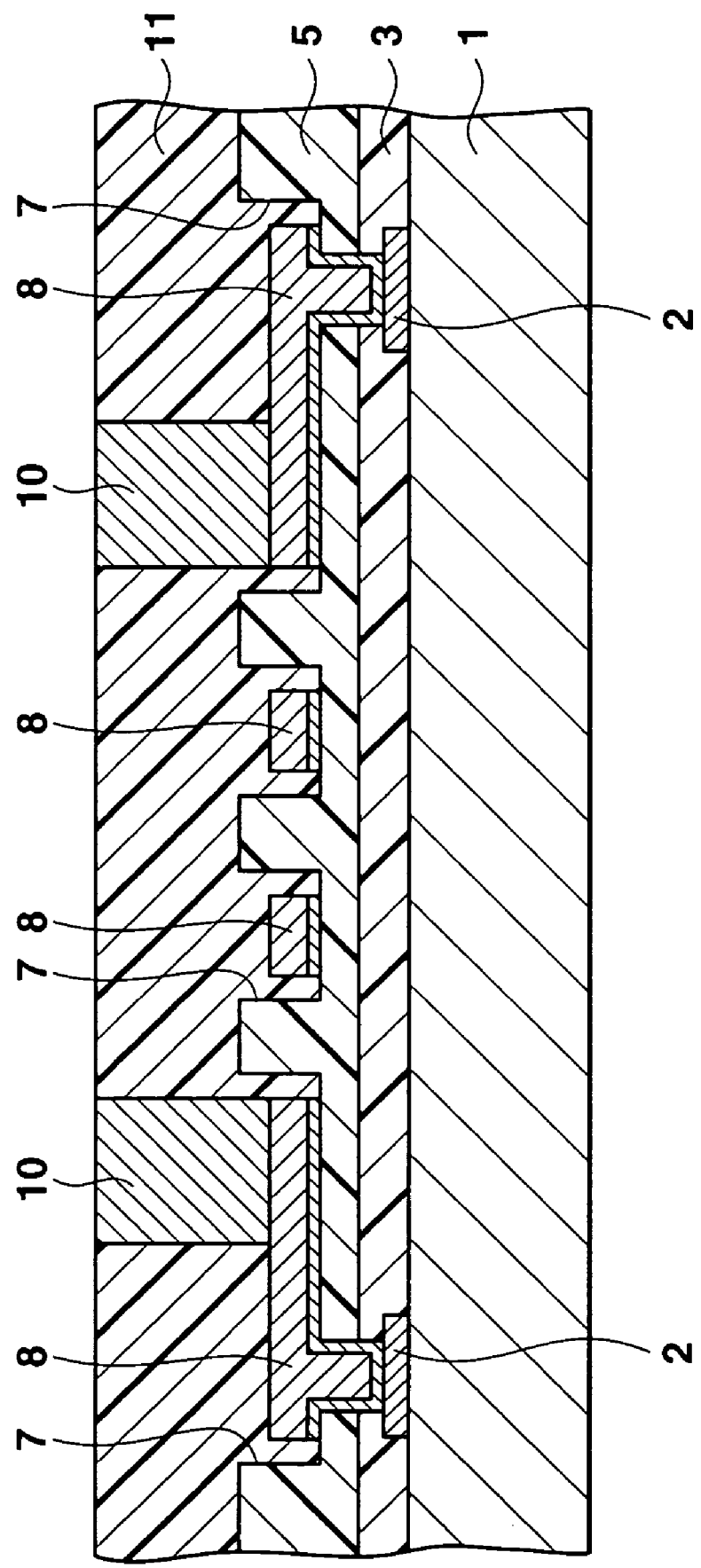
FIG. 10 is an enlarged sectional view of a fabrication step following FIG. 9.
Figure 11:
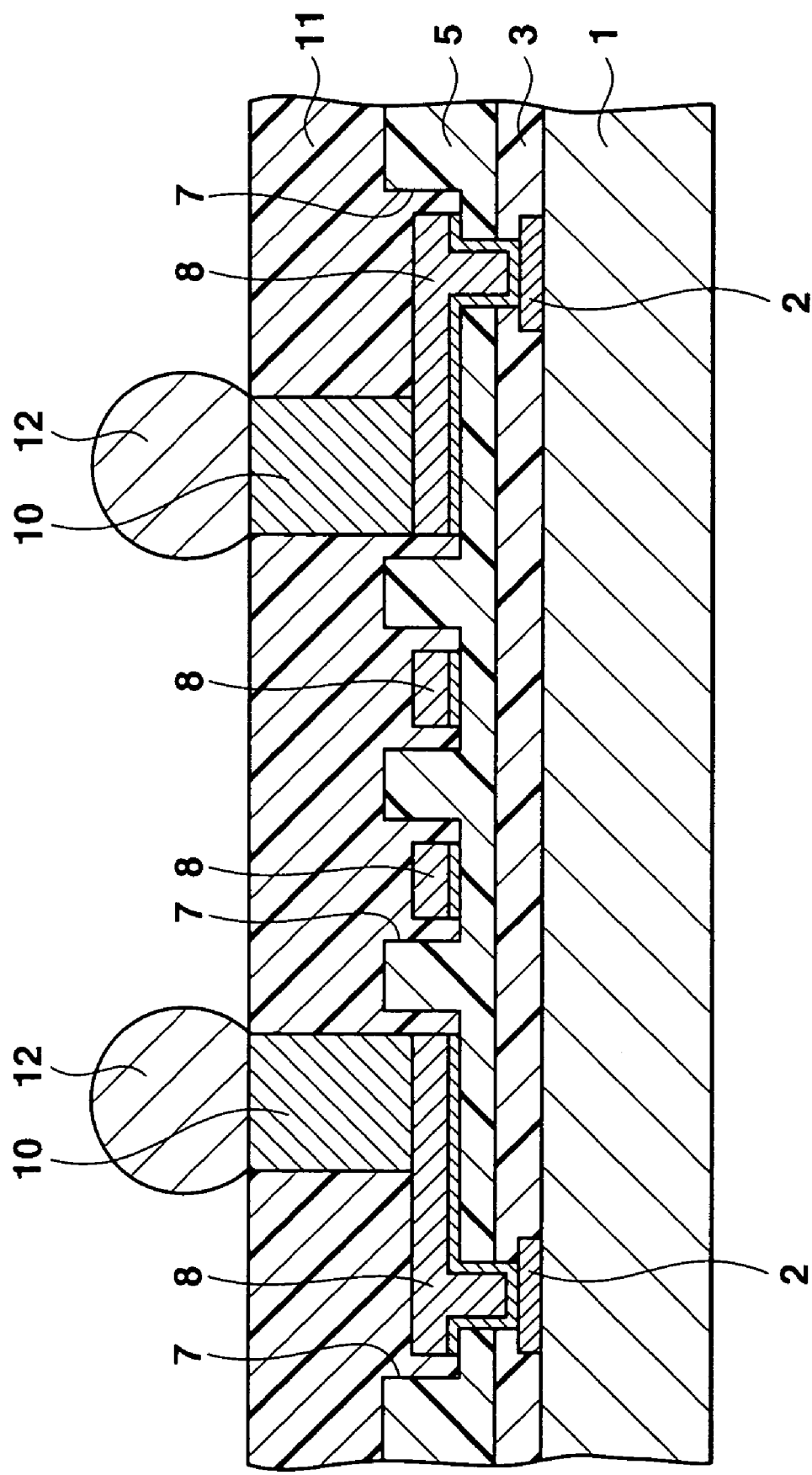
FIG. 11 is an enlarged sectional view of a fabrication step following FIG. 10.

As shown in FIG. 10, the encapsulating film 11 and the upper surfaces of the bump electrodes 10 are appropriately polished to expose these upper surfaces of the bump electrodes 10. Subsequently, as shown in FIG. 11, a solder ball 12 is formed on the upper surface of each bump electrode 10. When a dicing step is performed after that, a plurality of semiconductor devices shown in FIG. 1 are obtained.

In the thus obtained semiconductor device, the distribution wire 8 is formed in each recess 7 formed in the upper surface of the protective film 5, and the depth of the recess 7 is made larger than the thickness of the distribution wire 8. Therefore, between the distribution wires 8 including the lower portions of the bump electrodes 10, the protective film 5 has extended portions higher than the upper surface of each distribution wire 8. The extended portion prevents easy occurrence of a short circuit caused by so-called ion migration.

Examples of the dimensions are as follows. The thickness of the lower metal layer 8a is about 0.4 to 0.8 µm. The thickness of the upper metal layer 8b is about 1 to 10 µm. The thickness of the extended portion of the protective film 5 is about 10 to 30 µm. The depth of the recess 7 is about 5 to 15 µm (and larger than the thickness of the distribution wire 8). The thickness of the portion of the protective film 5 in the recess 7 is 1 to 20 µm. The height of the bump electrode 10 is about 80 to 150 µm.

The width of the distribution wire 8 is set at a desired value in accordance with the number of terminals, layout, and the like of each semiconductor device. For example, the width of the distribution wire 8 is about 20 to 40 µm, and the diameter of the holes 4 and 6 is larger than the width of the distribution wire 8, and about 30 to 60 µm. The diameter of the connecting pad portion of the distribution wire 8 and the bump electrode 10 formed on the connecting pad portion is, e.g., about 200 to 400 µm. Also, the spacing between the distribution wires 8 and the spacing between the distribution wire 8 and the connecting pad portion of the nearby distribution wire 8 can be about 20 µm or less.

Figure 12:
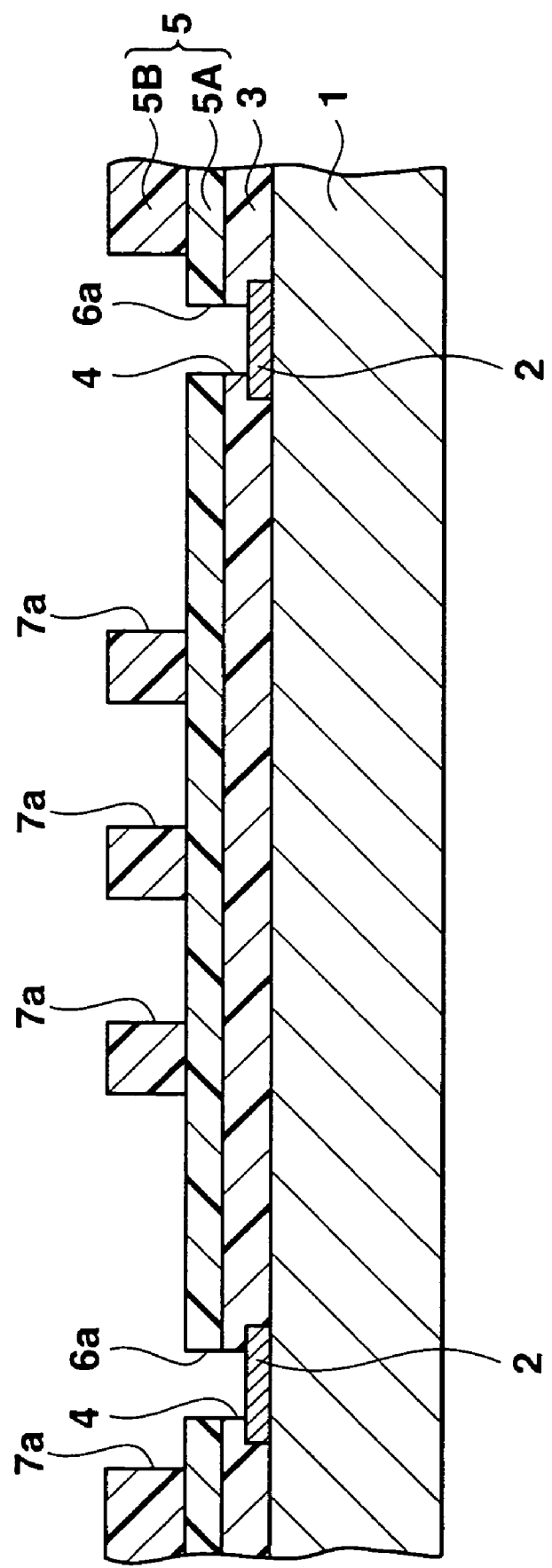
FIG. 12 is an enlarged sectional view for explaining another formation method of a protective film.

Another formation method of the protective film 5 will be explained below. As shown in FIG. 12, the upper surface of an insulating film 3 is coated with a first protective film 5A made of an organic resin, and holes 6a are formed in the first protective film 5A by photolithography. It is also possible to form a first protective film SA having holes 6a by screen printing. On the upper surface of the first protective film 5A, a second protective film 5B made of an organic resin and having holes (i.e., recesses) 7a is formed by screen printing. The same structure as the protective film 5 shown in FIG. 1 is formed by the first and second protective films 5A and 5B.

Figure 13:
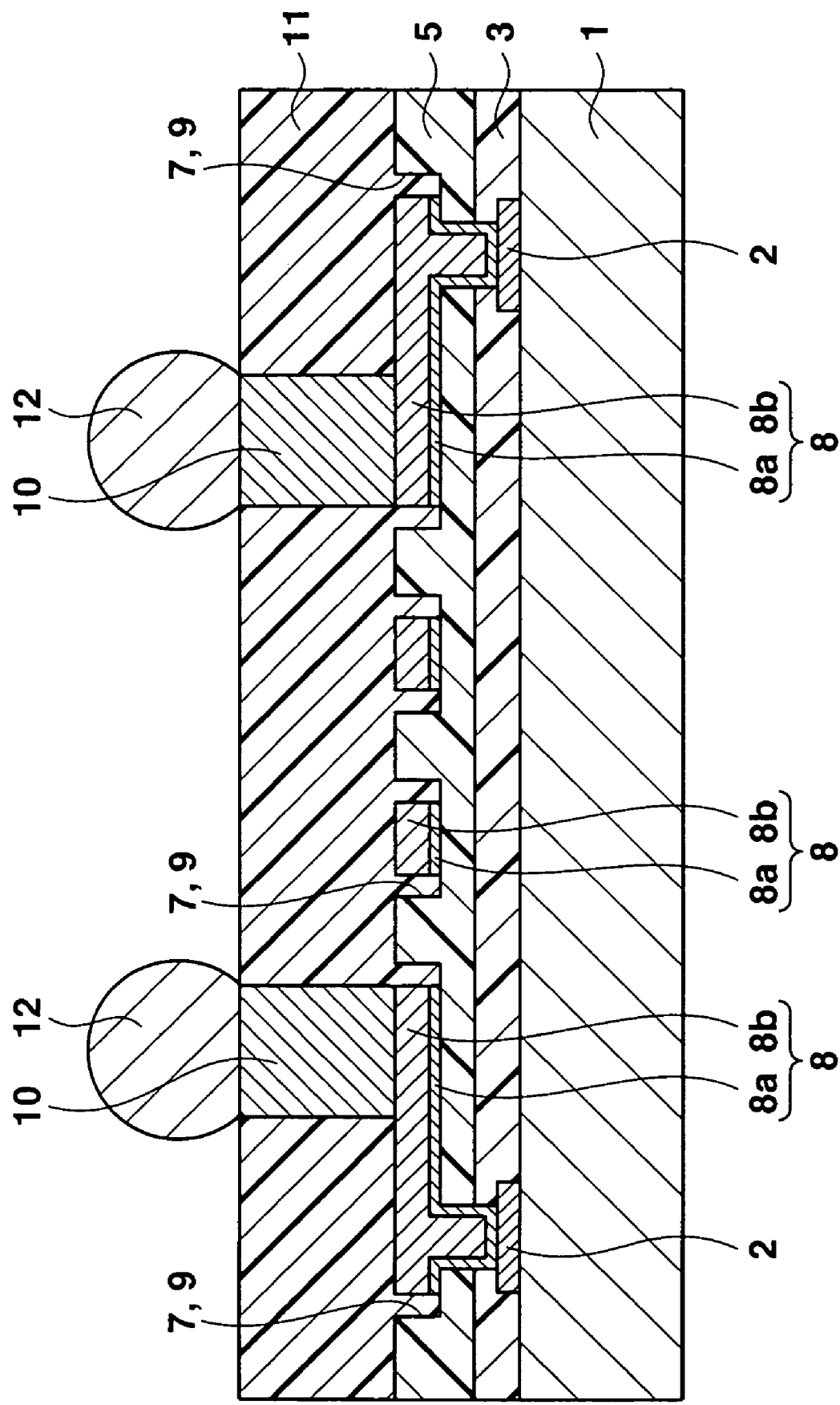
FIG. 13 is an enlarged sectional view of a semiconductor device as the first modification of the first embodiment shown in FIG. 1.

In the above embodiment as shown in FIG. 1, the depth of the recess 7 is larger than the thickness of the distribution wire 8. However, the present invention is not limited to this embodiment. For example, as in the first modification shown in FIG. 13, the depth of the recess 7 may also be substantially the same as the thickness of the distribution wire 8.

Figure 14:
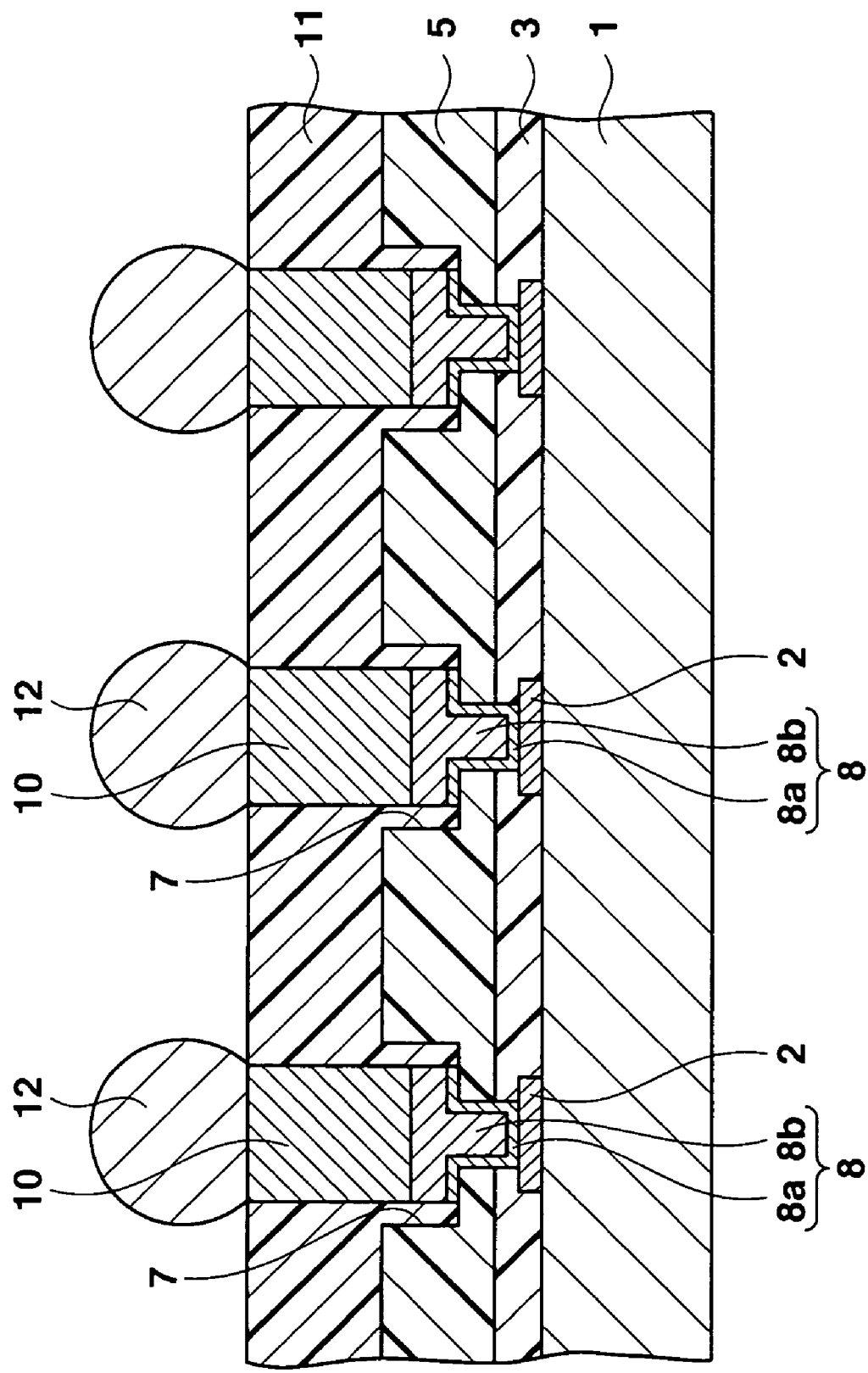
FIG. 14 is an enlarged sectional view of a semiconductor device as the second modification of the first embodiment shown in FIG. 1.
Figure 15:
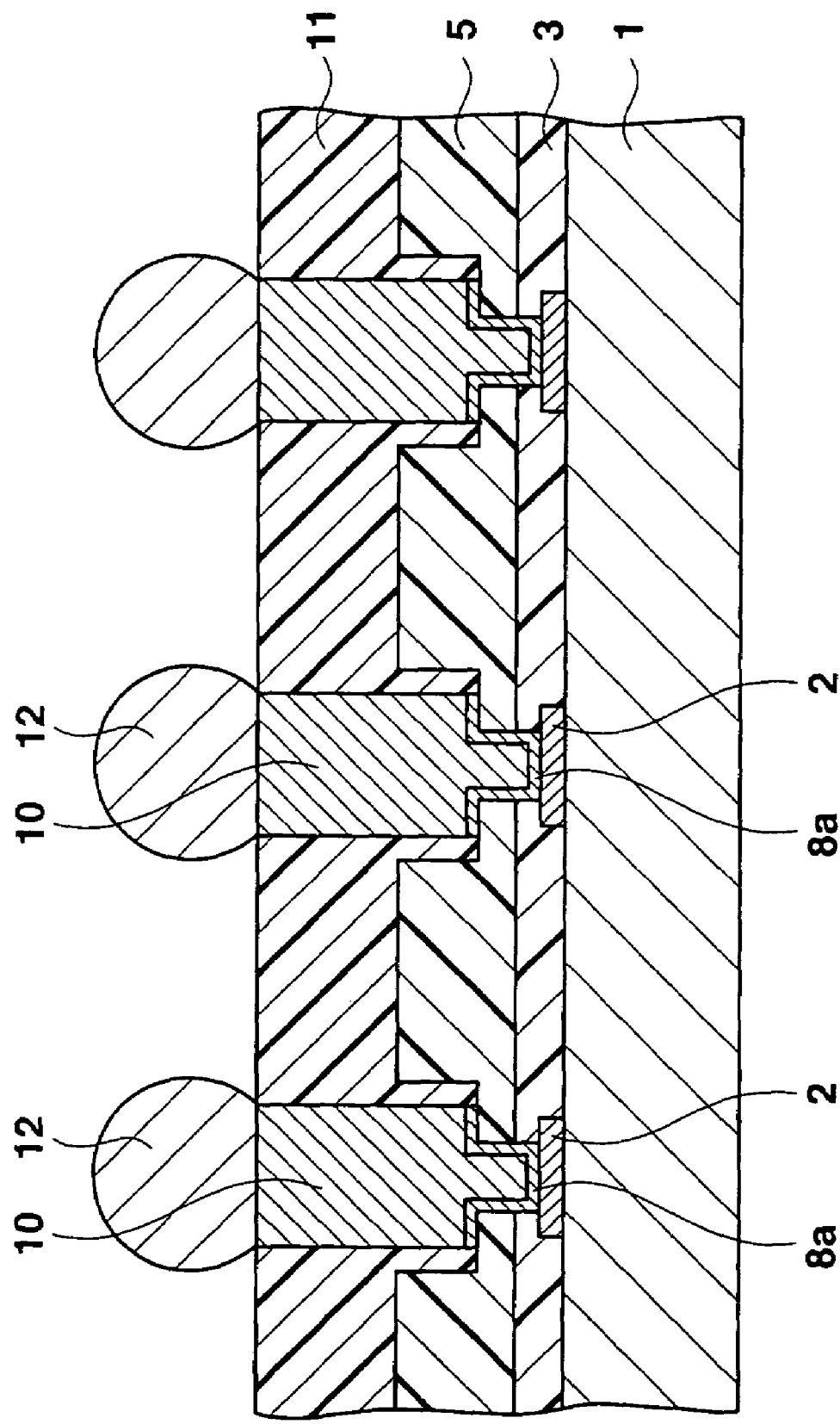
FIG. 15 is an enlarged sectional view of a semiconductor device as the third modification of the first embodiment shown in FIG. 1.

In the above embodiment as shown in FIG. 1, the positions of the bump electrodes 10 are different from those of the connecting pads 2. However, the present invention is not limited to this embodiment. For example, as in the second modification shown in FIG. 14, it is also possible to form, on each connecting pad 2, a distribution wire 8 having only a connecting pad portion whose planar size is larger than that of the connecting pad 2, and form, on the distribution wire 8, a bump electrode 10 whose cross-sectional a planar size is larger than the planar size of the connecting pad 2. In this structure shown in FIG. 14, the distribution wire 8 is formed as a pedestal having functions of a barrier layer and adhesive layer of the bump electrode 10. Migration can be prevented because the adjacent bump electrode 10 and their pedestals are separated by spaces in recesses 7. If an upper metal layer 8b and the bump electrode 10 are made of the same material in this modification shown in FIG. 14, it is also possible to form only a lower metal layer 8a as a pedestal of each bump electrode 10 and form bump electrode 10 directly on the lower metal layer 8a as in the third modification shown in FIG. 15. The second or third modification shown in FIG. 14 or 15 may also be combined with the embodiment shown in FIG. 1. That is, as shown in FIG. 1, distribution wires 8 are extended onto some connecting pads 2, and bump electrodes 10 are formed on the extended portions of the pads 2. After that, as shown in FIG. 14 or 15, distribution wires (equivalent to connecting pad portions) 8 are formed only on remaining connecting pads 2, and bump electrodes 10 are formed on these distribution wires. In the first embodiment described above, the distribution wires 8 are covered only with the encapsulating film 11. Therefore, migration may occur if water penetrates into the encapsulating film 11. To prevent this, a more reliable structure must be obtained. Also, if the bump electrodes 10 protrude from the upper surface of the encapsulating film 11, they can deform more easily when the semiconductor device is connected to a circuit board. This makes it possible to more effectively reduce the stress generated by the difference between the thermal expansion coefficients of the silicon substrate 1 and the circuit board (not shown). This embodiment will be described below.

SECOND EMBODIMENT

Figure 16:
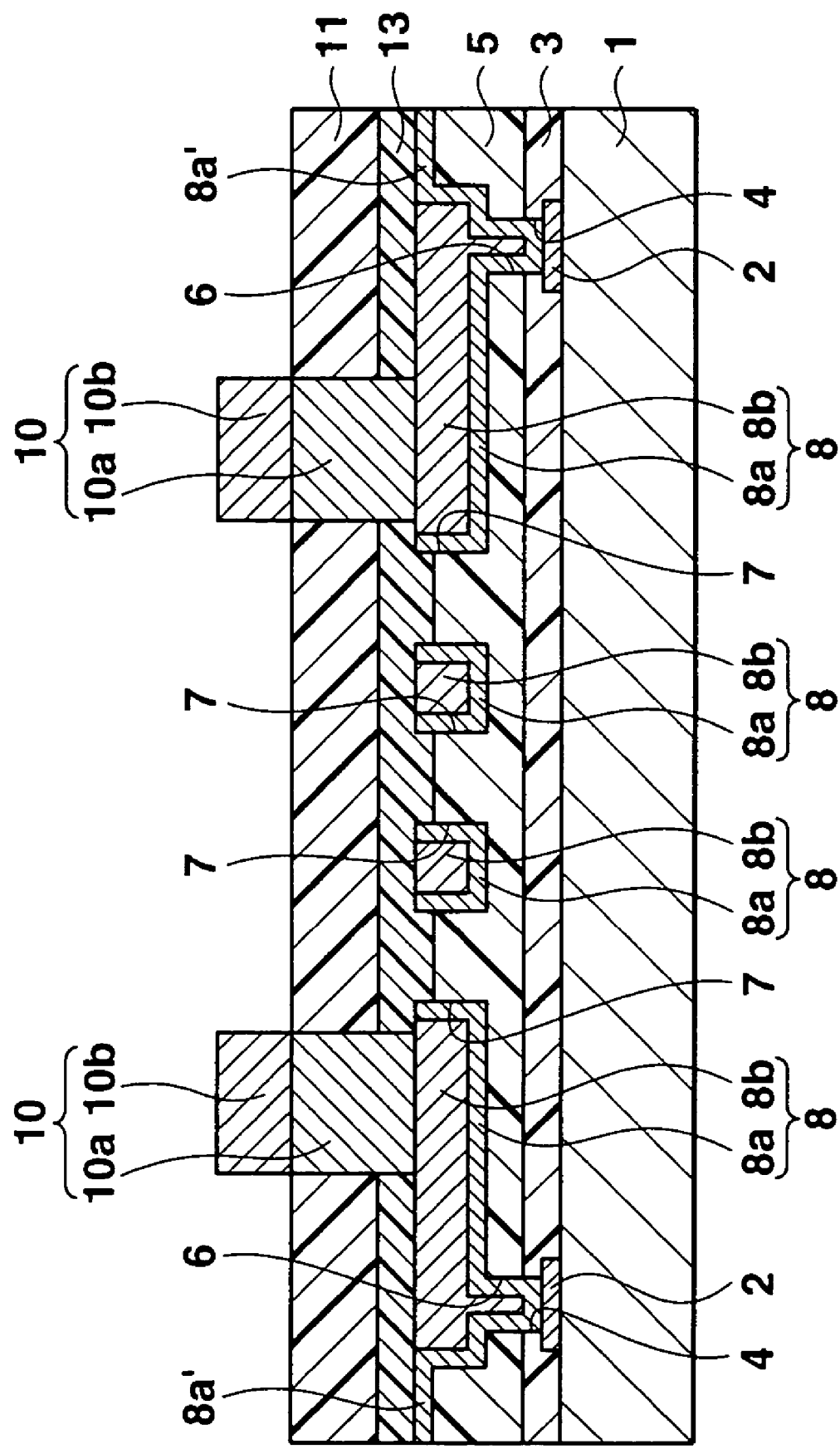
FIG. 16 is an enlarged sectional view of a semiconductor device according to the second embodiment of the present invention.

FIG. 16 is a sectional view of a semiconductor device as the second embodiment of the present invention. This semiconductor device includes a silicon substrate 1. An integrated circuit or circuits (not shown) are formed in a central portion of the upper surface of the silicon substrate 1. A plurality of connecting pads 2 made of an aluminum-based metal are formed in a peripheral portion of the upper surface of the substrate and electrically connected to the integrated circuit. An insulating film 3 made of an inorganic insulating material such as silicon oxide or silicon nitride is formed on the upper surfaces of the silicon substrate 1 and the connecting pads 2, except for central portions of the connecting pads 2. The central portions of the connecting pads 2 are exposed through holes 4 formed in the insulating film 3.

A lower protective film 5 made of an organic resin such as polyimide is formed on the upper surface of the insulating film 3. Holes 6 are formed in those portions of the lower protective film 5, which correspond to the holes 4 in the insulating film 3. Recesses 7 are formed in distribution wire formation regions of the upper surface of the lower protective film 5. The recesses 7 communicate with the holes 6. A distribution wire 8 is formed from the upper surface of each connecting pad 2 exposed through the holes 4 and 6 into the recess 7 of the lower protective film 5. The distribution wire 8 is made up of a lower metal layer 8a and an upper metal layer 8b formed on the lower metal layer 8a. Although details are not shown, the lower metal layer 8a has a two-layered structure in which a titanium layer and copper layer are stacked in this order from below. The upper metal layer 8b is made of a copper layer alone.

At the edge of the silicon substrate 1, the upper metal layer 8b is not stacked on the lower metal layer 8a. That is, on the upper surface of the lower protective film 5, the lower metal layer 8a is formed as a connecting line 8a'which is a single layer and runs to the edge of the silicon substrate 1. A lower bump electrode 10a and upper bump electrode 10b both made of copper are formed on the upper surface of a connecting pad portion of each distribution wire 8. That is, in this embodiment, a bump electrode 10 has a two-layered structure made up of the lower bump electrode 10a and upper bump electrode 10b. On the upper surface of the lower protective film 5 including, except for their connecting pad portions, the lower metal layer 8a and upper metal layer 8b formed on the upper surface of the lower protective film 5, an upper protective film 13 made of an organic resin such as polyimide and an encapsulating film 11 made of an organic resin such as an epoxy-based resin are formed. In this state, the upper surface of the encapsulating film 11 is leveled with the upper surfaces of the lower bump electrodes 10a. Accordingly, the upper bump electrodes 10b entirely protrude from the encapsulating film 11.

Figure 17:
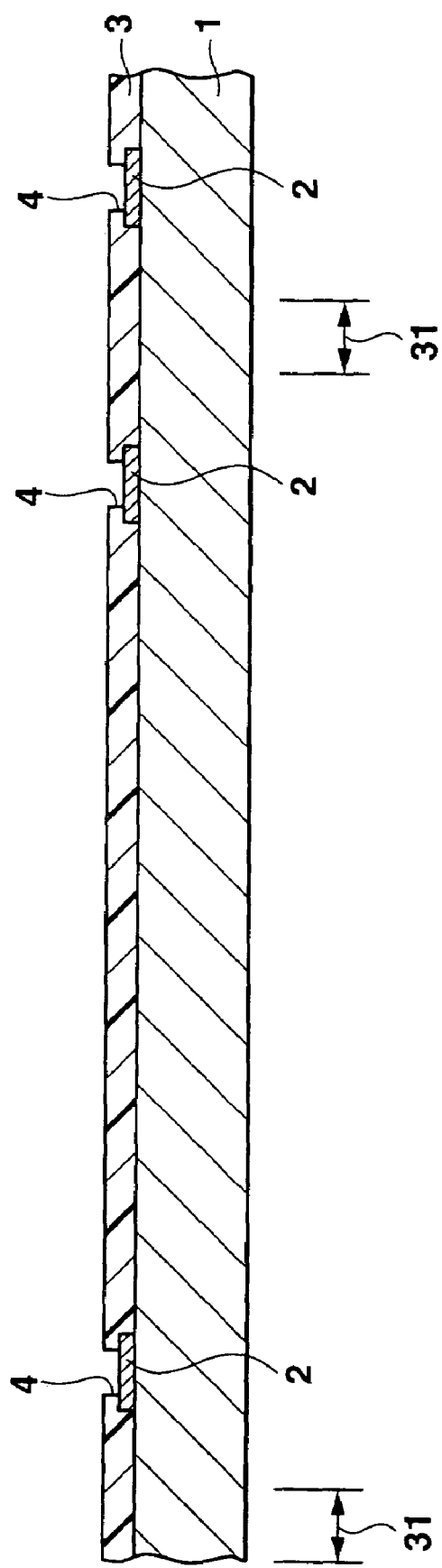
FIG. 17 is an enlarged sectional view of an initial fabrication step in the fabrication of the semiconductor device shown in FIG. 16.

An example of a method of fabricating this semiconductor device will be explained below. First, as shown in FIG. 17, a structure is prepared in which connecting pads 2 made of an aluminum-based metal are formed on the upper surface of a silicon substrate 1 in the form of a wafer, an insulating film 3 made of an inorganic insulating material such as silicon oxide or silicon nitride is formed on the upper surfaces of the silicon substrate 1 and the connecting pads 2 except for central portions of the connecting pads 2. The central portions of the connecting pads 2 are exposed through holes 4 formed in the insulating film 3. In FIG. 17, regions denoted by reference numeral 31 correspond to dicing streets.

Figure 18:
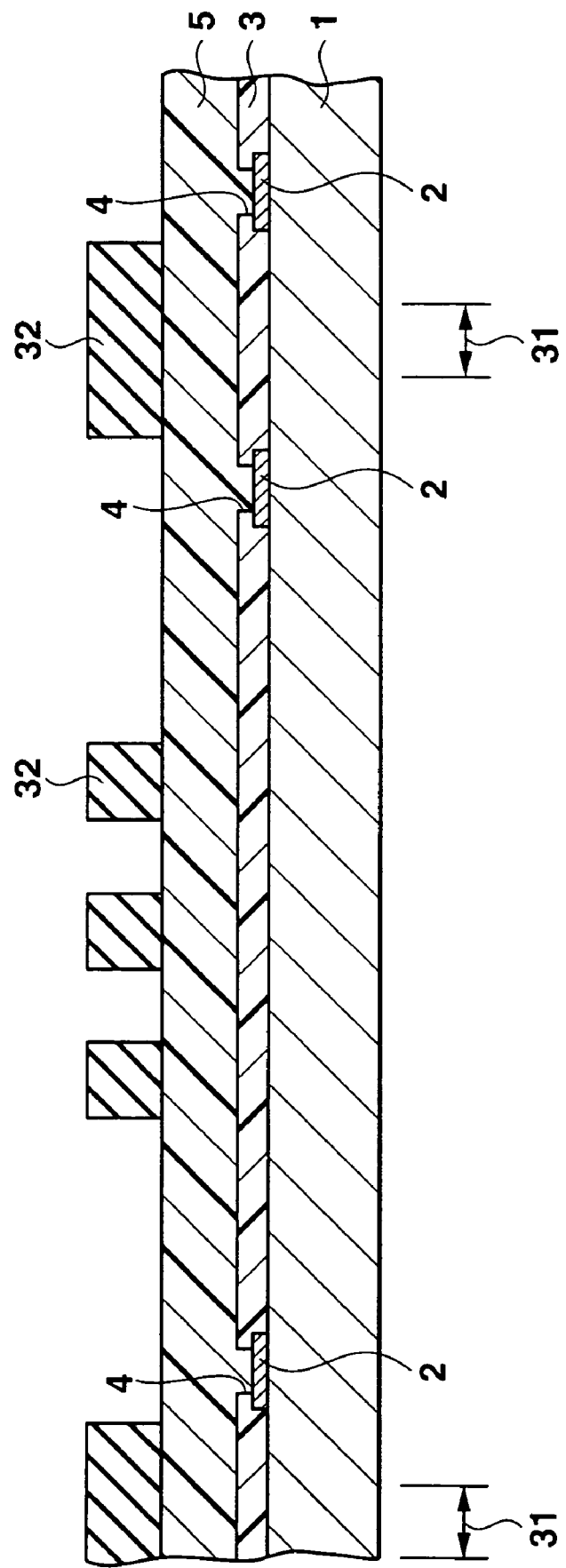
FIG. 18 is an enlarged sectional view of a fabrication step following FIG. 17.
Figure 19:
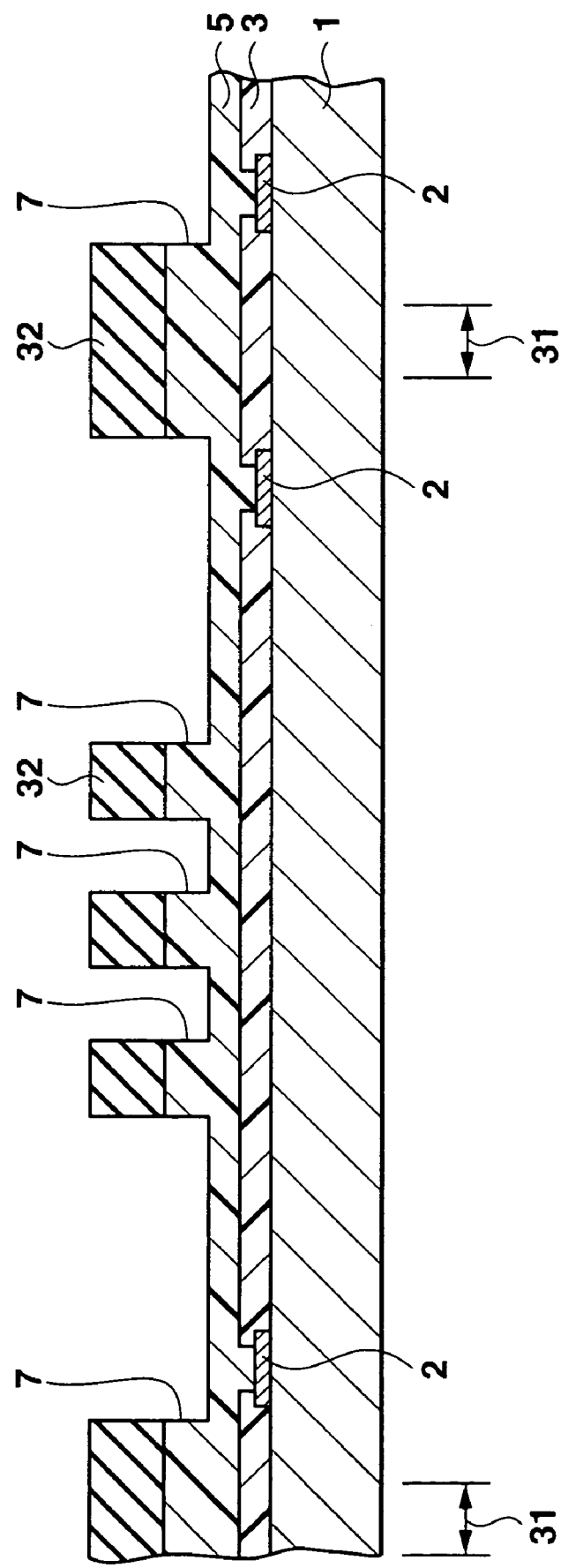
FIG. 19 is an enlarged sectional view of a fabrication step following FIG. 18.

As shown in FIG. 18, a lower protective film 5 made of an organic resin such as polyimide is formed by spin coating or the like on the entire upper surface of the insulating film 3 including the upper surfaces of the connecting pads 2 exposed through the holes 4, such that the upper surface of the lower protective film 5 is substantially flat. A resist film 32 is then formed on the upper surface of the lower protective film 5 except for prospective formation regions of recesses 7 (i.e., distribution wires 8). As shown in FIG. 19, the resist film 32 is used as a mask to half-etch the lower protective film 5, thereby forming recesses 7 in the upper surface of the lower protective film 5 except for regions below the resist film 32. The resist film 32 is then peeled.

Figure 20:
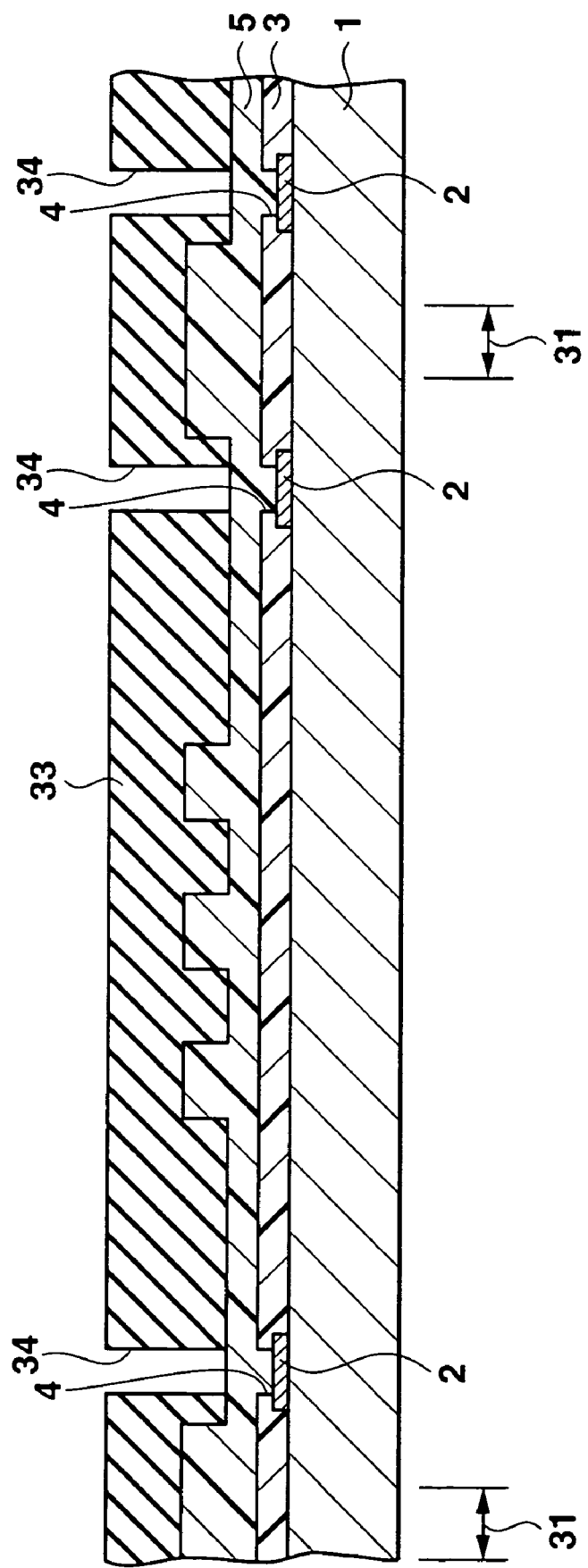
FIG. 20 is an enlarged sectional view of a fabrication step following FIG. 19.
Figure 21:
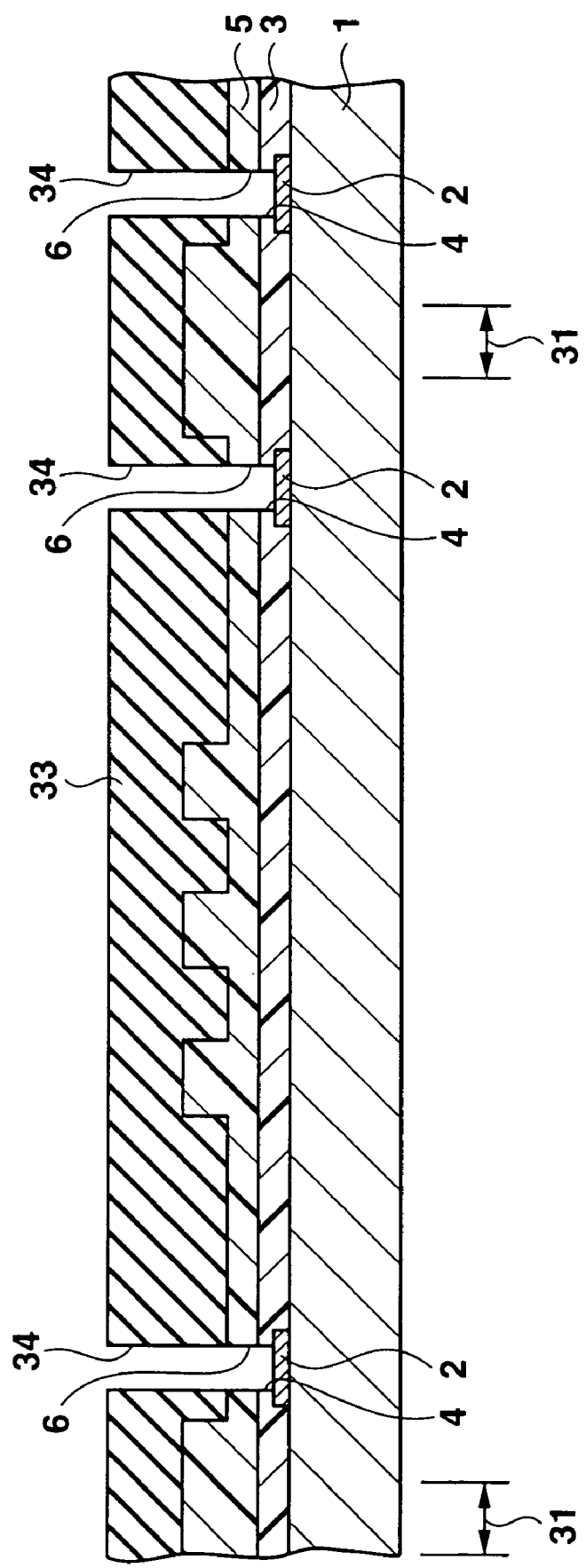
FIG. 21 is an enlarged sectional view of a fabrication step following FIG. 20.

As shown in FIG. 20, a resist film 33 is formed by patterning on the upper surface of the lower protective film 5. In this state, holes 34 are formed in those portions of the resist film 33, which correspond to the holes 4 in the insulating film 3. Subsequently, as shown in FIG. 21, the resist film 33 is used as a mask to selectively etch the lower protective film 5, thereby forming holes 6 in those portions of the lower protective film 5, which correspond to the holes 34 in the resist film 33, i.e., the holes 4 in the insulating film 3. After that, the resist film 33 is peeled.

Figure 22:
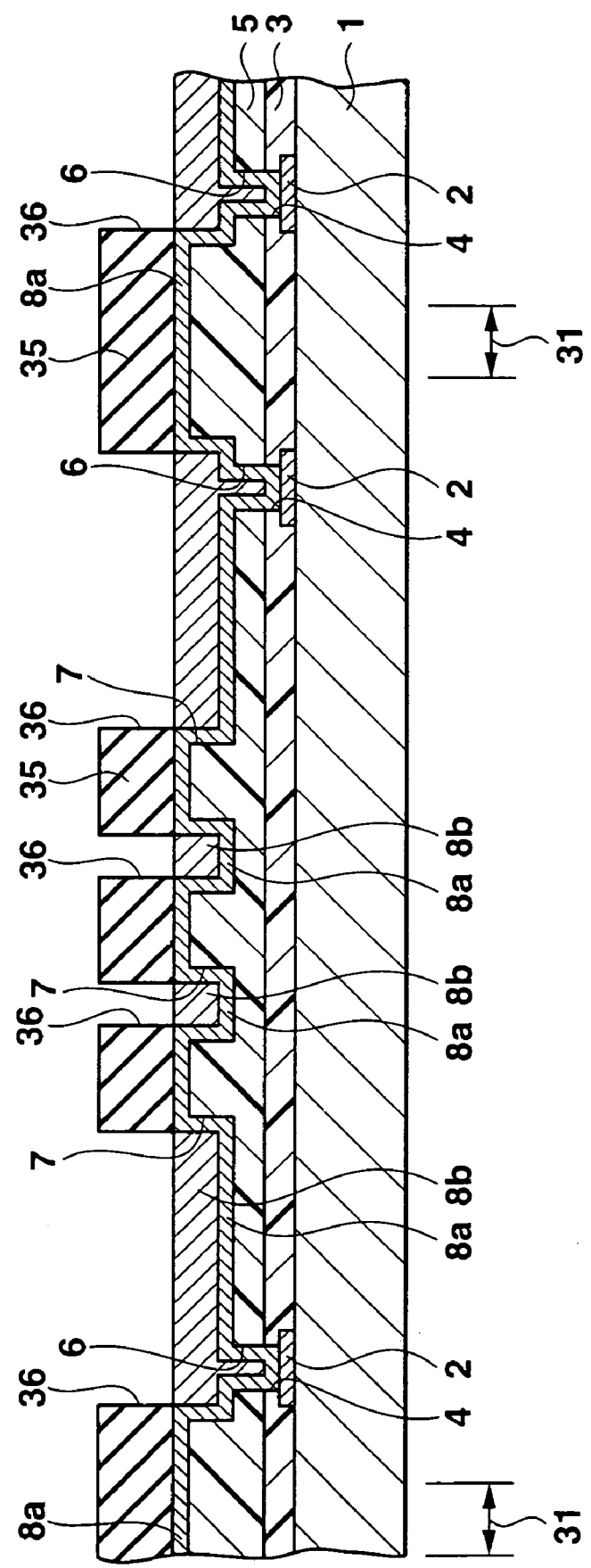
FIG. 22 is an enlarged sectional view of a fabrication step following FIG. 21.

As shown in FIG. 22, a lower metal layer 8a is formed on the entire upper surface of the lower protective film 5 and the upper surfaces of the connecting pads 2, exposed through the holes 4 and 6. Although details are not shown, the lower metal layer 8a is obtained by forming a copper layer by sputtering on a titanium layer which is also formed by sputtering. The lower metal layer 8a may also be a single copper layer formed by electroless plating.

Subsequently, a resist film 35 is formed by patterning on the upper surface of the lower metal layer 8a. In this state, holes 36 are formed in those portions of the resist film 35, which correspond to prospective formation regions of distribution wires 8. That is, the edge of each hole 36 continues to the inner wall surface of the lower metal layer 8a formed in the recess 7. The lower metal layer 8a is then used as a plating current path to perform electroplating of copper, thereby forming an upper metal layer 8b on the upper surface of the lower metal layer 8a in the recess 7. In this state, the upper surface of the upper metal layer 8b is substantially leveled with the upper surface of the portion of the lower metal layer 8a under the resist film 35. After that, the resist film 35 is peeled.

Figure 23:
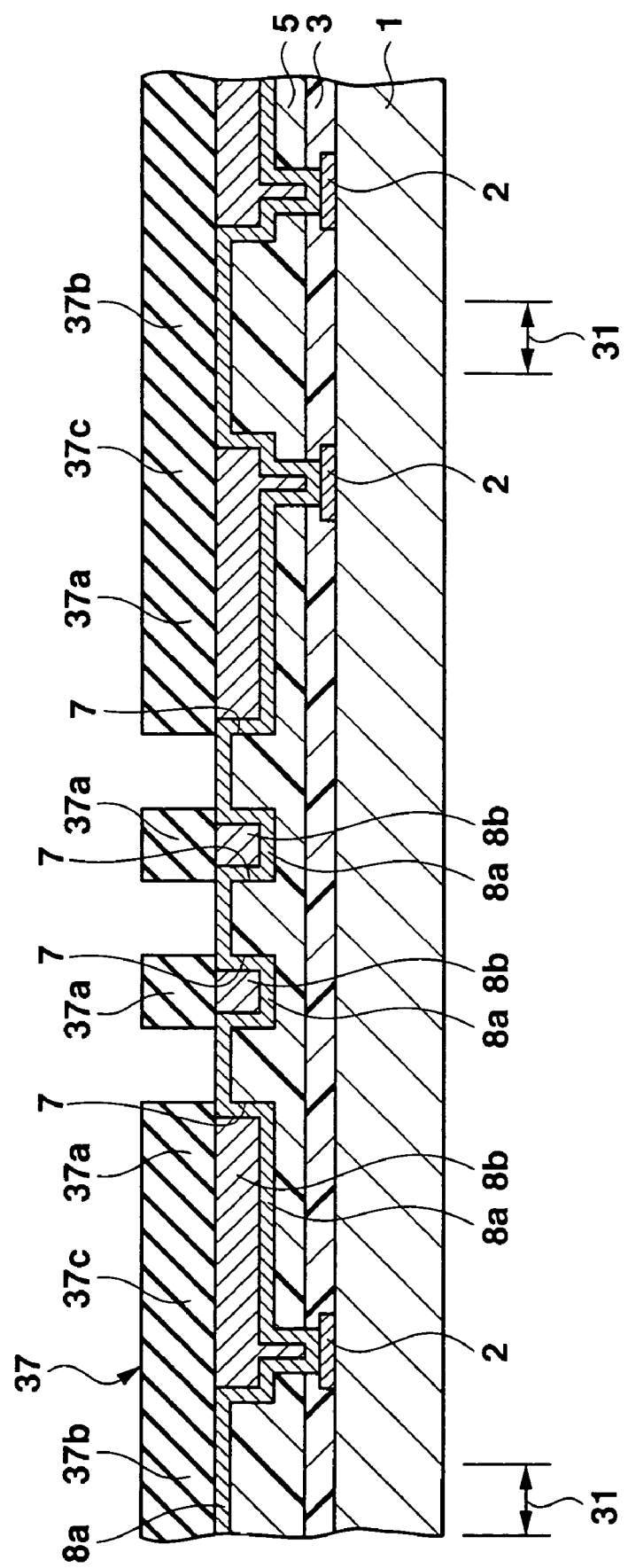
FIG. 23 is an enlarged sectional view of a fabrication step following FIG. 22.
Figure 24:
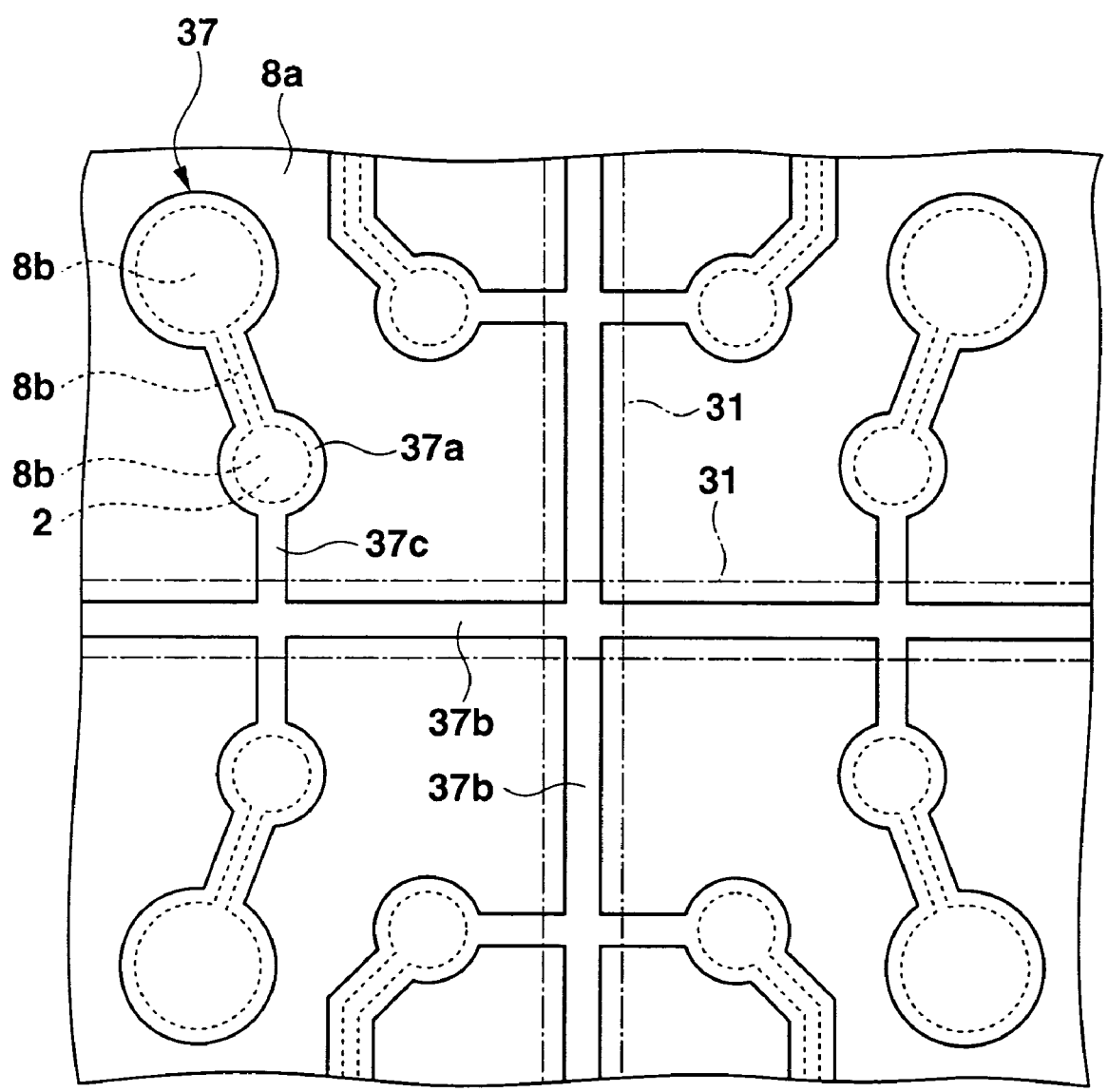
FIG. 24 is an enlarged sectional view of a fabrication step following FIG. 23.

As shown in FIG. 23, a resist film 37 is formed by depositing and then patterning, on the portions of the upper surface of the lower metal layer 8a and the upper metal layer 8b. FIG. 24 is a plan view of the state shown in FIG. 23 (FIG. 24 shows a region wider than that shown in FIG. 23). As shown in FIG. 24, the resist film 37 has a shape including portions 37a corresponding to the upper metal layer 8b, portions 37b corresponding to the dicing streets 31 indicated by the alternate long and short dashed lines, and portions 37c corresponding to the upper metal layer 8b between the connecting pads 2 and dicing streets 31.

Figure 25:
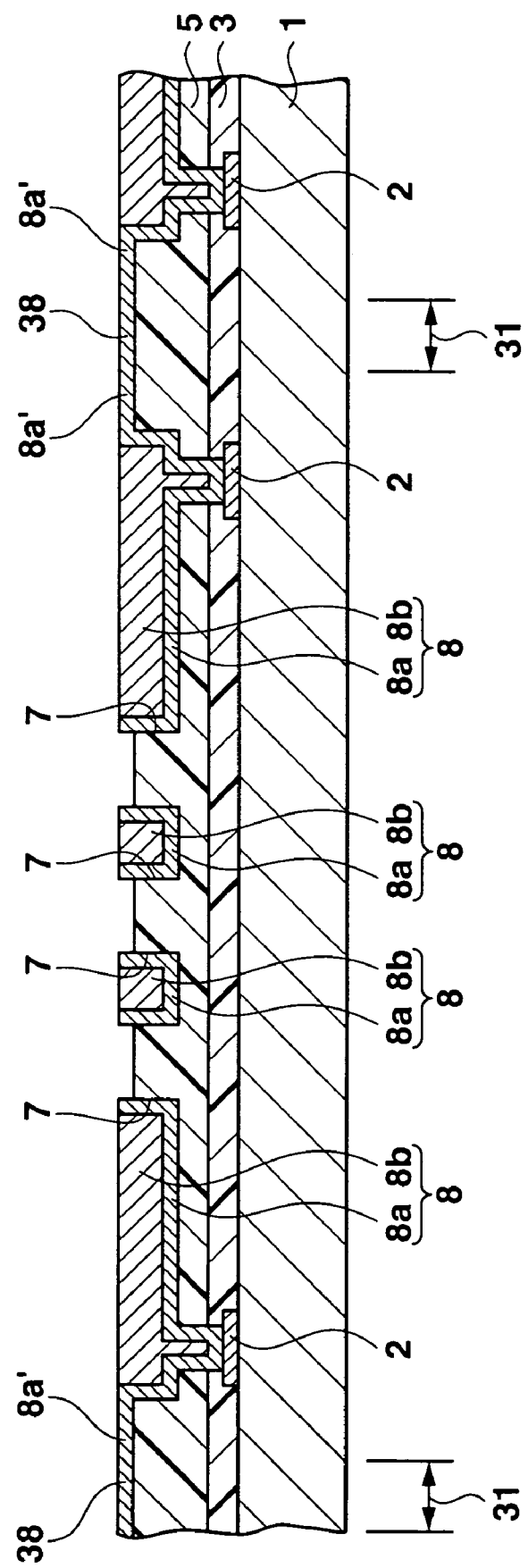
FIG. 25 is an enlarged sectional view of a fabrication step following FIG. 24.
Figure 26:
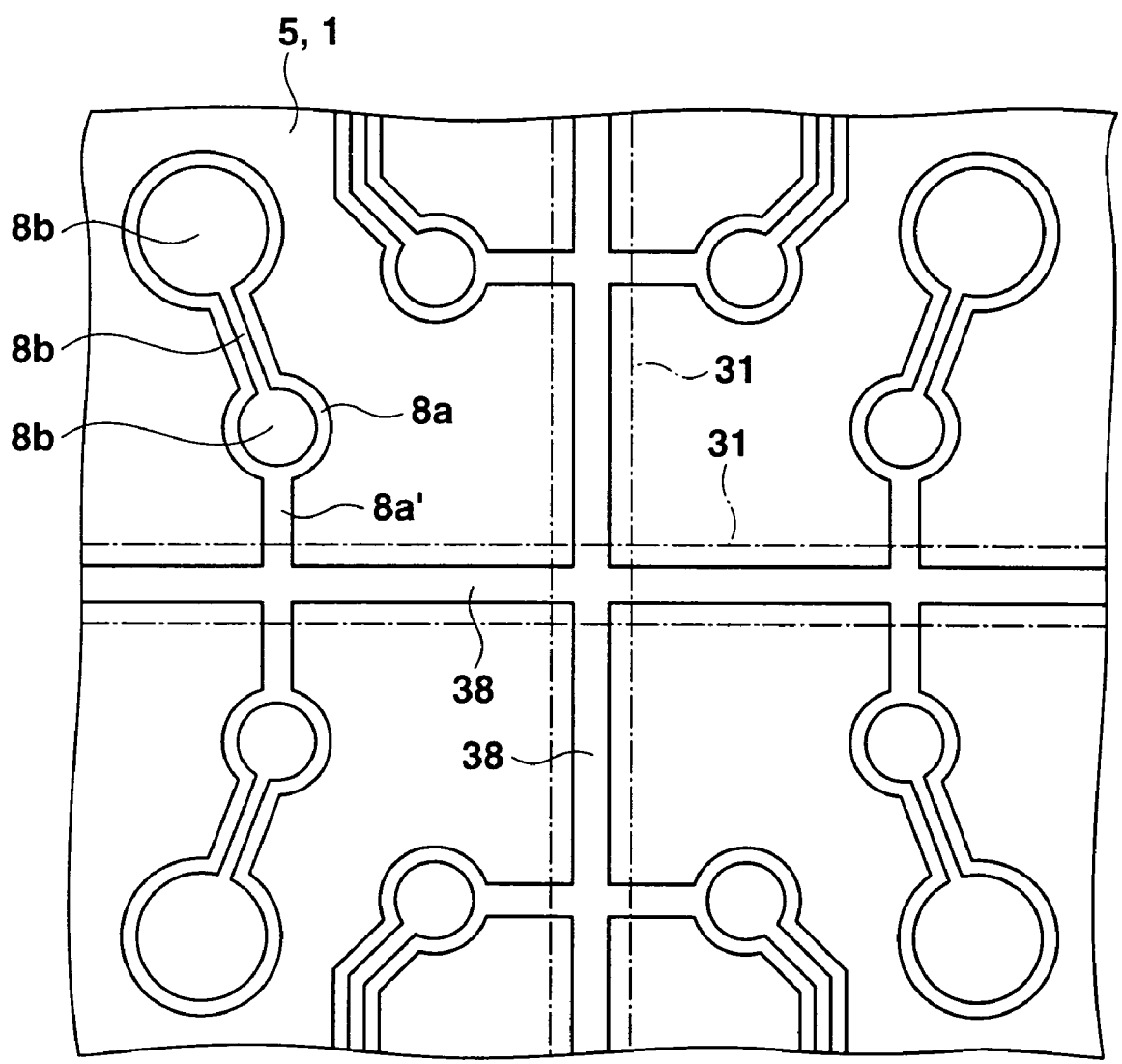
FIG. 26 is an enlarged sectional view of a fabrication step following FIG. 25.

The resist film 37 is then used as a mask to etch away unnecessary portions of the lower metal layer 8a. When the resist film 37 is peeled after that, a structure as shown in FIGS. 25 and 26 is obtained. That is, a distribution wire 8 is formed in each recess 7. The distribution wire 8 has the upper metal layer 8b whose upper surface is exposed and lower and side surfaces are covered with the lower metal layer 8a. Also, lattice-like auxiliary wires 38 made of the lower metal layer 8a alone are formed in regions corresponding to the dicing streets 31 indicated by the alternate long and short dashed lines. In addition, connecting lines 8a' made of the lower metal layer 8a alone are formed between the auxiliary wires 38 and distribution wires 8.

Figure 27:
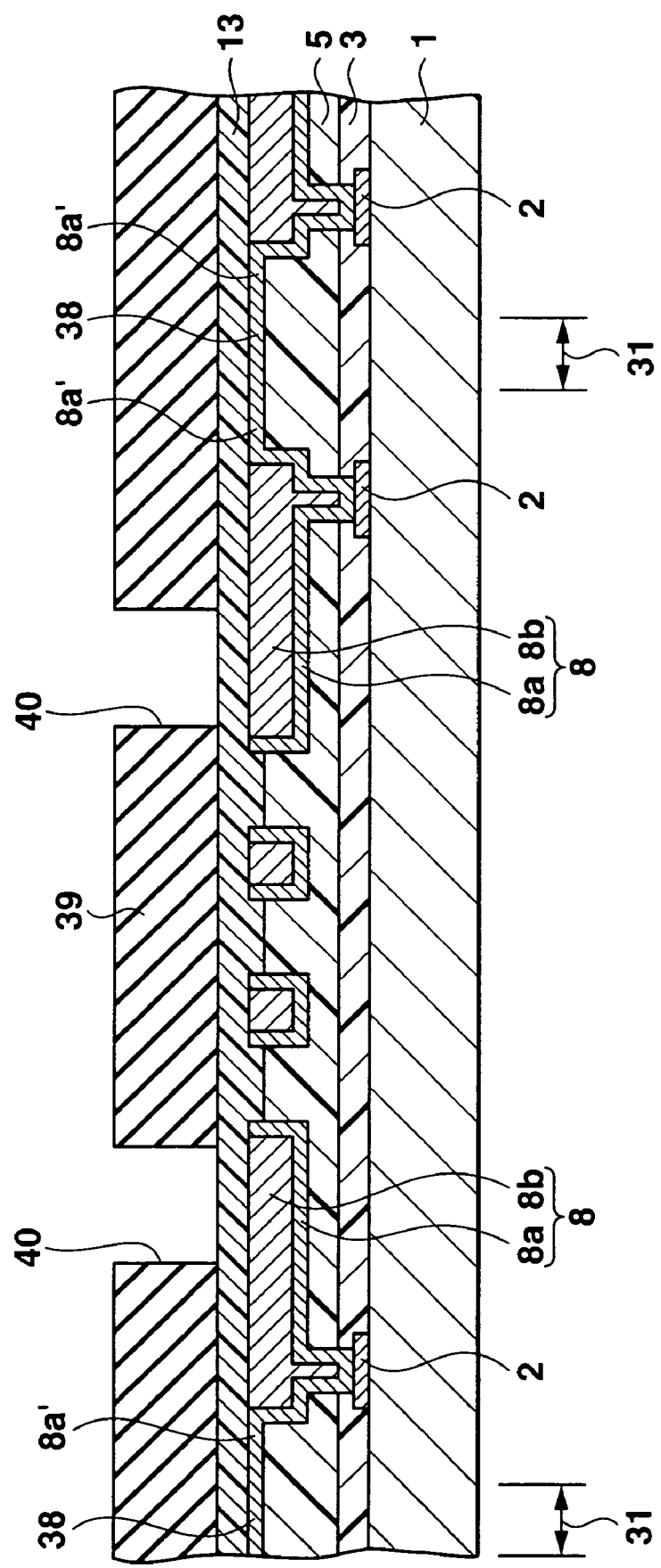
FIG. 27 is an enlarged sectional view of a fabrication step following FIG. 26.

As shown in FIG. 27, an upper protective film 13 made of an organic resin such as polyimide, i.e., the same material as the lower protective film 5, is formed by spin coating or the like, on the entire upper surface of the lower protective film 5, the distribution wires 8, connecting lines 8a', and auxiliary wires 38, such that the upper surface of the upper protective film 13 is substantially flat. A resist pattern 39 is then formed by depositing and then patterning, on the upper surface of the upper protective film 13. In this state, holes 40 are formed in those portions of the resist film 39, which correspond to connecting pad portions of the distribution wires 8.

Figure 28:
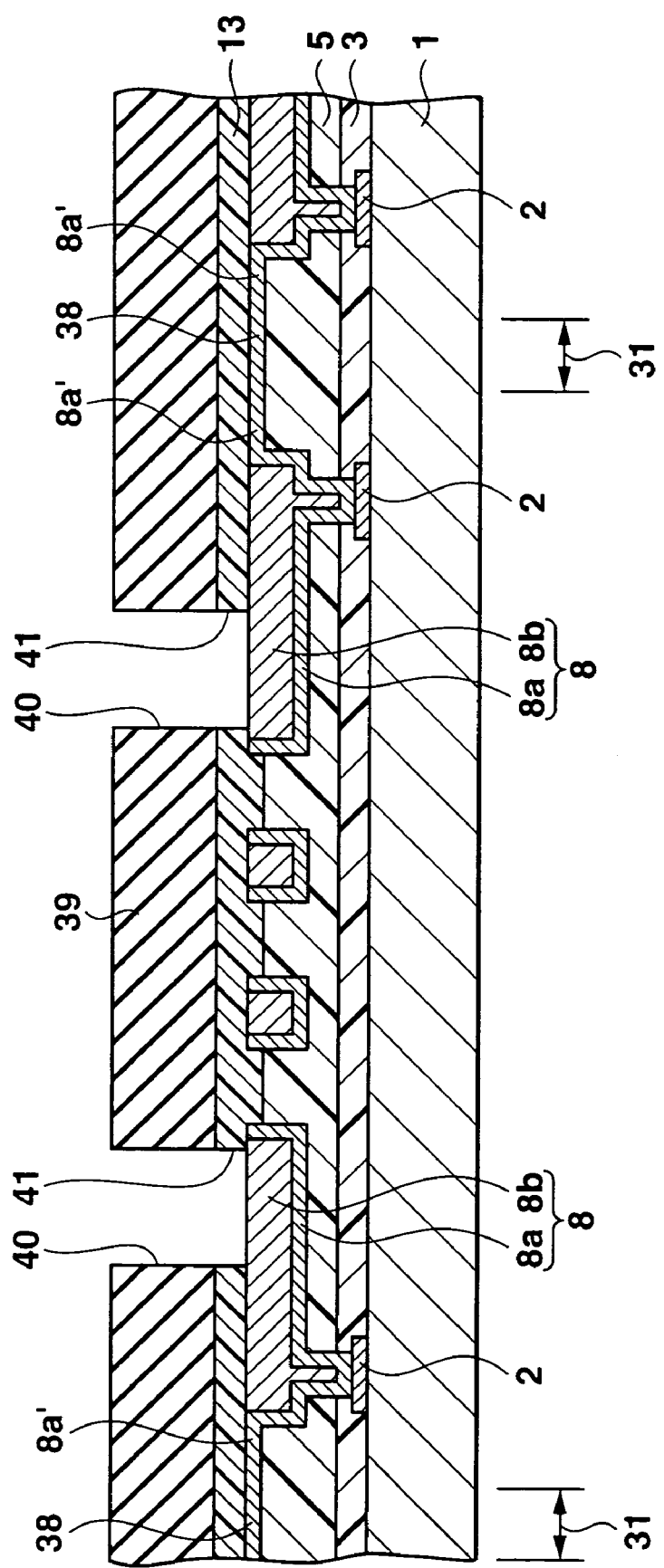
FIG. 28 is an enlarged sectional view of a fabrication step following FIG. 27.
Figure 29:
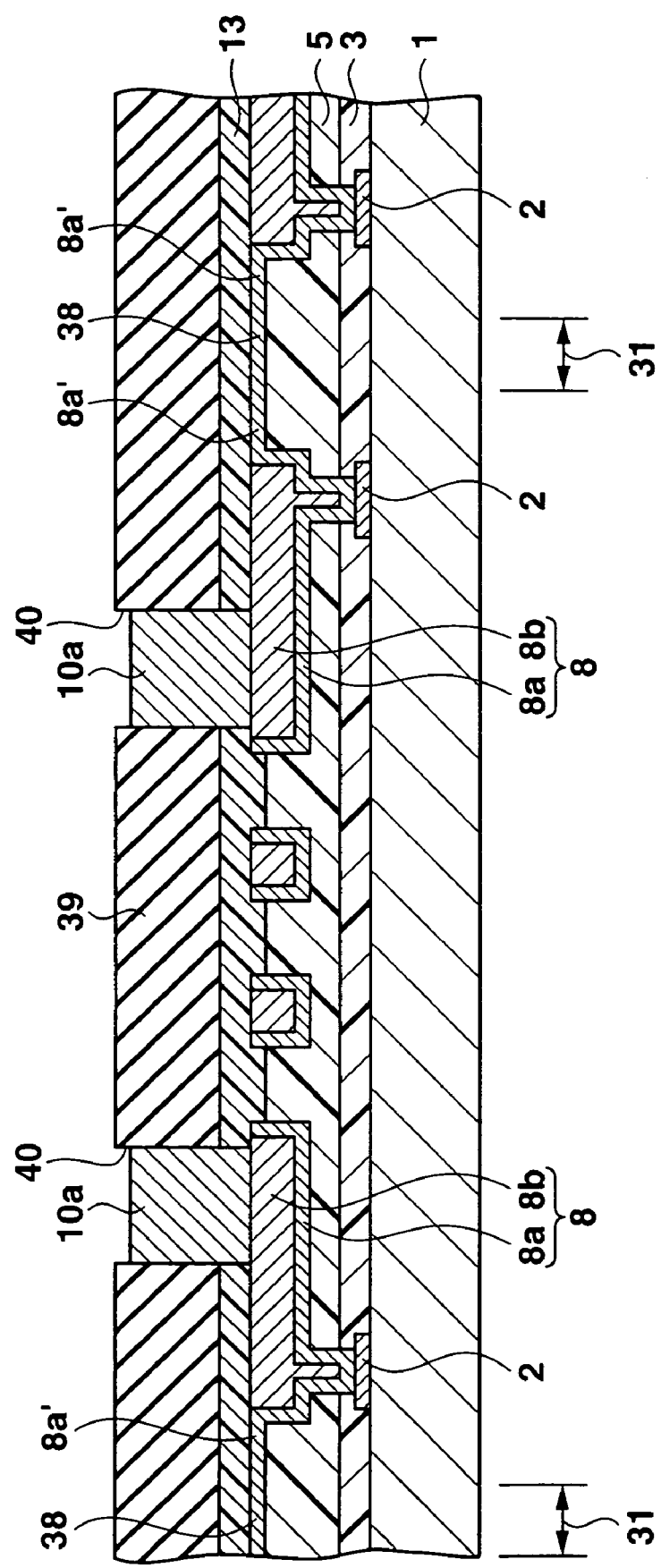
FIG. 29 is an enlarged sectional view of a fabrication step following FIG. 28.

As shown in FIG. 28, the resist film 39 is used as a mask to selectively etch the upper protective film 13, thereby forming holes 41 in those portions of the upper protective film 13, which correspond to the holes 40 in the resist film 39, i.e., the connecting pad portions of the distribution wires 8. Subsequently, as shown in FIG. 29, the auxiliary wires 38 are used as masks to perform electroplating of copper, thereby forming lower bump electrodes 10a on the upper surfaces of the connecting pad portions of the distribution wires 8 in the holes 40 and 41 of the resist film 39 and upper protective film 13, respectively. After that, the resist film 39 is peeled.

Figure 30:
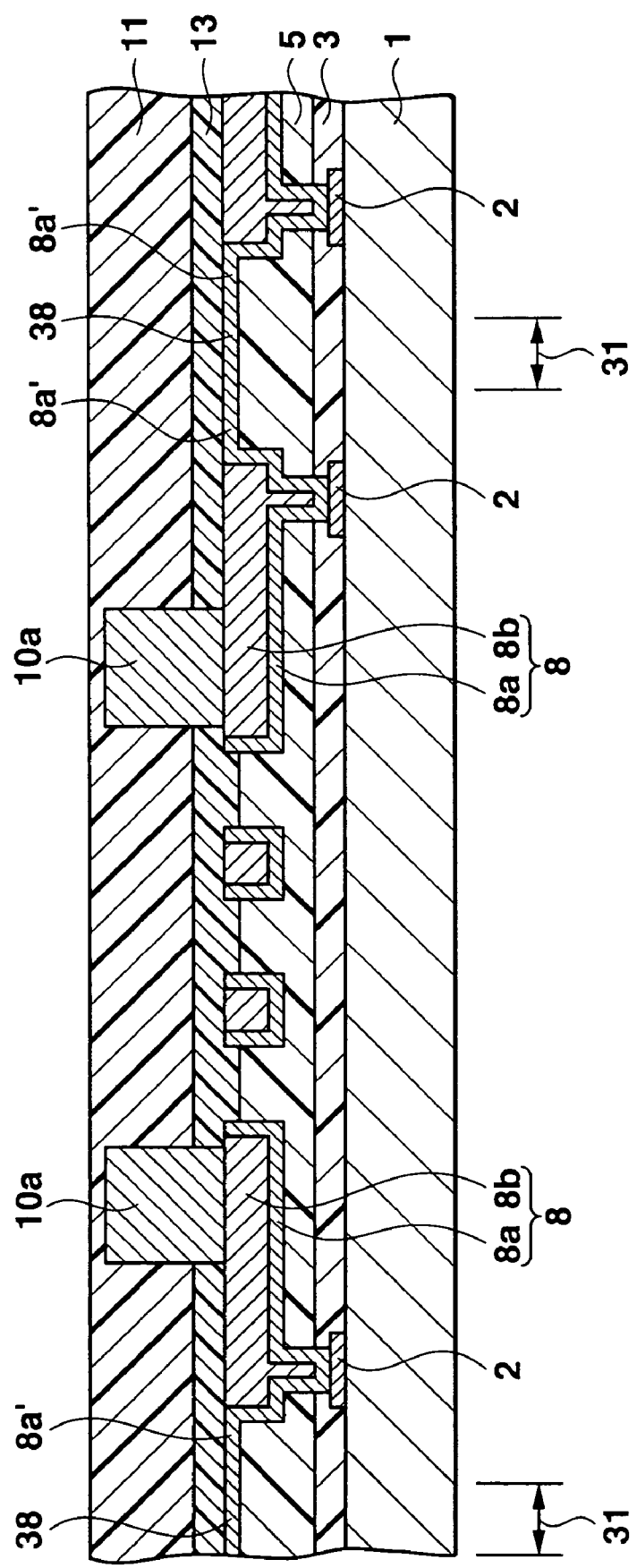
FIG. 30 is an enlarged sectional view of a fabrication step following FIG. 29.
Figure 31:
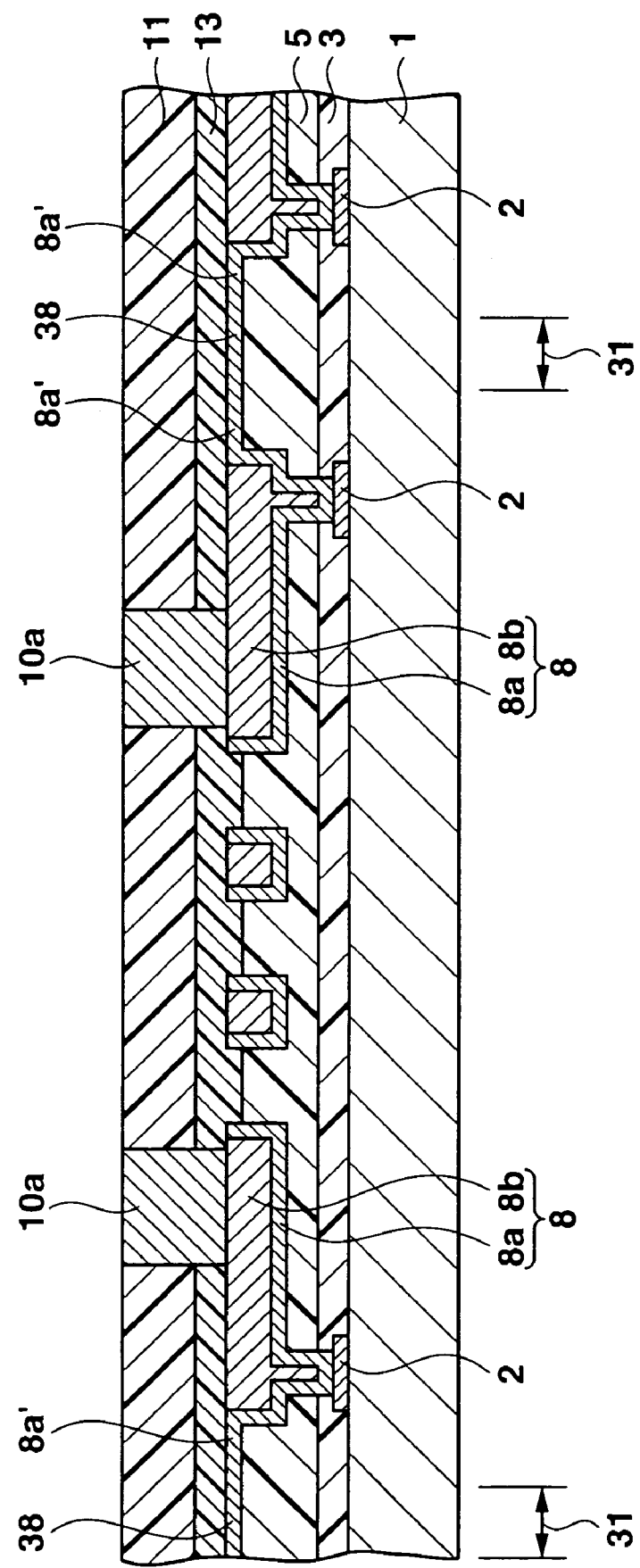
FIG. 31 is an enlarged sectional view of a fabrication step following FIG. 30.

As shown in FIG. 30, an encapsulating film 11 made of an organic resin such as an epoxy resin is formed on the upper surface of the upper protective film 13, the lower bump electrodes 10a, distribution wires 8, connecting lines 8a', and auxiliary wires 38, such that the thickness of the encapsulating film 11 is slightly larger than the height of the lower bump electrodes 10a. In this state, therefore, the upper surfaces of the lower bump electrodes 10a are covered with the encapsulating film 11. Subsequently, as shown in FIG. 31, the encapsulating film 11 and the upper surfaces of the lower bump electrodes 10a are appropriately polished to expose these upper surfaces of the lower bump electrodes 10a, and planarize the upper surface of the encapsulating film 11 including the upper surfaces of the lower bump electrodes 10a.

Figure 32:
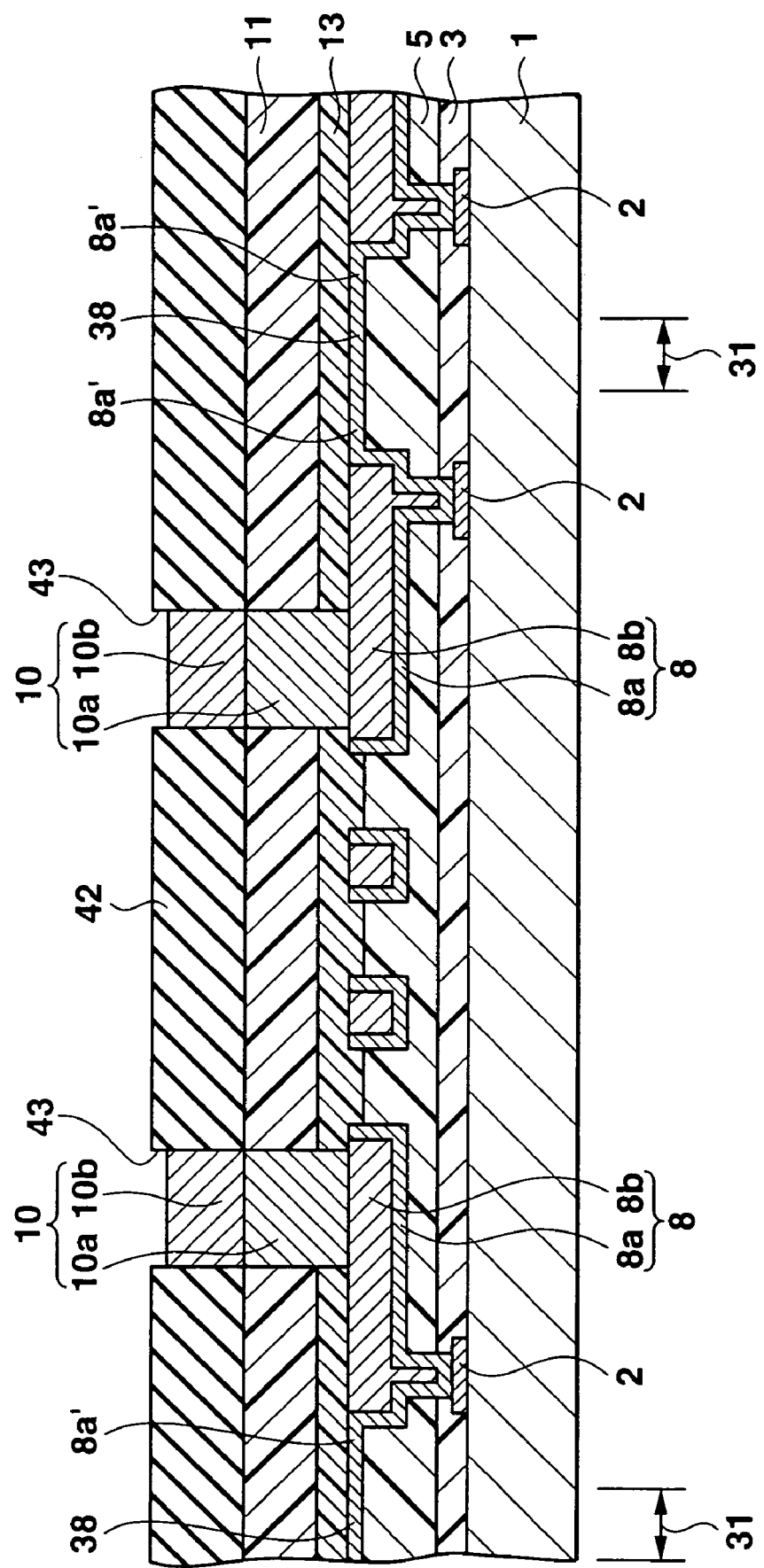
FIG. 32 is an enlarged sectional view of a fabrication step following FIG. 31.
Figure 33:
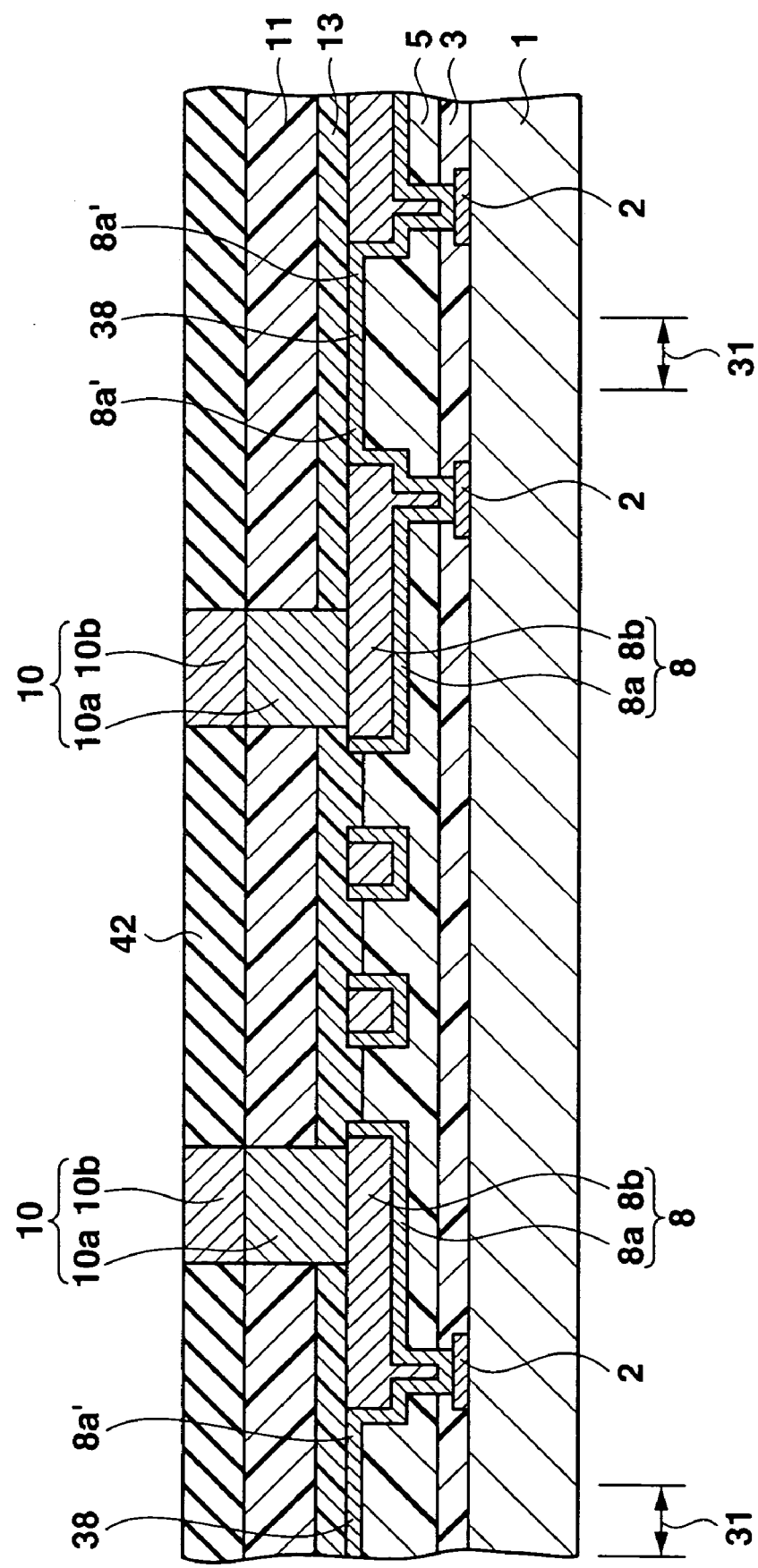
FIG. 33 is an enlarged sectional view of a fabrication step following FIG. 32.

As shown in FIG. 32, a resist film 42 is formed by depositing and then patterning, on the upper surface of the encapsulating film 11. In this state, holes 43 are formed in those portions of the resist film 42, which correspond to the upper surfaces of the lower bump electrodes 10a. The auxiliary wires 38 are then used as plating current paths to perform electroplating of copper, thereby forming upper bump electrodes 10b on the upper surfaces of the lower bump electrodes 10a in the holes 43 of the resist film 42. In this way, bump electrodes 10 having a two-layered structure are formed. Subsequently, as shown in FIG. 33, the resist film 42 and the upper surfaces of the upper bump electrodes 10b are appropriately polished to planarize the upper surface of the resist film 42 including the upper surfaces of the upper bump electrodes 10b.

Figure 34:
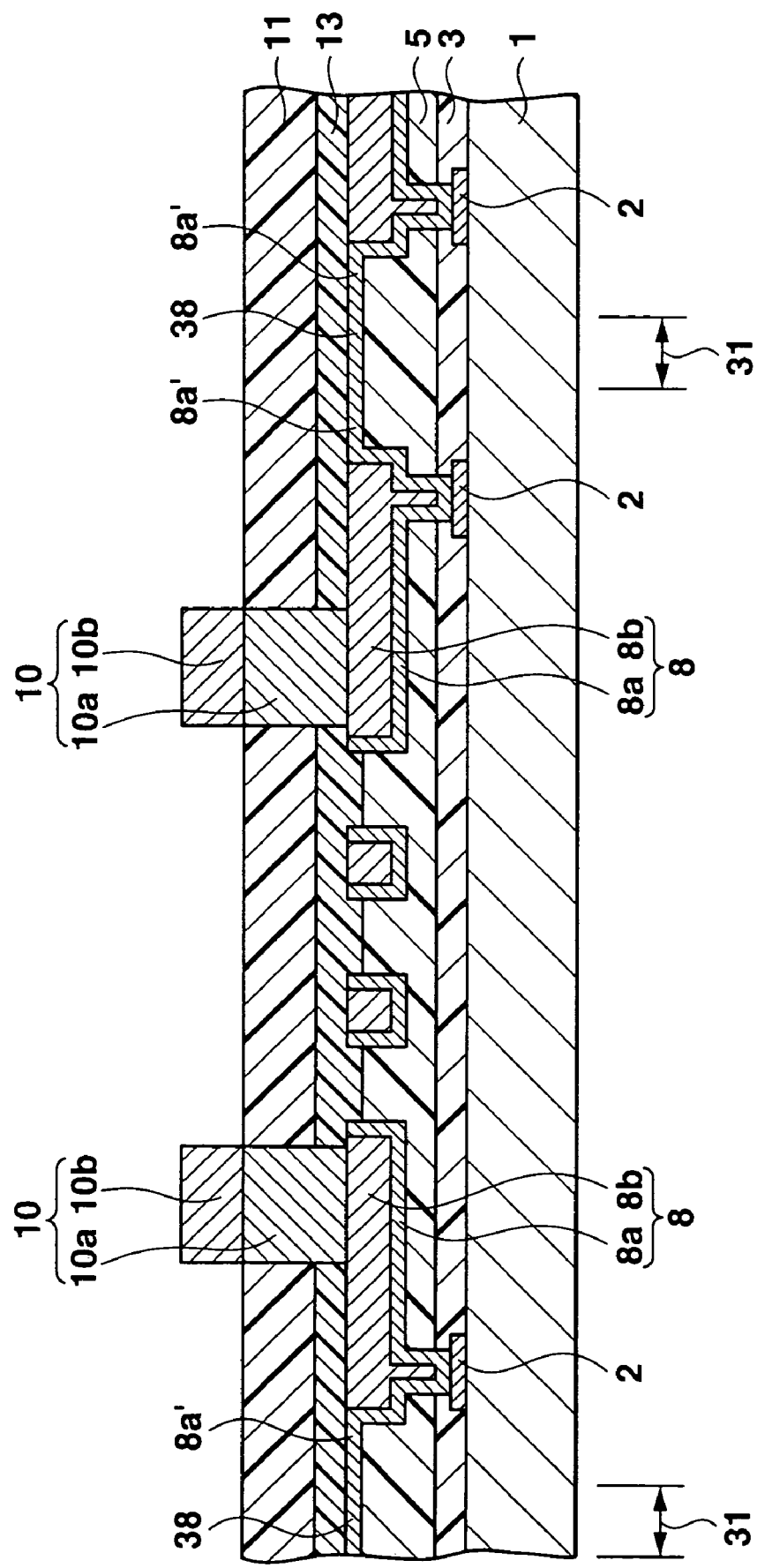
FIG. 34 is an enlarged sectional view of a fabrication step following FIG. 33.

Next, the resist film 42 is peeled, as shown in FIG. 34, so that the upper bump electrodes 10b entirely protrude from the encapsulating film 11. A plurality of semiconductor devices shown in FIG. 16 are obtained by dicing the wafer-like silicon substrate 1 and members thereon in the regions 31 corresponding to dicing streets. Since the silicon substrate 1 in the form of a wafer is diced in the regions 31 corresponding to dicing streets, the auxiliary wires 38 formed in the regions 31 corresponding to dicing streets are removed. Accordingly, the distribution wires 8 are not short-circuited.

In the semiconductor device thus obtained, the distribution wires 8, except for their connecting pad portions, formed in the recesses 7 on the upper surface of the lower protective film 5 are covered with the upper protective film 13 made of the same material as the lower protective film 5. Therefore, even if water in the use environment penetrates into the encapsulating film 11, further penetration of the water is inhibited by the upper surface of the upper protective film 13. This prevents easy occurrence of a short circuit caused by so-called ion migration between the distribution wires 8 and between the distribution wires 8 and bump electrodes 10.

Referring to FIG. 16, the lower bump electrode 10a and upper bump electrode 10b are separated by the solid line between them, for the sake of convenience. In practice, however, there is no such interface separating the two bump electrodes 10a and 10b that is, both electrodes 10a, 10b are integral, because both of them are formed by electroplating of copper. Accordingly, the upper portion of each bump electrode 10 formed on the upper surface of the connecting pad portion of the distribution wire 8 actually protrudes from the encapsulating film 11. As a consequence, when solder balls (not shown) are formed on the bump electrodes 10 and connected to connecting terminals of a circuit board, the bump electrodes 10 can deform more easily. This makes it possible to more effectively reduce the stress generated by the difference between the thermal expansion coefficients of the silicon substrate 1 and the circuit board (not shown).

(Other Examples of Fabrication Method of Second Embodiment)

Figure 35:
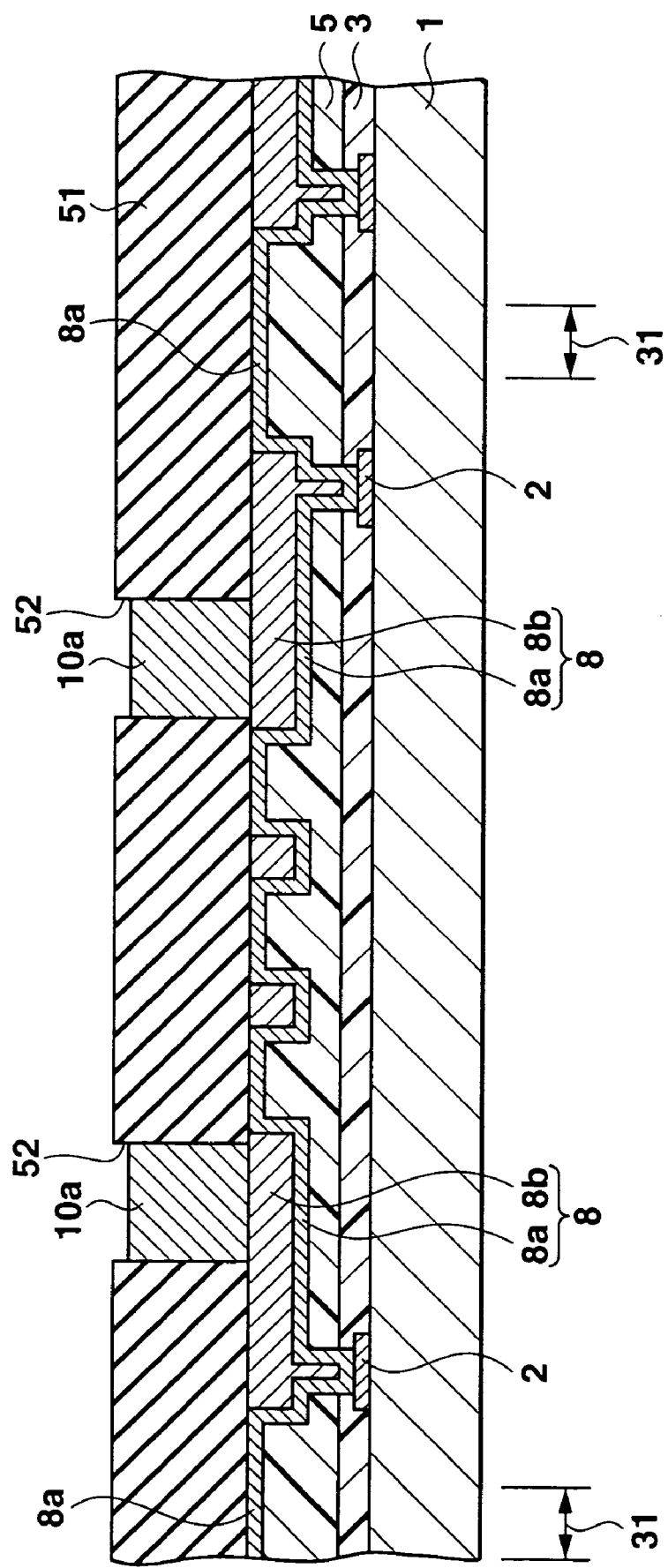
FIG. 35 is an enlarged sectional view of a predetermined step for explaining another fabrication method of the semiconductor device shown in FIG. 16.

In the above fabrication method, unnecessary portions of the lower metal layer 8a are removed as shown in FIG. 25, the upper protective film 13 is formed as shown in FIG. 28, and the lower bump electrodes 10a are formed as shown in FIG. 29. However, the present invention is not limited to this method. For example, after a lower metal layer 8a is formed on the entire surface of a lower protective film 5 and distribution wires 8 are formed in recesses 7 of the lower protective film 5 as shown in FIG. 22, a resist film 51 is formed by depositing and then patterning on the upper surface of the distribution wires 8 without patterning the lower metal layer 8a as shown in FIG. 35. In this state, holes 52 are formed in those portions of the resist film 51, which correspond to connecting pad portions of the distribution wires 8. The lower metal layer 8a is then used as a plating current path to perform electroplating of copper, thereby forming lower bump electrodes 10a on the upper surfaces of the connecting pad portions of the distribution wires 8 in the holes 52 of the resist film 51. After that, the resist film 51 is peeled.

Figure 36:
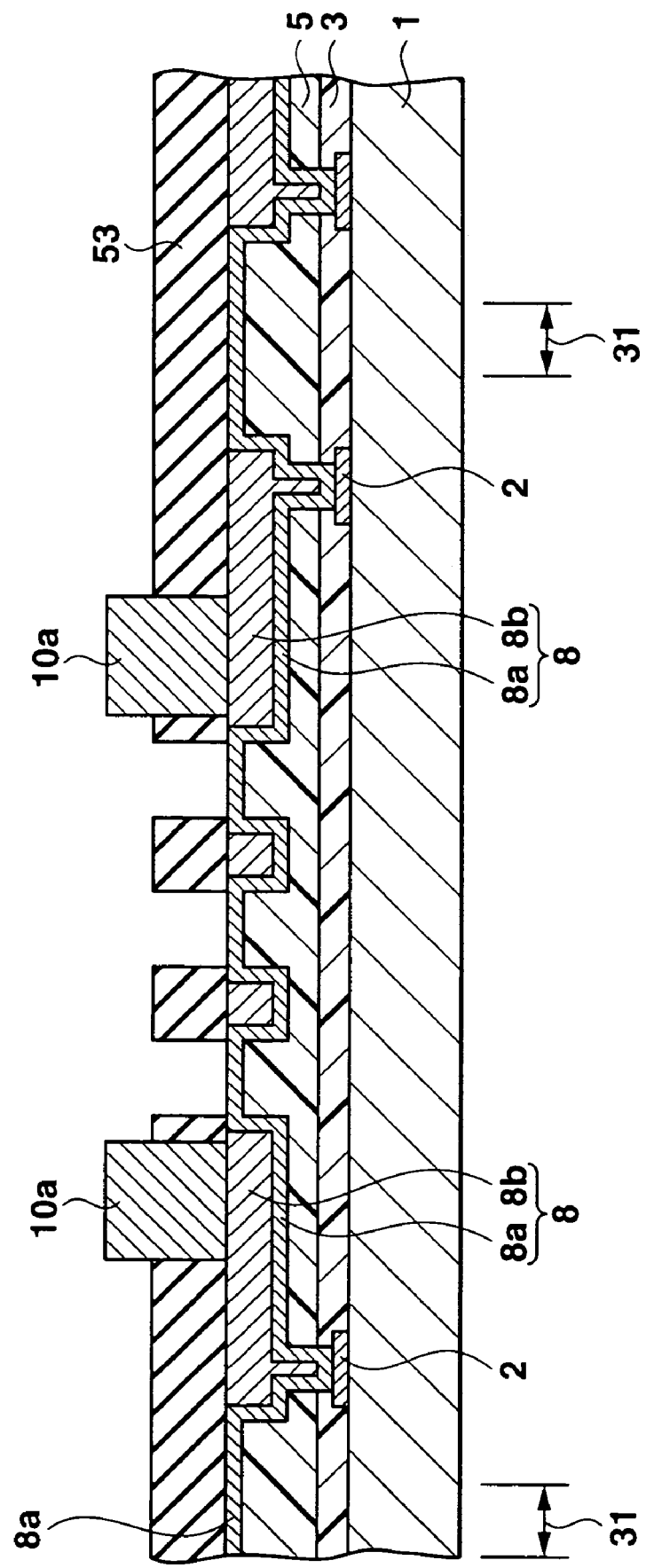
FIG. 36 is an enlarged sectional view of a step following FIG. 35.
Figure 37:
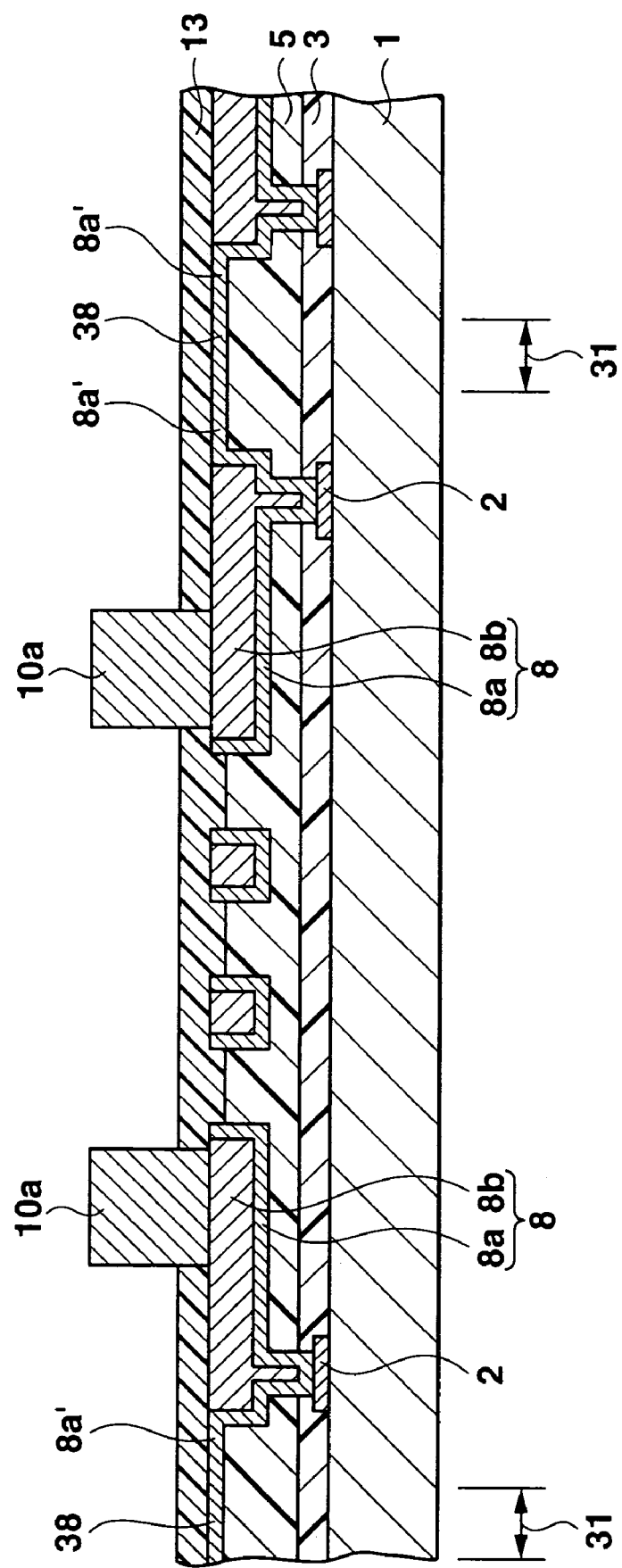
FIG. 37 is an enlarged sectional view of a step following FIG. 36.

As shown in FIG. 36, a resist film 53 is formed by depositing and then patterning of the resist, on the lower metal layer 8a including the distribution wires 8. The resist film 53 has the same pattern as the resist film 27 shown in FIGS. 23 and 24 except that the resist film 53 is not formed in regions corresponding to the lower bump electrodes 10a. The resist film 53 and the lower bump electrodes 10a are then used as a mask to etch away unnecessary portions of the lower metal layer 8a. After that, the resist film 53 is peeled. Subsequently, as shown in FIG. 37, the upper protective film 13 is formed by spin coating or the like on the upper surface of the lower protective film 5 including the distribution wires 8 and the like, except for the regions where the lower bump electrodes 10a are formed, such that the upper surface of the upper protective film 13 is substantially flat. A plurality of semiconductor devices shown in FIG. 16 are obtained through the steps shown in FIGS. 30 to 34 after that.

Figure 38:
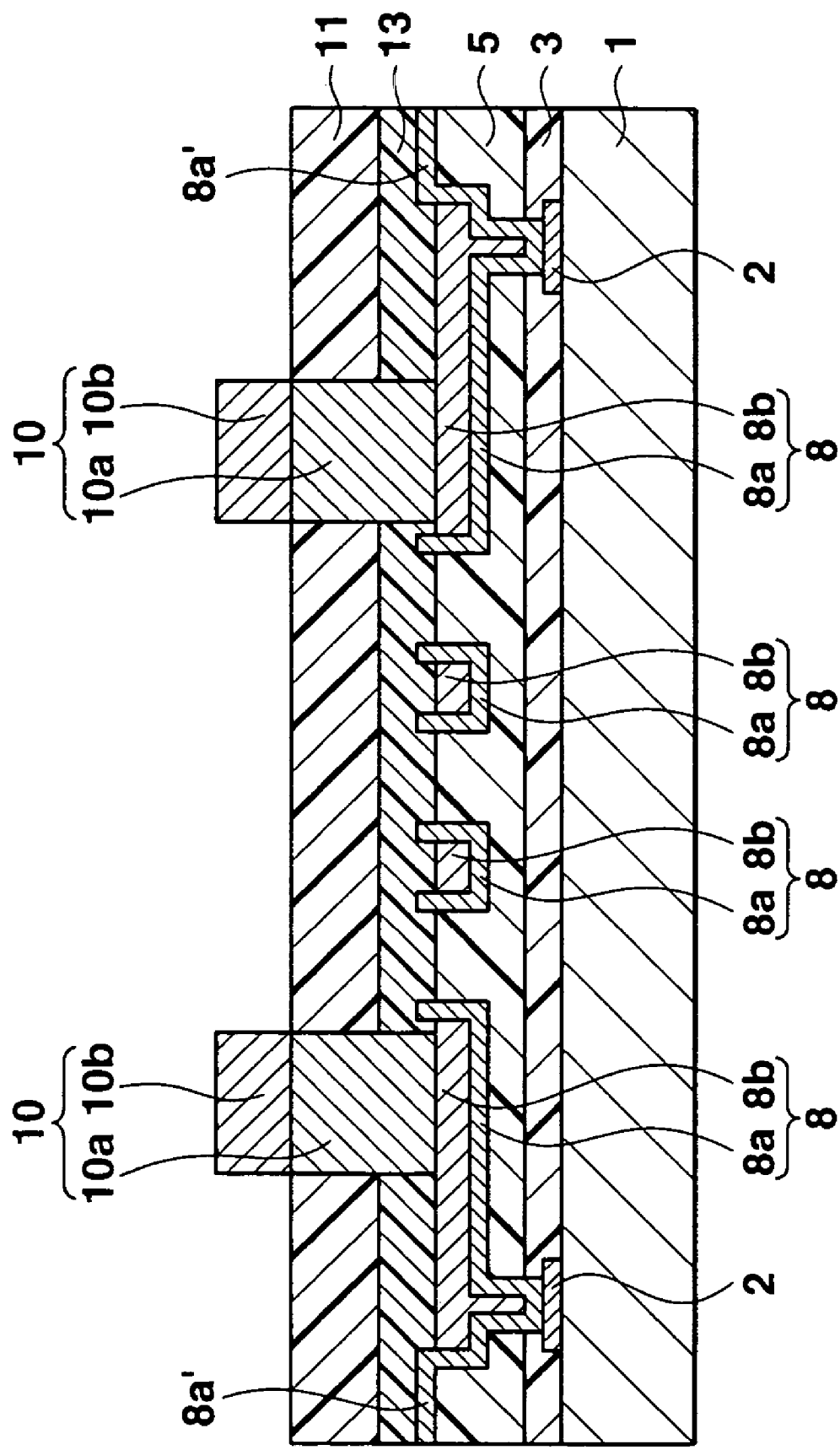
FIG. 38 is an enlarged sectional view of a semiconductor device as the first modification of the second embodiment of the present invention shown in FIG. 16.

Also, in the distribution wire 8 formation step shown in FIG. 22 of the second embodiment, if the upper surface of the upper metal layer 8b formed by electroplating of copper is substantially leveled with the upper surface of the lower protective film 5, a semiconductor device shown in FIG. 38 as the first modification of the second embodiment is obtained. In this structure, the upper surface of the lower metal layer 8a around the upper metal layer 8b may also be substantially leveled with the upper surface of the distribution wire 8.

Figure 39:
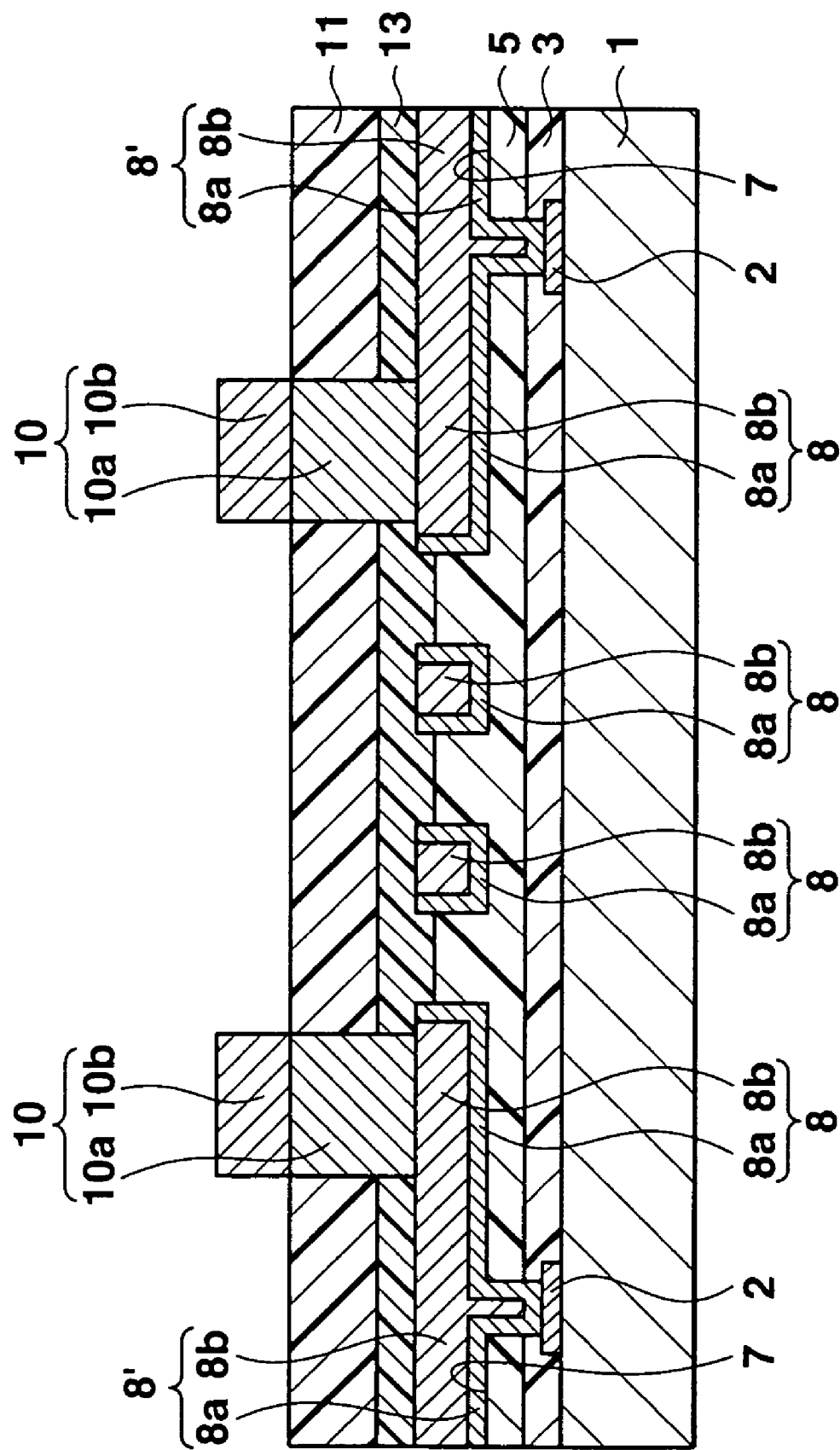
FIG. 39 is an enlarged sectional view of a semiconductor device as the second modification of the second embodiment of the present invention shown in FIG. 16.

The connecting lines 8a' used as current paths when the upper bump electrodes 10b are formed have a single-layered structure made of the lower metal layer 8a alone. However, as shown in FIG. 39 as the second modification of the second embodiment, connecting lines 8a' may also have a two-layered structure, similar to that of the distribution wires 8, in which an upper metal layer 8b is formed on a lower metal layer 8a. In this case, in the step of forming recesses 7 shown in FIG. 18, the pattern of a resist film 32 formed on the upper surface of a lower protective film 5 is also removed from regions 31 corresponding to dicing streets and their nearby regions, and the obtained resist film 32 is used as a mask to half-etch the lower protective film 5. Consequently, in the state shown in FIG. 19, recesses 7 are formed in the upper surface of the lower protective film 5 in the regions 31 corresponding to dicing streets and their nearby regions. After that, a lower metal layer 8a is formed, and then an upper metal layer 8b is formed by electroplating, thereby obtaining the structure shown in FIG. 39. When this fabrication method is used, therefore, the connecting lines 8' having a two-layered structure including the lower metal layer 8a and upper metal layer 8b are formed in the recesses 7 near the end faces of a silicon substrate 1. In this semiconductor device, auxiliary wires formed in the regions 31 corresponding to dicing streets also have the two-layered structure.

Figure 40:
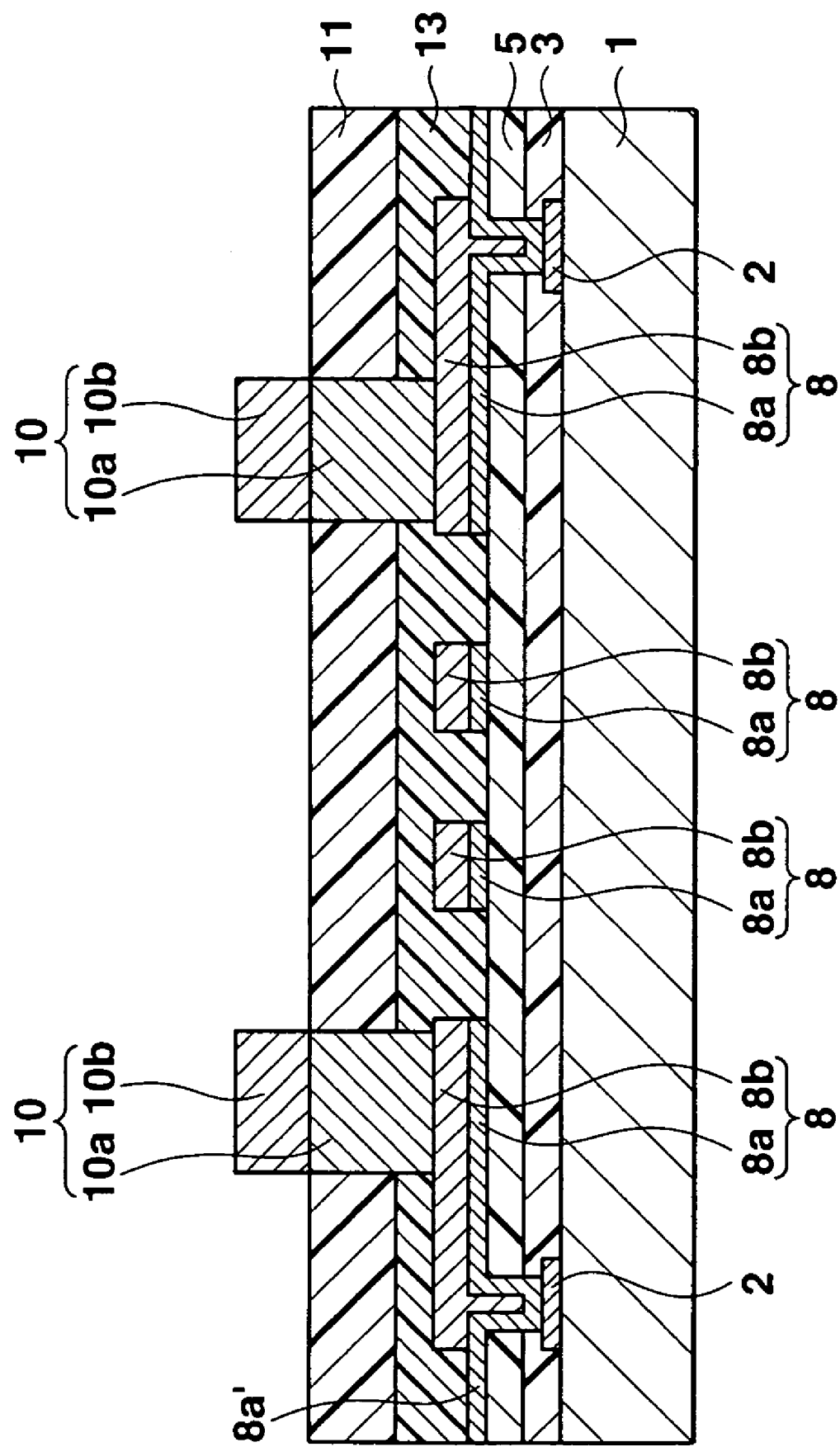
FIG. 40 is an enlarged sectional view of a semiconductor device as the third modification of the second embodiment of the present invention shown in FIG. 16.

FIG. 40 is a sectional view of a semiconductor device as the third modification of the second embodiment. This semiconductor device largely differs from that shown in FIG. 16 in that no recesses 7 are formed in the upper surface of a lower protective film 5, so the upper surface of the lower protective film 5 is substantially flat. Even in a structure like this, distribution wires 8 except for their connecting pad portions are covered with an upper protective layer 13. This prevents easy occurrence of a short circuit caused by so-called ion migration between the distribution wires 8 and between the distribution wires 8 and lower bump electrodes 10a.

Figure 41:
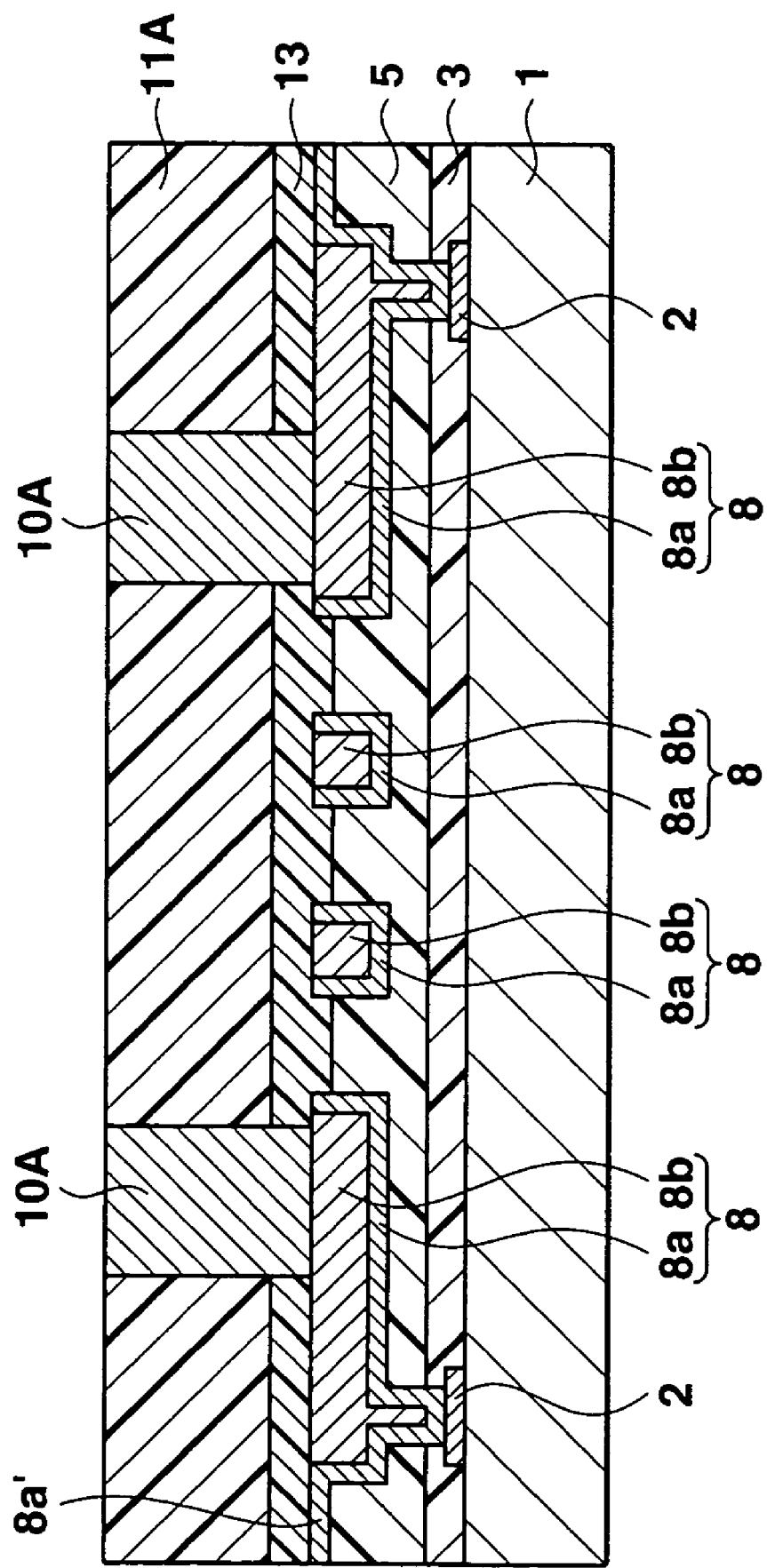
FIG. 41 is an enlarged sectional view of a semiconductor device as the fourth modification of the second embodiment of the present invention shown in FIG. 16.

FIG. 41 is a sectional view of a semiconductor device as the fourth modification of the second embodiment. This semiconductor device largely differs from that shown in FIG. 16 in that the height of each bump electrode 10A is the total height of the upper and lower bump electrodes, and the upper surface of an encapsulating film 11A is leveled with the upper surfaces of the bump electrodes 10A.

In the semiconductor device shown in FIG. 16, the thickness of the encapsulating film 11 is decreased by the height of the upper bump electrode 10b, so the upper bump electrode 10b protrudes from the encapsulating film 11, when compared to the semiconductor device shown in FIG. 41. This makes it possible to further reduce the stress caused by the difference between the thermal expansion coefficients of the silicon substrate 1 and a circuit board. On the other hand, when the thickness of the encapsulating film 11 is decreased by the height of the upper bump electrode 10b, water in the use environment penetrates into the encapsulating film 11 more easily than in the semiconductor device shown in FIG. 41. However, further penetration can be inhibited by the upper surface of the upper protective film 13. This prevents easy occurrence of a short circuit caused by so-called ion migration.

When the thickness of the encapsulating film 11 is decreased by the height of the upper bump electrode 10b, a warp of the silicon substrate 1 in the form of a wafer can be made smaller than that in the semiconductor device shown in FIG. 41. For example, assume that in the semiconductor device shown in FIG. 16, the thickness of the lower protective film 5 is about 10 μm, the thickness of the upper protective film 13 is about 4 μm, the depth of the recess 7 is about 6 μm, and the height of the bump electrode 10 is about 100 μm. In this case, the thickness of the encapsulating film 11 is determined by the height of the upper bump electrode 10b.

When the silicon substrate 1 in the form of a wafer was a 200-μm type substrate and the height of the upper bump electrode 10b was 0 μm (i.e., the same as in the semiconductor device shown in FIG. 41), a warp of the wafer-like silicon substrate 1 was about 1 mm. In contrast, when the heights of the upper bump electrodes 10b were 22.5 and 45 μm, warps of the wafer-like silicon substrates 1 were about 0.7 and 0.5 mm, respectively. Since a warp of the silicon substrate 1 in the form of a wafer can be reduced as described above, transfer to the subsequent steps and the processing accuracy in these subsequent steps are not easily affected.

The first and second embodiments described above have the structure in which the recess 7 is formed in the protective film 5, and the distribution wire 8 is formed in the recess 7 (except the device shown in FIG. 40). In the present invention, however, it is also possible to form the distribution wires 8 on the upper surface of the protective film 5, and form the recesses 7 in the protective film 5 between the distribution wires 8. This embodiment will be explained below.

THIRD EMBODIMENT

Figure 42:
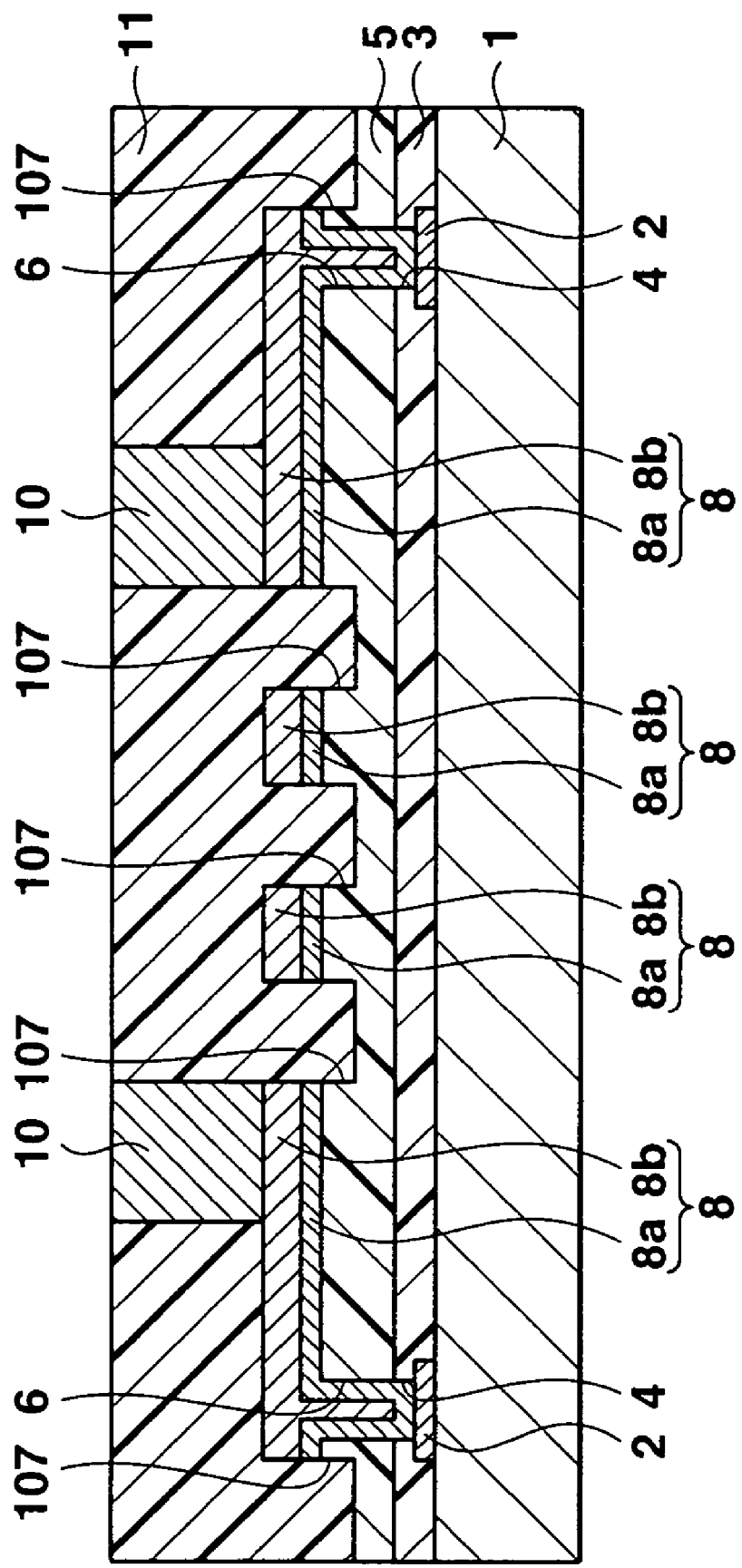
FIG. 42 is an enlarged sectional view of a semiconductor device according to the third embodiment of the present invention.

FIG. 42 is a sectional view of a semiconductor device as the third embodiment of the present invention. This semiconductor device includes a silicon substrate 1. An integrated circuit (not shown) is formed in a central portion of the upper surface of the silicon substrate 1. A plurality of connecting pads 2 made of an aluminum-based metal are formed in a peripheral portion of the upper surface of the silicon substrate 1 and electrically connected to the integrated circuit.

An insulating film 3 made of silicon oxide is formed on the upper surface of the silicon substrate 1 and the connecting pads 2 except for central portions of the connecting pads 2. These central portions of the connecting pads 2 are exposed through holes 4 formed in the insulating film 3. A protective film 5 made of polyimide is formed on the upper surface of the insulating film 3. Holes 6 are formed in those portions of the protective film 5, which correspond to the holes 4 in the insulating film 3. Recesses 107 are formed in the upper surface of the protective film 5 except for distribution wire formation regions.

A distribution wire 8 is formed to extend from the upper surface of each connecting pad 2 exposed through the holes 4 and 6 to the upper surface of the protective film 5. The distribution wire 8 has a two-layered structure made up of a lower metal layer 8a and an upper metal layer 8b formed on the lower metal layer 8a. Although details are not shown, the lower metal layer 8a has a two-layered structure in which a titanium layer and copper layer are stacked in this order from below. The upper metal layer 8b is made of a copper layer alone.

A copper bump electrode 10 is formed on the upper surface of a connecting pad portion of each distribution wire 8. On the upper surface of the protective film 5 and the distribution wires 8, an encapsulating film 11 made of an epoxy-based resin is formed such that the upper surface of the encapsulating film 11 is leveled with the upper surfaces of the bump electrodes 10.

Figure 43:
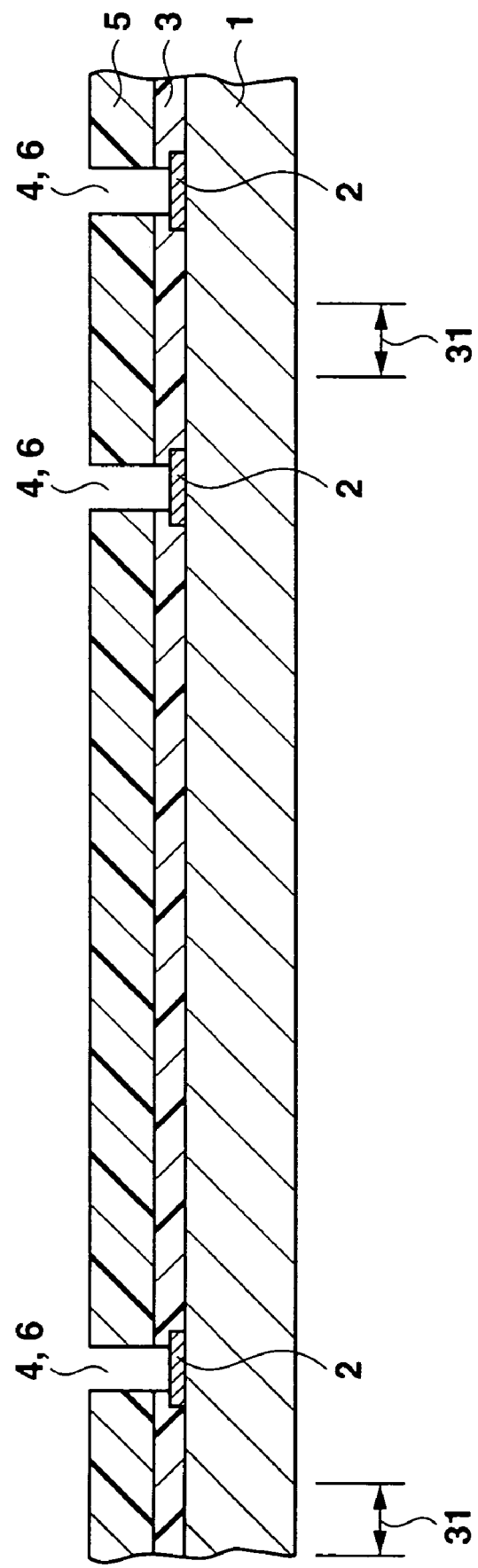
FIG. 43 is an enlarged sectional view of an initially prepared structure in the fabrication of the semiconductor device shown in FIG. 42.

An example of a method of fabricating this semiconductor device will be explained below. First, as shown in FIG. 43, a structure is prepared in which connecting pads 2 made of an aluminum-based metal, an insulating film 3, and a protective film 5 are formed on a silicon substrate 1 in the form of a wafer, and central portions of the connecting pads 2 are exposed through holes 4 and 6 respectively formed in the insulating film 3 and protective film 5, respectively. In FIG. 43, regions denoted by reference numeral 31 correspond to dicing streets.

Figure 44:
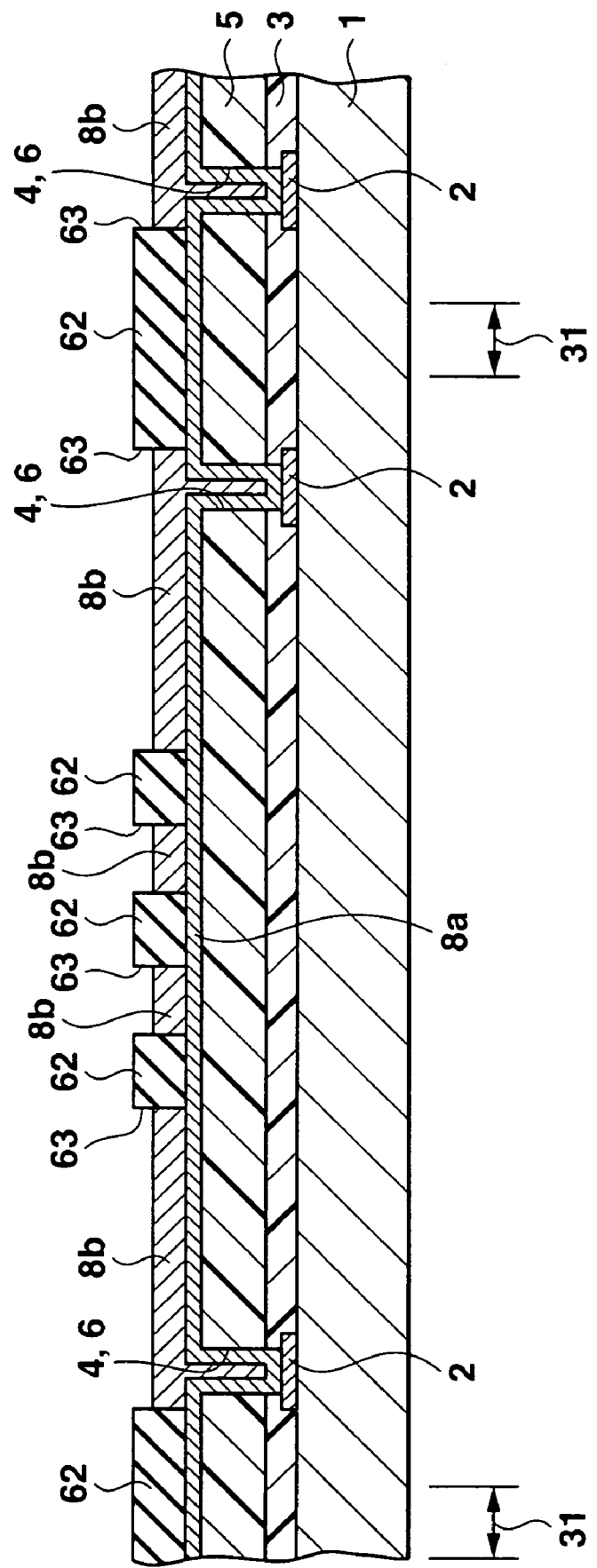
FIG. 44 is an enlarged sectional view of a fabrication step following FIG. 43.

As shown in FIG. 44, a lower metal layer 8a is formed on the entire upper surface of the protective film 5 and the upper surfaces of the connecting pads 2 exposed through the holes 4 and 6. Although details are not shown, the lower metal layer 8a is obtained by forming a copper layer by sputtering on a titanium layer which is also formed by sputtering. The lower metal layer 8a may also be a single copper layer formed by electroless plating.

Subsequently, a resist film 62 is formed by depositing and then patterning of the resist, on the upper surface of the lower metal layer 8a. In this state, holes 63 are formed in those portions of the resist film 62, which correspond to prospective formation regions of an upper metal layer 8b. The lower metal layer 8a is then used as a plating current path to perform electroplating of copper, thereby forming upper metal layers 8b on those portions of the upper surface of the lower metal layer 8a, which correspond to the holes 63 in the resist film 62. After that, the resist film 62 is peeled.

Figure 45:
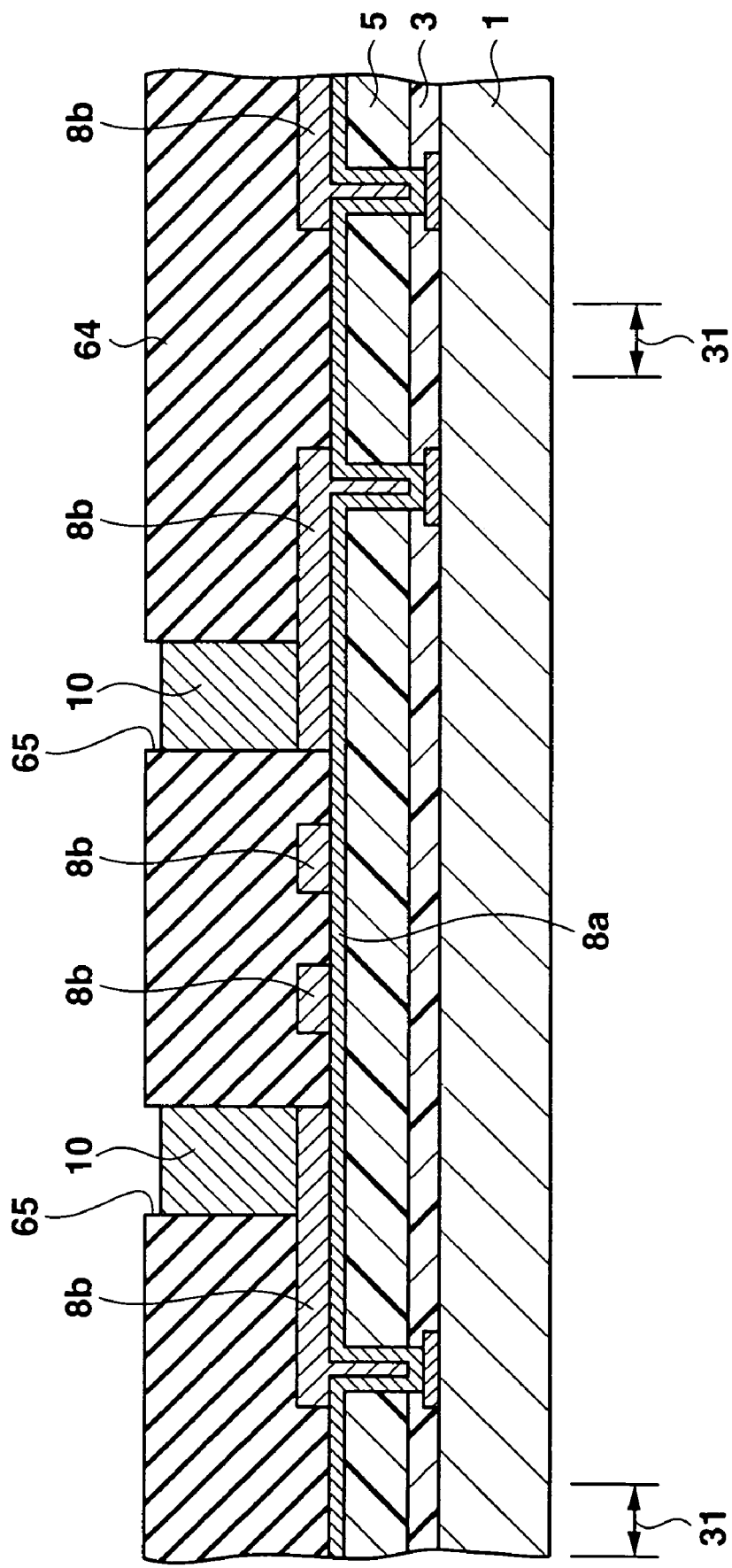
FIG. 45 is an enlarged sectional view of a fabrication step following FIG. 44.

As shown in FIG. 45, a patterned resist film 64 is formed on the upper surface of the lower metal layer 8a and the upper metal layer 8b. In this state, holes 65 are formed in those portions of the resist film 64, which correspond to prospective formation regions of bump electrodes 10. The lower metal layer 8a is then used as a plating current path to perform electroplating of copper, thereby forming the bump electrodes 10 on the upper surfaces of those connecting pad portions of the upper metal layer 8b, which correspond to the holes 65 in the resist film 64.

Figure 46:
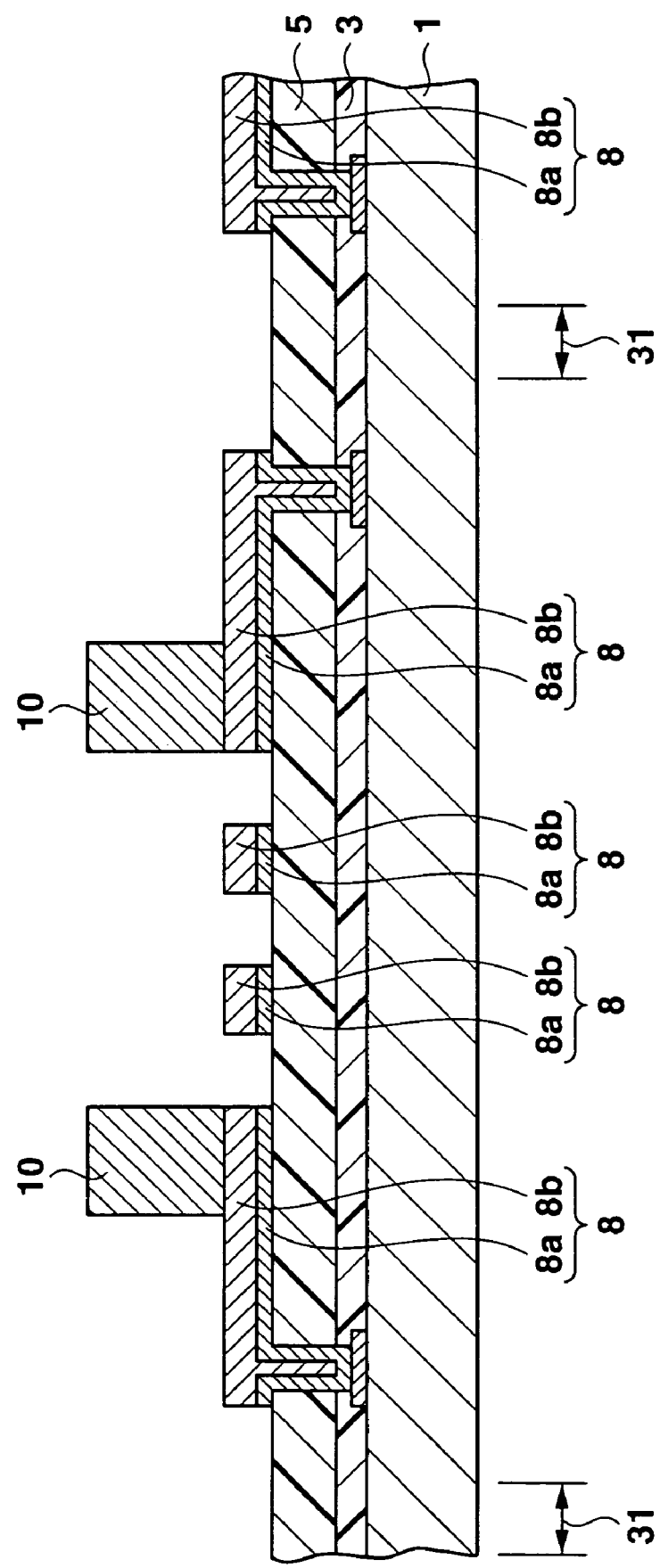
FIG. 46 is an enlarged sectional view of a fabrication step following FIG. 45.

The resist film 64 is peeled, and the bump electrodes 10 and upper metal layer 8b are used as masks to etch away unnecessary portions of the lower metal layer 8a. Consequently, as shown in FIG. 46, the lower metal layer 8a remains only below the upper metal layer 8b to form a distribution wire 8.

Figure 47:
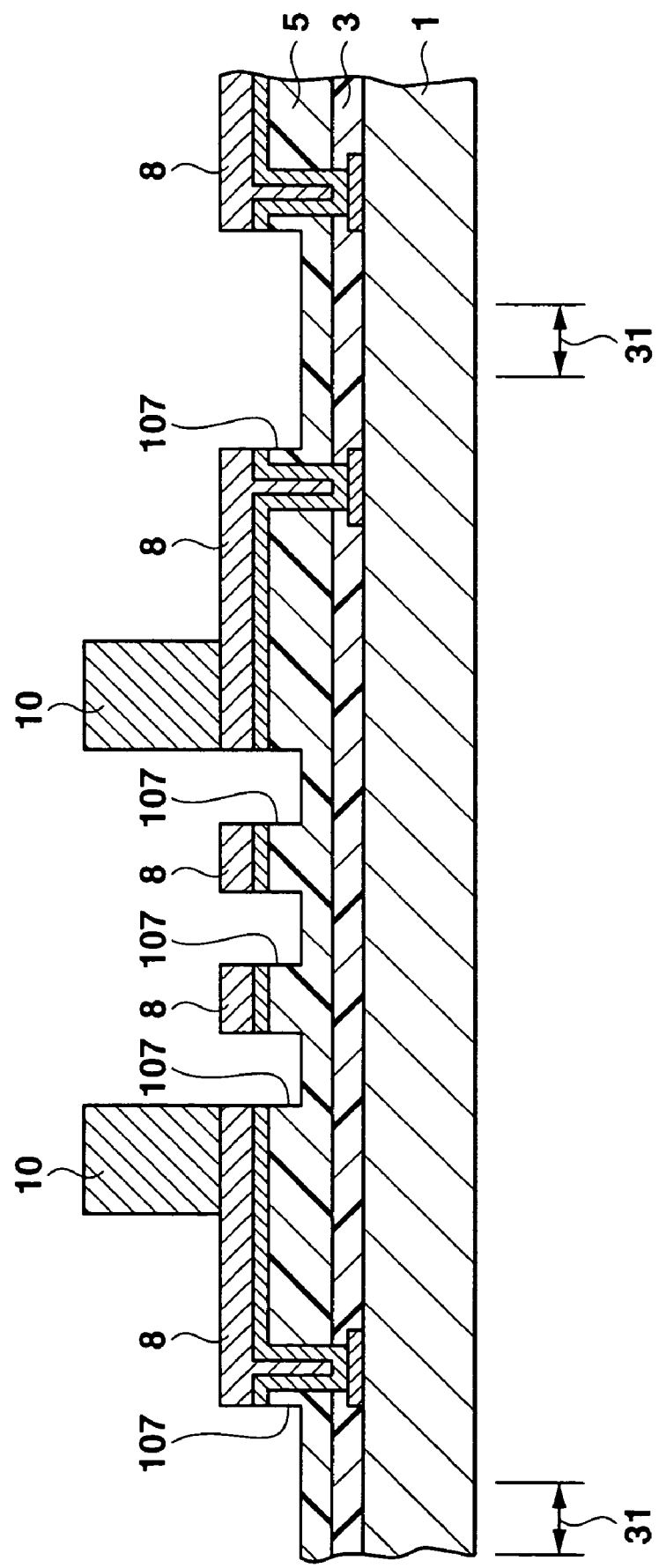
FIG. 47 is an enlarged sectional view of a fabrication step following FIG. 46.

As shown in FIG. 47, the bump electrodes 10 and distribution wires 8 are used as masks to half-etch the protective film 5, thereby forming recesses 107 in the upper surface of the protective film 5 except for regions below the distribution wires 8. Although the depth of each recess 107 depends upon the thickness of the protective film 5, this depth is, e.g., 1 to 5 μm. The width of the distribution wire 8 and the minimum spacing between the distribution wires 8 are, e.g., 10 to 20 μm. Note that when etched by an etching solution, each recess 107 is inclined in the direction of thickness such that the width of the bottom surface of the recess 107 is smaller than that of the upper surface. However, each recess 7 is shown as a vertical recess in the figure for the sake of simplicity. In this case, dry etching such as plasma etching is applicable as the half-etching of the protective film 5. Anisotropic etching is particularly preferable because the inclined surface is made as vertical as possible.

Figure 48:
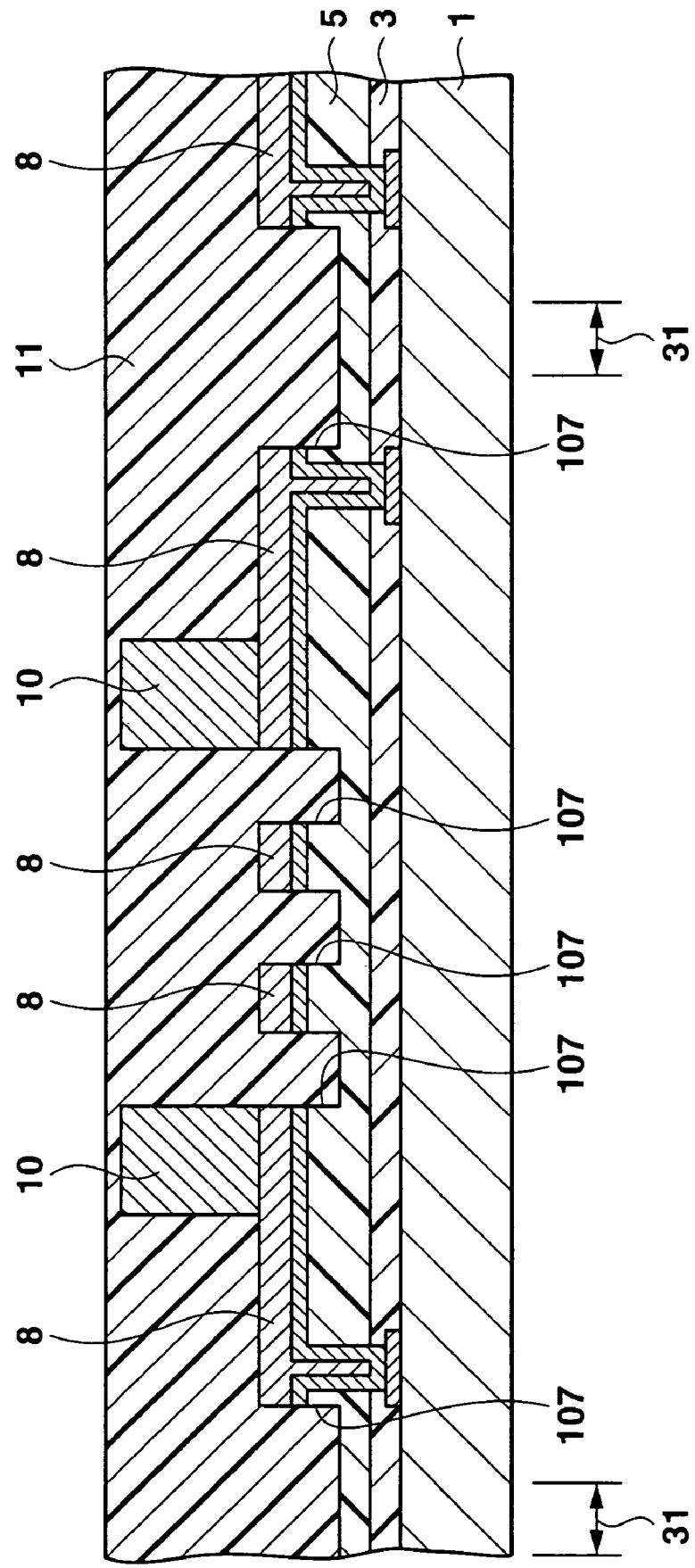
FIG. 48 is an enlarged sectional view of a fabrication step following FIG. 47.

As shown in FIG. 48, an encapsulating film 11 made of an organic resin such as an epoxy resin is formed on the entire upper surface of the protective film 5 the bump electrodes 10, the distribution wires 8, and the recesses 107, such that the thickness of the encapsulating film 11 is slightly larger than the height of the bump electrodes 10. In this state, therefore, the upper surfaces of the bump electrodes 10 are covered with the encapsulating film 11.

Figure 49:
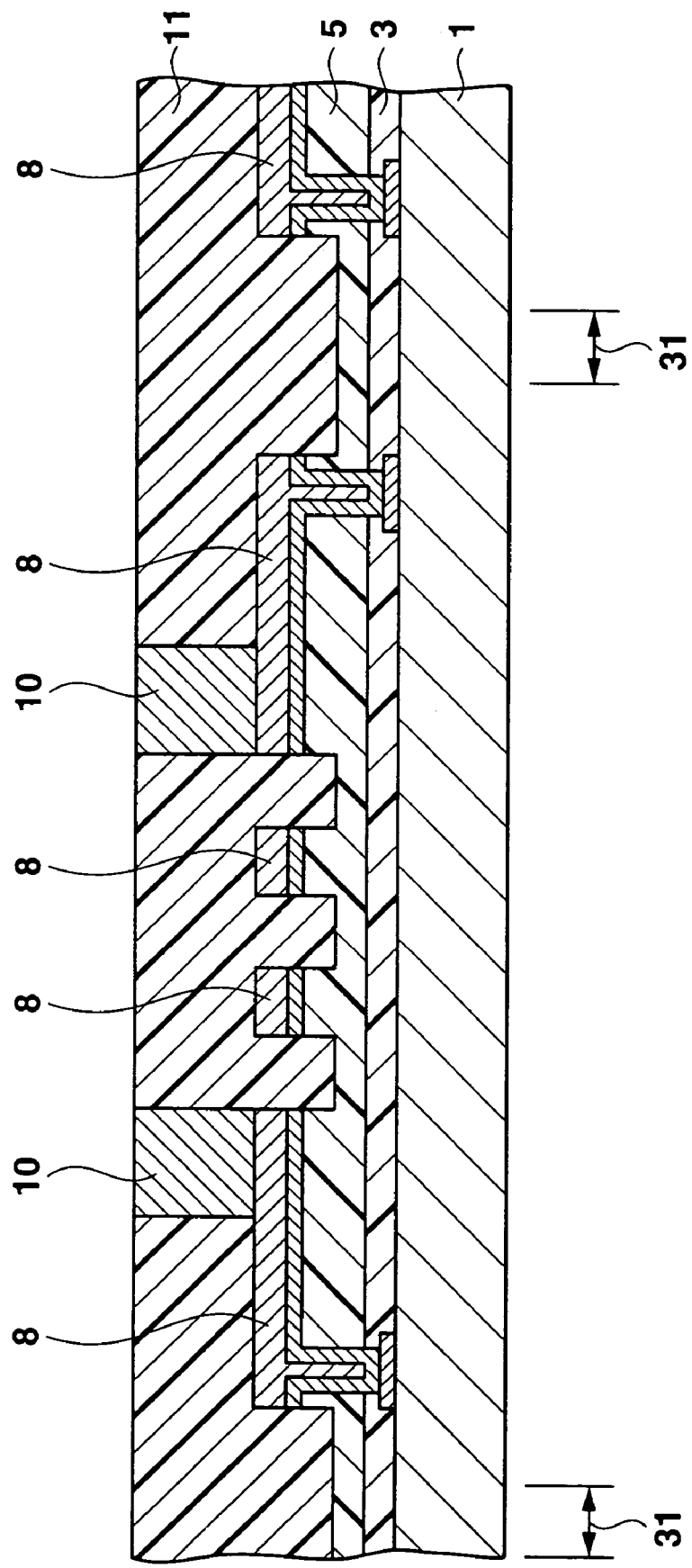
FIG. 49 is an enlarged sectional view of a fabrication step following FIG. 48.

As shown in FIG. 49, the encapsulating film 11 and the upper surfaces of the bump electrodes 10 are appropriately polished to expose these upper surfaces of the bump electrodes 10, and planarize the upper surface of the encapsulating film 11 including the upper surfaces of the bump electrodes 10. A plurality of semiconductor devices shown in FIG. 42 are obtained by dicing the wafer-like silicon substrate 1 in regions 31 corresponding to dicing streets.

In the semiconductor device thus obtained, the recesses 107 formed in the upper surface of the protective film 5 are present between the distribution wires 8 formed on the upper surface of the protective film 5. Therefore, the length of the interface of the protective film 5 and encapsulating film 11 between the distribution wires 8, i.e., the length of the copper ion precipitation path is twice as large as the depth of the recesses 7. This prevents easy occurrence of a short circuit caused by so-called ion migration between the distribution wires 8 and between the distribution wires 8 and bump electrodes 10 accordingly.

Figure 50:
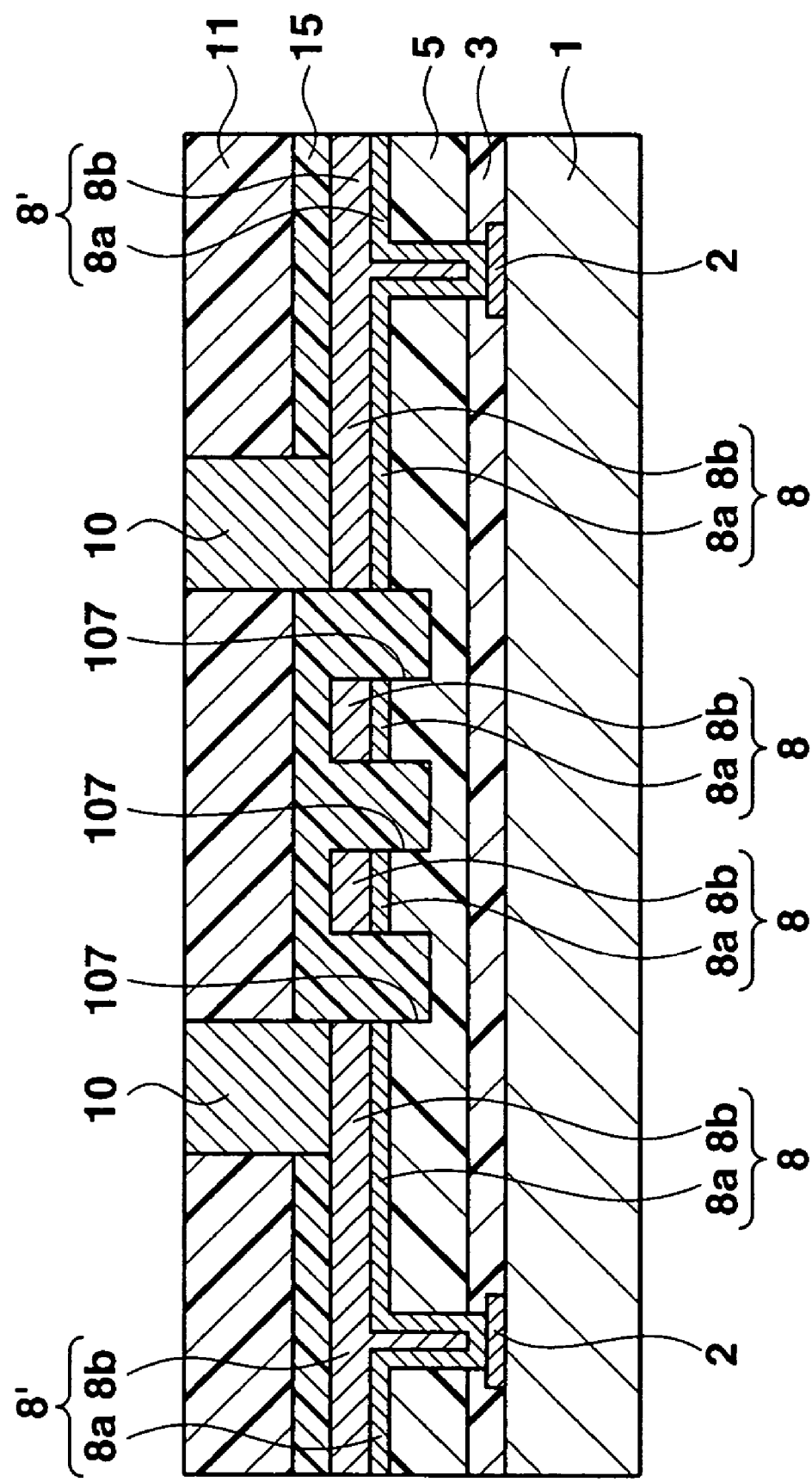
FIG. 50 is an enlarged sectional view of a semiconductor device as a modification of the third embodiment of the present invention shown in FIG. 42.

FIG. 50 is a sectional view of a semiconductor device as a modification of the third embodiment of the present invention. This semiconductor device largely differs from that shown in FIG. 42 in that an upper protective layer 15 made of an organic resin such as polyimide is formed between a protective film 5 including distribution wires 8 and an encapsulating film 11. In this semiconductor device, no recess is formed in the upper surface of the protective film 5 near the end faces of a silicon substrate 1.

On the upper surface of the protective film 5 near connecting pads 2, connecting lines 8' formed by extending the distribution wires 8 run to the end faces of the silicon substrate 1. Each connecting line 8' has a two-layered structure including a lower metal layer 8a and upper metal layer 8b, similar to that of the distribution wire 8.

Figure 51:
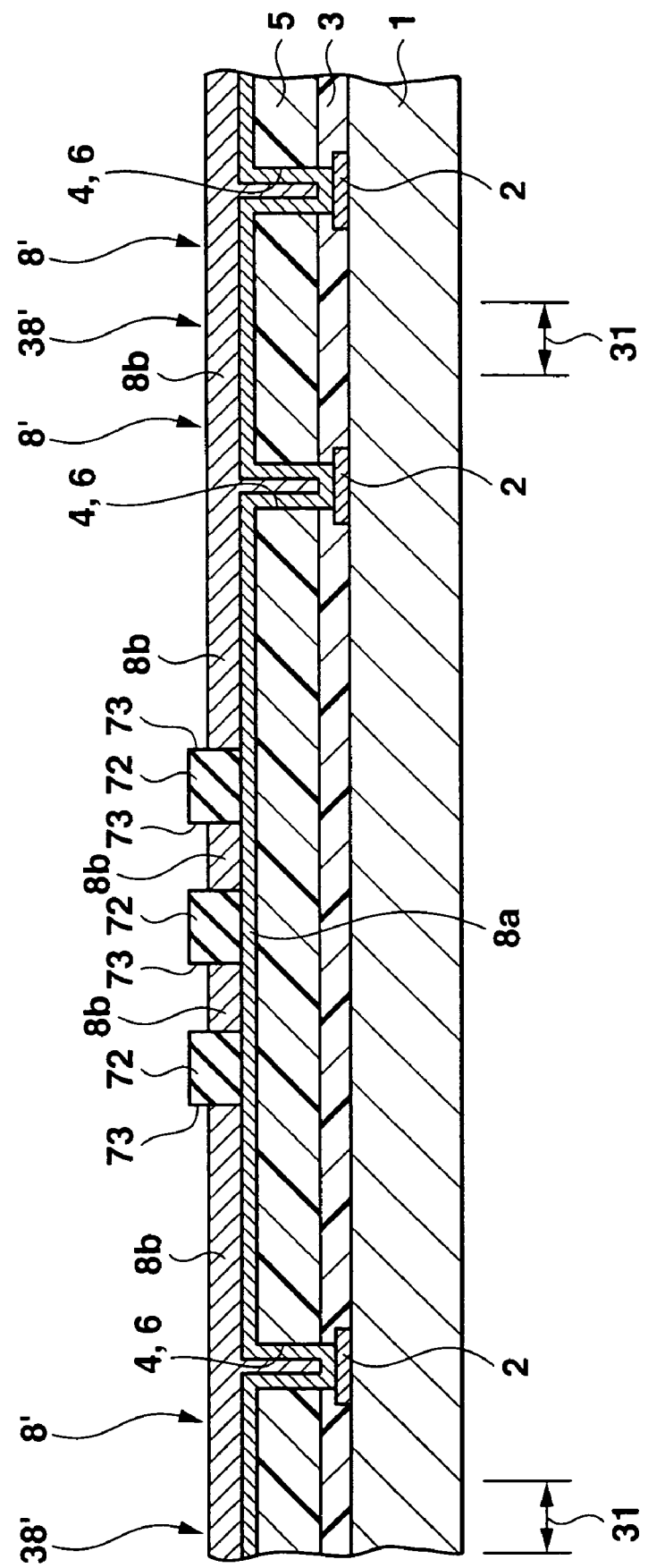
FIG. 51 is an enlarged sectional view of a step corresponding to FIG. 44, in the fabrication of the semiconductor device shown in FIG. 50.

An example of a method of fabricating this semiconductor device will be explained below. First, as shown in FIG. 51, holes 73 are formed in those portions of a resist film 72, which correspond to prospective formation regions of distribution wires 8, prospective formation regions of connecting lines 8' and prospective formation regions of auxiliary wires 38' in regions 31 corresponding to dicing streets. A lower metal layer 8a is then used as a plating current path to perform electroplating of copper, thereby forming an upper metal layer 8b on the upper surface of the lower metal layer 8a in the holes 73 of the resist film 72. In this state, the upper metal layer 8b is formed in a lattice manner in the regions corresponding to dicing streets.

Figure 52:
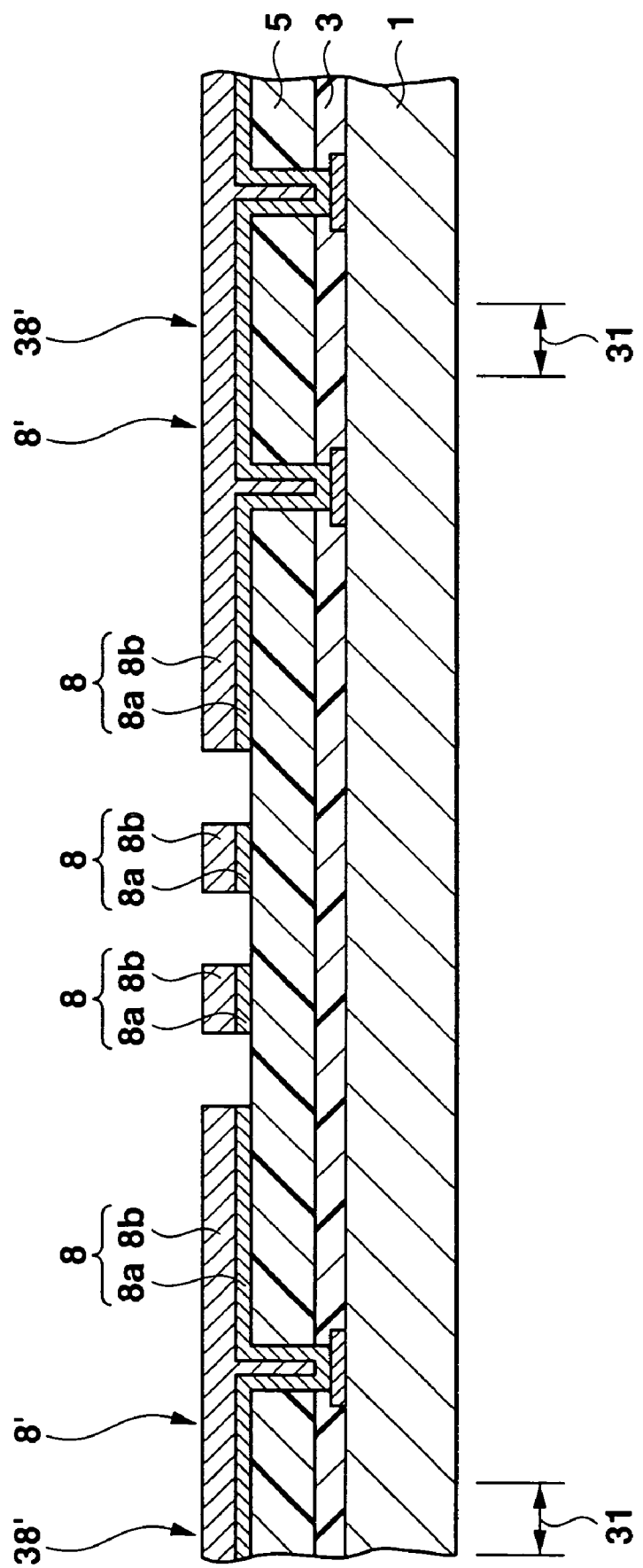
FIG. 52 is an enlarged sectional view of a fabrication step following FIG. 51.
Figure 53:
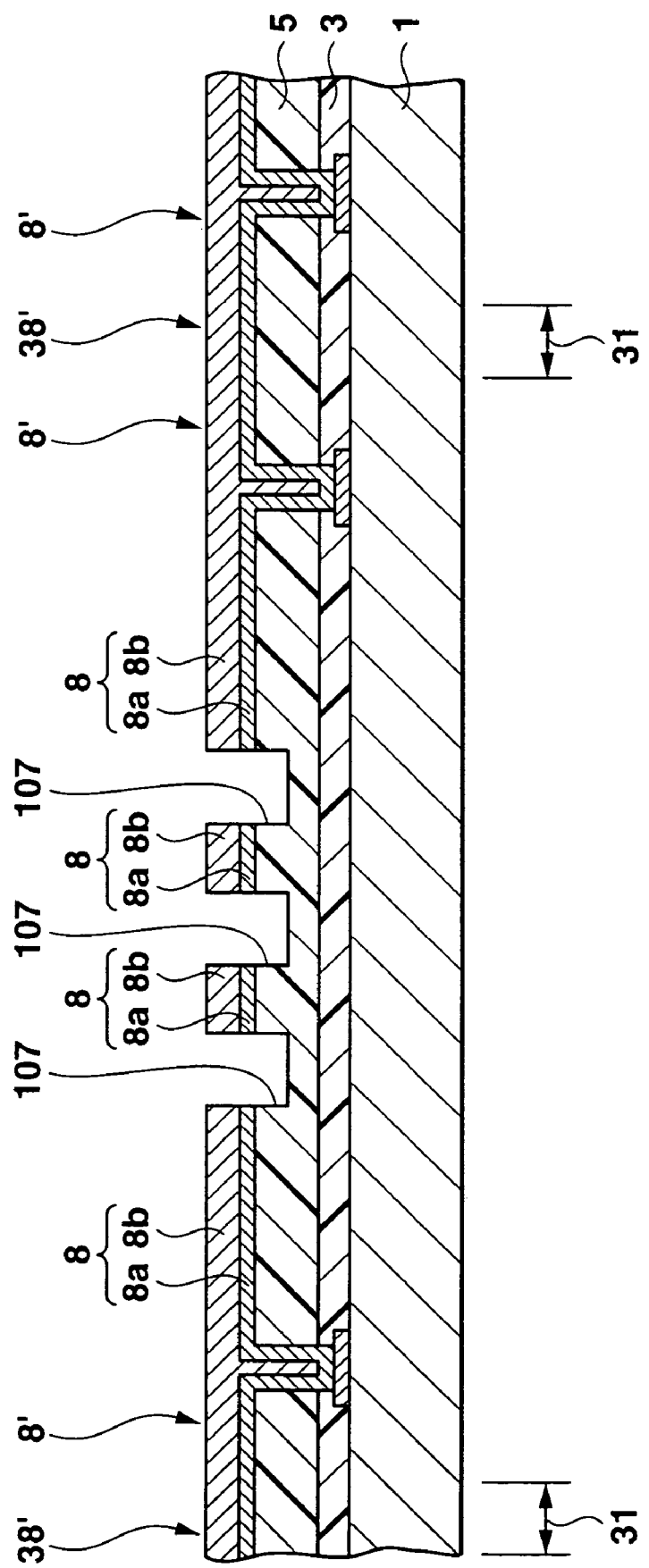
FIG. 53 is an enlarged sectional view of a fabrication step following FIG. 52.

The resist film 72 is peeled, and the upper metal layer 8b is used as a mask to etch away unnecessary portions of the lower metal layer 8a. Consequently, as shown in FIG. 52, the lower metal layer 8a remains only below the upper metal layer 8b, thereby forming distribution wires 8 having a two-layered structure in which the upper metal layer 8b is formed on the lower metal layer 8a, forming auxiliary wires 38' in a lattice manner in the regions 31 corresponding to dicing streets, and forming connecting lines 8' for connecting the distribution wires 8 and auxiliary wires 38'. Subsequently, as shown in FIG. 53, the distribution wires 8, connecting lines 8', and auxiliary wires 38' are used as masks to half-etch the protective film 5, thereby forming recesses 107 in the upper surface of the protective film 5 except for regions below the distribution wires 8, connecting lines 8', and auxiliary wires 38'.

Figure 54:
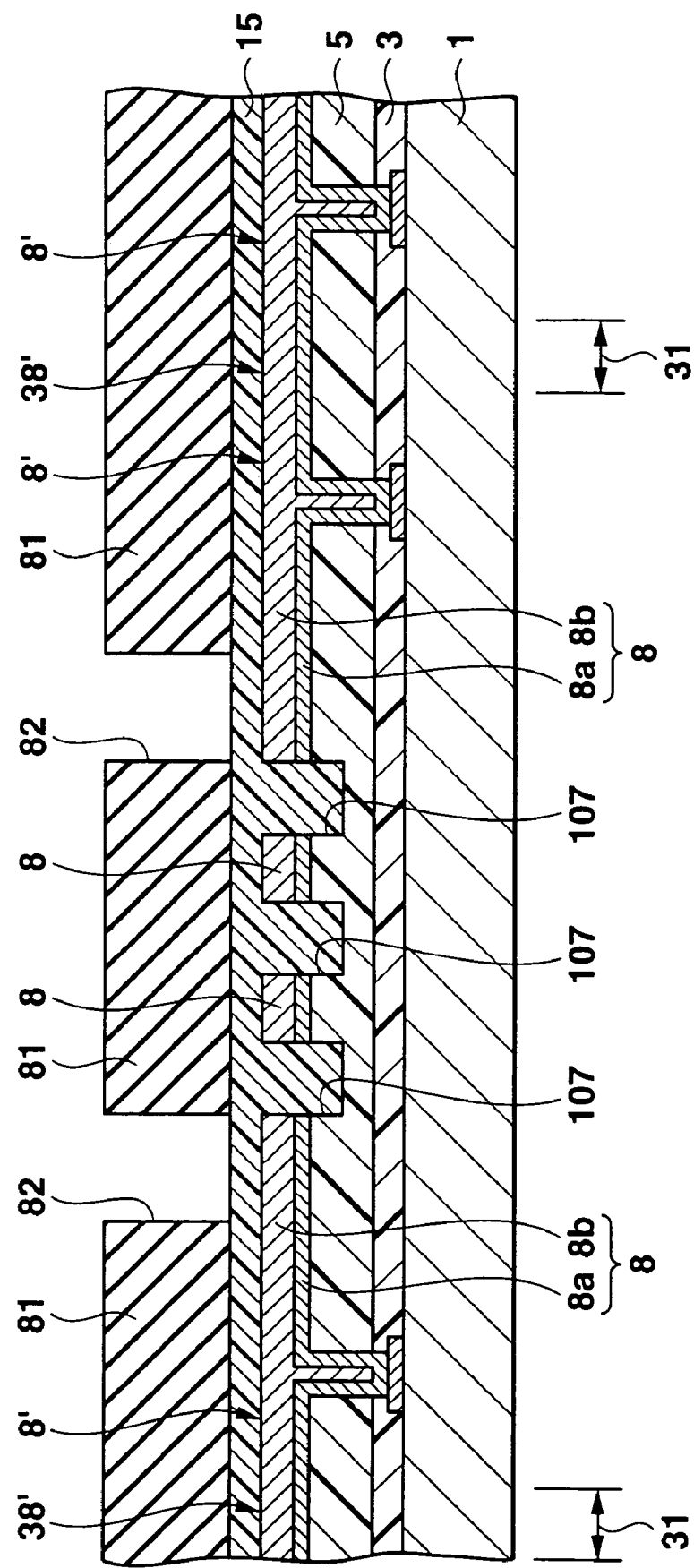
FIG. 54 is an enlarged sectional view of a fabrication step following FIG. 53.

As shown in FIG. 54, on the entire upper surface of the protective film 5 including the distribution wires 8, connecting lines 8', auxiliary wires 38', and recesses 7, an upper protective film 15 made of an organic resin such as polyimide is formed by spin coating or the like such that the upper surface of the upper protective film 15 is substantially flat. A resist pattern 81 is then formed by depositing and then patterning of the resist, on the upper surface of the upper protective film 15. In this state, holes 82 are formed in those portions of the resist film 81, which correspond to connecting pad portions of the distribution wires 8.

Figure 55:
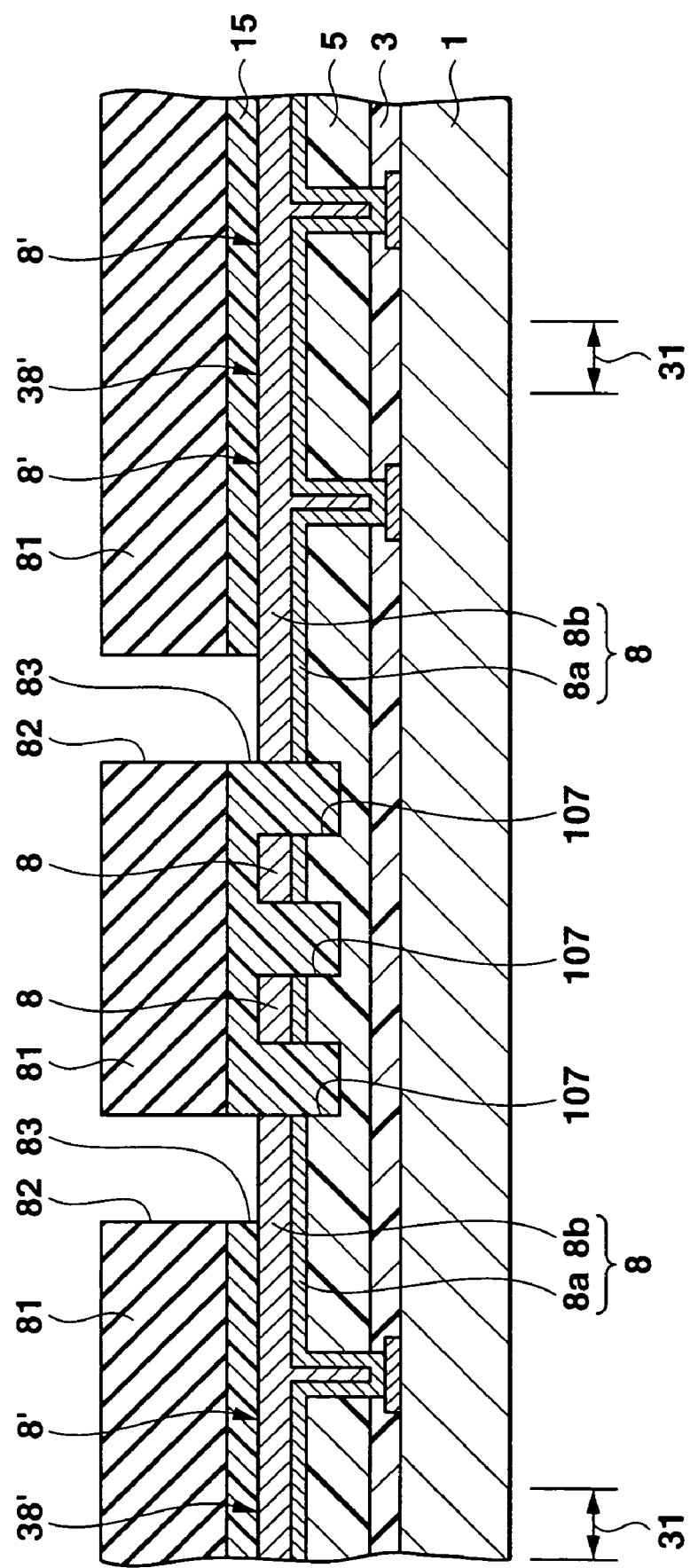
FIG. 55 is an enlarged sectional view of a fabrication step following FIG. 54.
Figure 56:
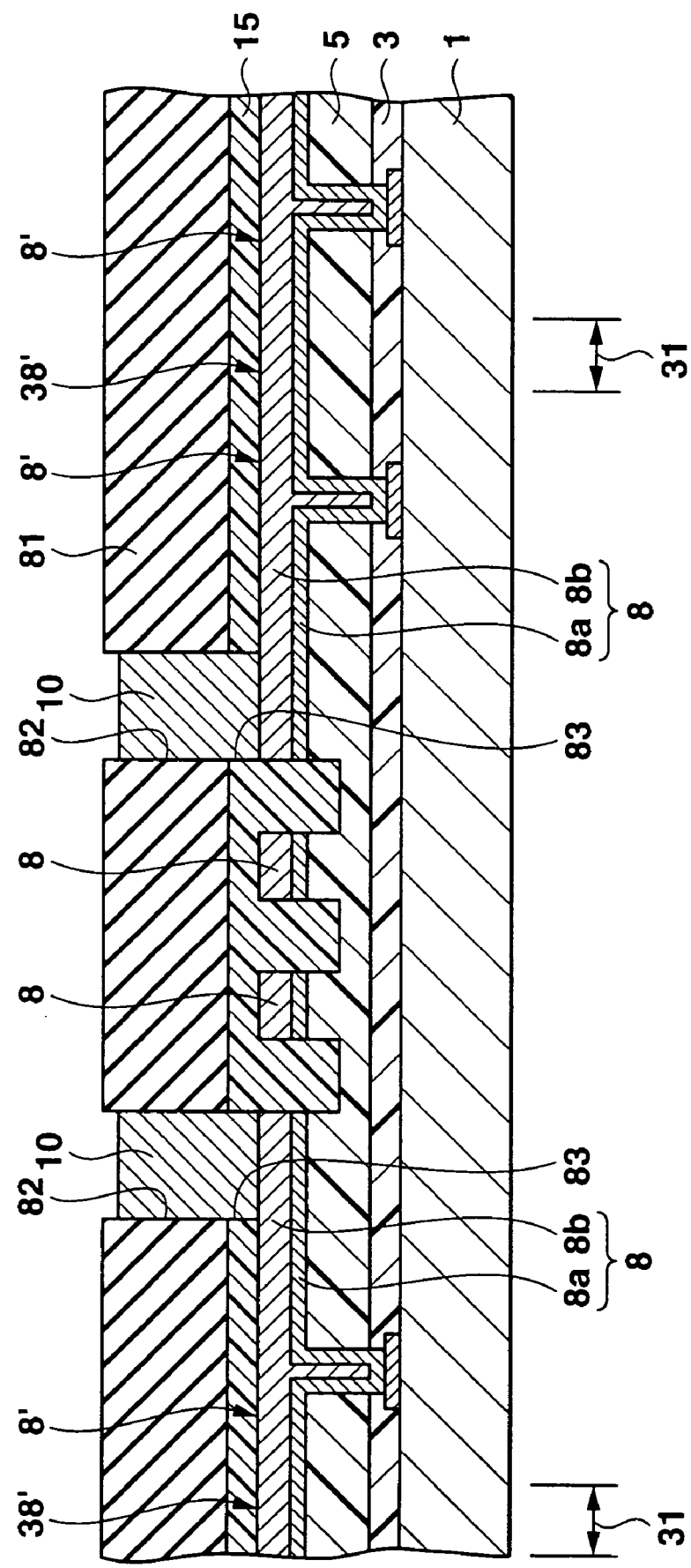
FIG. 56 is an enlarged sectional view of a fabrication step following FIG. 55.

As shown in FIG. 55, the resist film 81 is used as a mask to etch the upper protective film 15, thereby forming holes 83 in those portions of the upper protective film 15, which correspond to the holes 82 in the resist film 81, i.e., the connecting pad portions of the distribution wires 8. Subsequently, as shown in FIG. 56, the distribution wires 8, connecting lines 8', and auxiliary wires 38' are used as masks to perform electroplating of copper, thereby forming bump electrodes 10 on the upper surfaces of the connecting pad portions of the distribution wires 8 in the holes 82 and 83 of the resist film 81 and upper protective film 15, respectively. After that, the resist film 81 is peeled.

Following the same procedures as in the third embodiment described above, an encapsulating film 11 is formed, the encapsulating film 11 and the upper surfaces of the bump electrodes 10 are appropriately polished, and a silicon substrate 1 in the form of a wafer is diced in the regions 31 corresponding to dicing streets, thereby obtaining a plurality of semiconductor devices shown in FIG. 50. Since the silicon substrate 1 in the form of a wafer is diced in the regions 31 corresponding to dicing streets, the auxiliary wires 38 formed in the regions 31 corresponding to dicing streets are removed. Accordingly, the distribution wires 8 are not short-circuited.

In the semiconductor device thus obtained, the distribution wires 8 except for their connecting pad portions are covered with the upper protective film 15 made of the same material as the lower protective film 5. Therefore, even if water in the use environment penetrates into the encapsulating film 11, further penetration of the water is inhibited by the upper surface of the upper protective film 15. This prevents easy occurrence of a short circuit caused by so-called ion migration between the distribution wires 8 and between the distribution wires 8 and bump electrodes 10. It is of course possible, by the recesses 107, to prevent easy occurrence of a short circuit by so-called ion migration between the distribution wires 8 and between the distribution wires 8 and bump electrodes 10. In this case, the width of the recess 107 can also be made smaller than the spacing between the distribution wires 8.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate having a plurality of connecting pads on one surface;
   an insulating film which is formed of a single layer and covers said one surface of the semiconductor substrate, and which includes: (i) a plurality of holes extending through the insulating film, each of the holes corresponding to one of the connecting pads, and (ii) at least one recess extending partially through the insulating film such that a bottom surface of the recess is depressed with respect to an upper surface of the insulating film in a direction of thickness of the insulating film, each said recess including a first portion through which one of the holes extends and which surrounds a periphery of the one of the holes and a second portion which extends outwardly from the first portion; and
   at least one interconnection including at least one conductive layer having: (i) a first section formed on the bottom surface of a corresponding said at least one recess to extend along the bottom surface, over the first portion and the second portion of the recess, and (ii) a second section that is directly contacted to a corresponding one of the connecting pads through a corresponding one of the holes in the insulating film, said at least one conductive layer being formed of a same material along an entire length thereof, including the first section and the second section.

2. A device according to claim 1, wherein each said recess in the insulating film has a pair of side surfaces, and a space is provided between each said at least one interconnection and a corresponding side surface of the recess in which the interconnection is provided.

3. A device according to claim 1, wherein the at least one interconnection comprises a connecting pad portion, and
   wherein the semiconductor device further comprises:
      a bump electrode formed on the connecting pad portion, and
      an encapsulating film formed around the bump electrode and on the insulating film and the at least one interconnection.

4. A device according to claim 3, further comprising an upper insulating film formed between the insulating film and the encapsulating film, said upper insulating film having a hole formed in a portion corresponding to each said bump electrode.

5. A device according to claim 4, wherein the insulating film and upper insulating film are made of materials containing a same main component.

6. A device according to claim 4, wherein the upper insulating film and the encapsulating film are made of different materials.

7. A device according to claim 3, wherein each said bump electrode protrudes from an upper surface of the encapsulating film.

8. A device according to claim 3, wherein each said bump electrode comprises a lower bump electrode and an upper bump electrode formed on the lower bump electrode.

9. A device according to claim 8, wherein the lower bump electrode protrudes from an upper surface of the encapsulating film.

10. A device according to claim 1, wherein the at least one interconnection comprises a connecting pad portion formed on the corresponding one of the connecting pads to which the interconnection is connected, and
    wherein the semiconductor device further comprises:
       at least one bump electrode formed on the connecting pad portion of the at least one interconnection, and
       an encapsulating film formed around the bump electrode and on the insulating film.

11. A device according to claim 1, wherein the insulating film is made of an organic resin.

12. A device according to claim 1, wherein the recess in the insulating film has a depth which is not less than a thickness of the interconnection.

13. A device according to claim 1, wherein the insulating film has a thickness of 10 to 30 μm.

14. A device according to claim 1, wherein the recess has a depth of 5 to 15 μm.

15. A device according to claim 14, wherein a distance between a bottom surface of the insulating film and the bottom surface of the recess is not less than 1 μm.

16. A device according to claim 1, wherein the at least one interconnection comprises a lower conductive layer and an upper conductive layer formed on an entire upper surface of the lower conductive layer so as not to laterally project past the upper surface of the lower conductive layer.

17. A semiconductor device comprising:
    a semiconductor substrate having a plurality of connecting pads on one surface;
    an insulating film which covers said one surface of the semiconductor substrate, and which includes: (i) a plurality of holes extending through the insulating film, each of the holes corresponding to one of the connecting pads, and (ii) at least one recess extending partially through the insulating film such that a bottom surface of the recess is depressed with respect to an upper surface of the insulating film in a direction of thickness of the insulating film, each said recess extending from a first position at an edge of one of said holes to a second position outside an area above the connecting pad to which said one of the holes corresponds; and
    at least one interconnection formed on the bottom surface of a corresponding said at least one recess to extend along the bottom surface, each said at least one interconnection being connected to a corresponding one of the connecting pads through a corresponding one of the holes in the insulating film;
    wherein each said at least one recess in the insulating film has a pair of side surfaces, and a space is provided between each said at least one interconnection and the side surfaces of the recess in which the interconnection is provided.

18. A device according to claim 17, wherein the insulating film is formed of a single layer.

19. A device according to claim 17, wherein the at least one interconnection comprises a connecting pad portion, and
    wherein the semiconductor device further comprises:
       a bump electrode formed on the connecting pad portion, and
       an encapsulating film formed around the bump electrode and on the insulating film and the at least one interconnection.

20. A device according to claim 17, wherein the at least one interconnection comprises a connecting pad portion formed on the corresponding one of the connecting pads to which the interconnection is connected, and
    wherein the semiconductor device further comprises:

at least one bump electrode formed on the connecting pad portion of the at least one interconnection, and an encapsulating film formed around the bump electrode and on the insulating film.

21. A device according to claim 17, wherein the insulating film is made of an organic resin.

22. A device according to claim 17, wherein the recess in the insulating film has a depth which is not less than a thickness of the interconnection.

23. A device according to claim 17, wherein the insulating film has a thickness of 10 to 30 µm.

24. A device according to claim 17, wherein the recess has a depth of 5 to 15 µm.

25. A device according to claim 24, wherein a distance between a bottom surface of the insulating film and the bottom surface of the recess is not less than 1 µm.

26. A semiconductor device comprising:

a semiconductor substrate having a plurality of connecting pads on one surface;

a protective film formed of a single layer, said protective film including: (i) a plurality of holes extending completely through the protective film, each of the holes corresponding to one of the connecting pads, and (ii) a plurality of recesses extending partially through the protective film, each of said recesses having a recessed surface that is lower than an upper surface of the protective film in a thickness direction of the protective film, and each of said recesses extending from a first position at an edge of one of said holes to a second position outside an area above the connecting pad to which said one of the holes corresponds; and interconnections which are respectively connected to the connecting pads through the holes in the protective film, and which are provided on the recessed surfaces of the protective film to extend along the recessed surfaces;

wherein each of the recesses in the protective film has a pair of side surfaces, and a space is provided between each of the interconnections and a corresponding side surface of the recess in which the interconnection is provided.

27. A semiconductor device comprising:

a semiconductor substrate having a plurality of connecting pads on one surface;

a protective film formed of a single layer, said protective film including: (i) a plurality of holes extending completely through the protective film, each of the holes corresponding to one of the connecting pads, and (ii) a plurality of recesses extending partially through the protective film, each of said recesses having a recessed surface that is lower than an upper surface of the protective film in a thickness direction of the protective film, and each of said recesses including a first portion through which one of the holes extends and which surrounds a periphery of the one of the holes and a second portion which extends outwardly from the first portion; and a plurality of interconnections, each of which includes at least one conductive layer having: (i) a second section directly connected to a corresponding one of the connecting pads through a corresponding one of the holes in the protective film, and (ii) a first section provided on a corresponding one of the recessed surfaces of the protective film to extend along the corresponding one of the recessed surfaces over the first and second portions thereof, said at least one conductive layer being formed of a same material along an entire length thereof, including the first section and the second section.

\* \* \* \* \*